US008426981B2

(12) United States Patent
Sasaki et al.

(10) Patent No.: US 8,426,981 B2
(45) Date of Patent: Apr. 23, 2013

(54) COMPOSITE LAYERED CHIP PACKAGE

(75) Inventors: Yoshitaka Sasaki, Santa Clara, CA (US); Hiroyuki Ito, Milpitas, CA (US); Atsushi Iijima, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 0 days.

(21) Appl. No.: 13/240,048

(22) Filed: Sep. 22, 2011

(65) Prior Publication Data

US 2013/0075935 A1    Mar. 28, 2013

(51) Int. Cl.
*H01L 23/48* (2006.01)
*H01L 23/02* (2006.01)
*H01L 23/52* (2006.01)
*H01L 29/40* (2006.01)

(52) U.S. Cl.
USPC .............. 257/777; 257/E23.01; 257/E23.141; 257/E23.011; 257/E25.027; 257/E25.001; 257/E25.018; 257/E25.013; 257/686; 257/723; 257/691

(58) Field of Classification Search .................. 257/777, 257/723, 686, 685, 774, 728, 773, 691, E23.01, 257/E23.141, E23.011, E25.001, E25.018, 257/E25.013
See application file for complete search history.

(56) References Cited

U.S. PATENT DOCUMENTS

| 5,953,588 | A | 9/1999 | Camien et al. |
| 7,127,807 | B2 | 10/2006 | Yamaguchi et al. |
| 7,663,095 | B2 * | 2/2010 | Wong et al. ................... 250/239 |
| 7,745,259 | B2 * | 6/2010 | Sasaki et al. .................. 438/109 |
| 7,863,095 | B2 * | 1/2011 | Sasaki et al. .................. 438/107 |
| 7,868,442 | B2 * | 1/2011 | Sasaki et al. .................. 257/686 |
| 7,964,976 | B2 * | 6/2011 | Sasaki et al. .................. 257/786 |
| 7,968,374 | B2 * | 6/2011 | Sasaki et al. .................. 438/109 |
| 8,203,215 | B2 * | 6/2012 | Sasaki et al. .................. 257/777 |
| 8,203,216 | B2 * | 6/2012 | Sasaki et al. .................. 257/777 |
| 2002/0096760 | A1 * | 7/2002 | Simelgor et al. .............. 257/723 |
| 2006/0001142 | A1 * | 1/2006 | Jeung et al. ................... 257/686 |
| 2007/0165461 | A1 * | 7/2007 | Cornwell et al. ........ 365/185.33 |
| 2008/0179728 | A1 * | 7/2008 | Ikeda ............................ 257/686 |
| 2008/0279728 | A1 * | 11/2008 | Turc et al. ..................... 422/119 |
| 2009/0020889 | A1 * | 1/2009 | Murayama et al. ........... 257/777 |
| 2009/0045525 | A1 * | 2/2009 | Matsushima et al. ......... 257/777 |
| 2009/0085224 | A1 * | 4/2009 | Choi et al. .................... 257/777 |
| 2009/0321957 | A1 * | 12/2009 | Sasaki et al. .................. 257/777 |
| 2010/0140801 | A1 * | 6/2010 | Anbai et al. .................. 257/738 |
| 2010/0200959 | A1 * | 8/2010 | Sasaki et al. .................. 257/620 |
| 2010/0207278 | A1 * | 8/2010 | Kwon et al. .................. 257/777 |
| 2011/0189822 | A1 * | 8/2011 | Sasaki et al. .................. 438/113 |
| 2011/0266692 | A1 * | 11/2011 | Sasaki et al. .................. 257/774 |

(Continued)

OTHER PUBLICATIONS

Gann, K., "Neo-Stacking Technology," *HDI Magazine*, Dec. 1999, pp. 1-4.

*Primary Examiner* — A O Williams
(74) *Attorney, Agent, or Firm* — Oliff & Berridge, PLC

(57) ABSTRACT

A composite layered chip package includes first and second subpackages that are stacked. Each subpackage includes a main body and wiring. The main body includes: a main part having a top surface and a bottom surface; first terminals disposed on the top surface of the main part; and second terminals disposed on the bottom surface of the main part. The first and second terminals are electrically connected to the wiring. The first and second subpackages are arranged in a specific relative positional relationship, different from a reference relative positional relationship, with each other.

26 Claims, 52 Drawing Sheets

U.S. PATENT DOCUMENTS

| | | | |
|---|---|---|---|
| 2011/0316141 A1* | 12/2011 | Sasaki et al. | 257/700 |
| 2012/0013024 A1* | 1/2012 | Sasaki et al. | 257/777 |
| 2012/0013025 A1* | 1/2012 | Sasaki et al. | 257/777 |
| 2012/0032318 A1* | 2/2012 | Sasaki et al. | 257/686 |
| 2012/0056333 A1* | 3/2012 | Sasaki et al. | 257/777 |
| 2012/0080782 A1* | 4/2012 | Sasaki et al. | 257/686 |
| 2012/0086130 A1* | 4/2012 | Sasaki et al. | 257/774 |
| 2012/0126427 A1* | 5/2012 | Sasaki et al. | 257/777 |
| 2012/0187574 A1* | 7/2012 | Sasaki et al. | 257/777 |
| 2012/0256321 A1* | 10/2012 | Sasaki et al. | 257/777 |
| 2012/0313259 A1* | 12/2012 | Sasaki et al. | 257/777 |

* cited by examiner

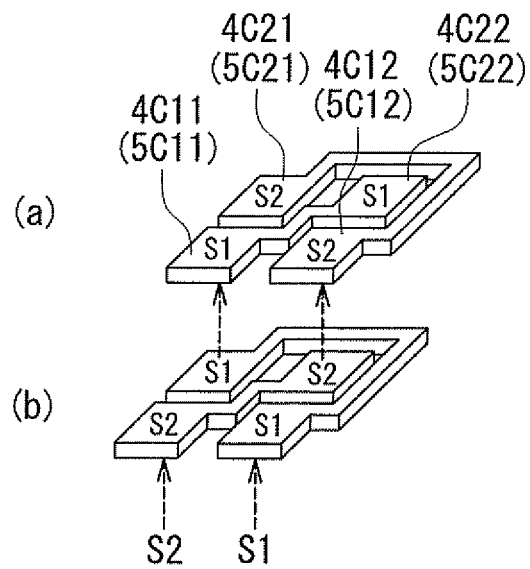
F I G. 45
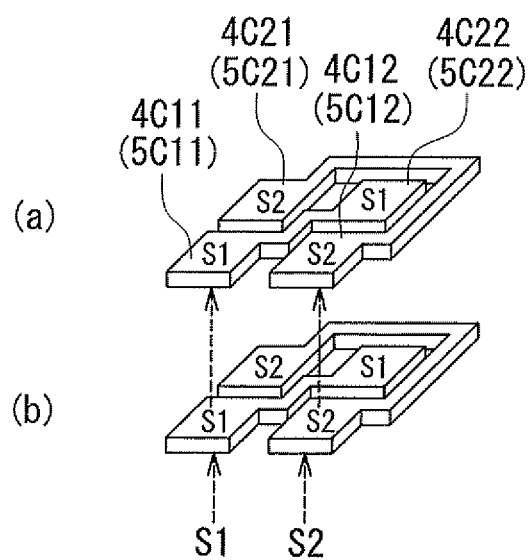
F I G. 46

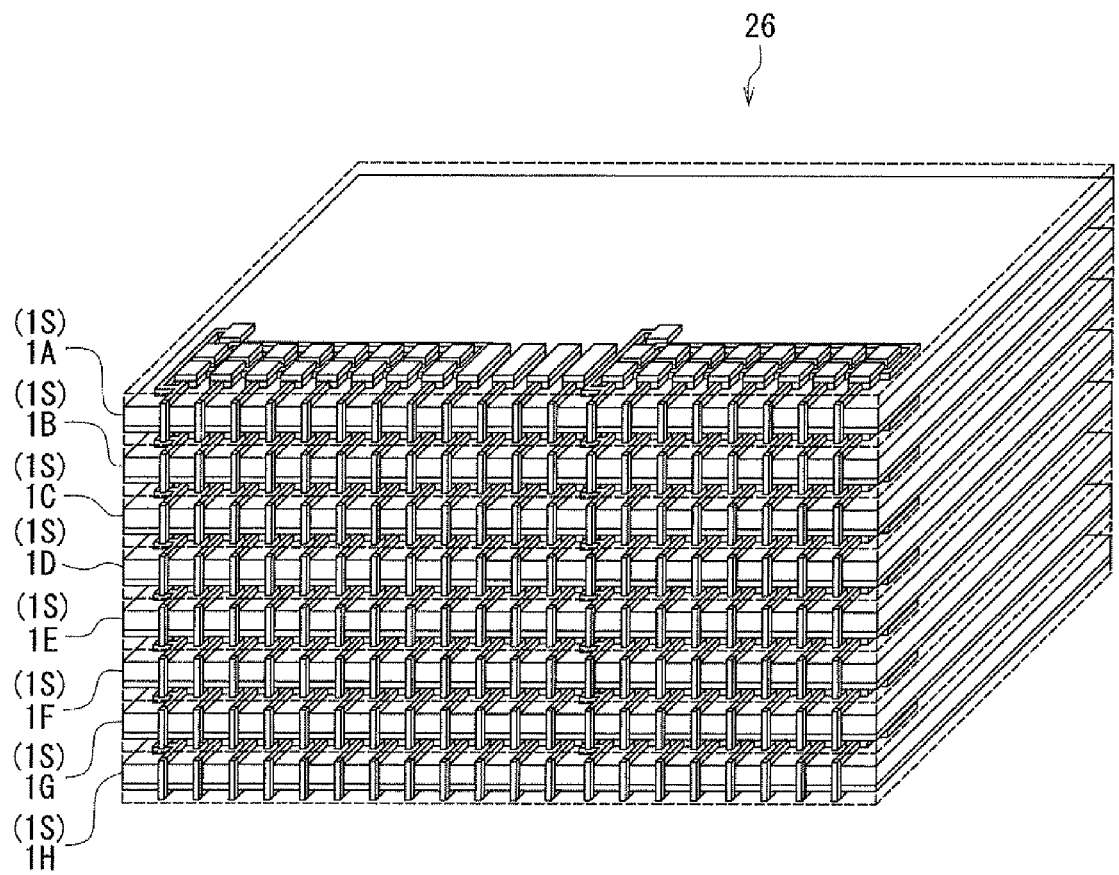
FIG. 60
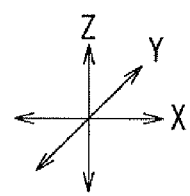

COMPOSITE LAYERED CHIP PACKAGE

BACKGROUND OF THE INVENTION

1. Field of the Invention

The present invention relates to a composite layered chip package that includes a plurality of subpackages stacked on each other.

2. Description of the Related Art

In recent years, lighter weight and higher performance have been demanded of portable devices typified by cellular phones and notebook personal computers. Accordingly, there has been a need for higher integration of electronic components for use in the portable devices. With the development of image- and video-related equipment such as digital cameras and video recorders, semiconductor memories of larger capacity and higher integration have also been demanded.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing quick circuit operation and a reduced stray capacitance of the wiring, as well as the advantage of allowing higher integration.

Major examples of the three-dimensional packaging technology for fabricating a layered chip package include a wire bonding method and a through electrode method. The wire bonding method stacks a plurality of chips on a substrate and connects a plurality of electrodes formed on each chip to external connecting terminals formed on the substrate by wire bonding. The through electrode method forms a plurality of through electrodes in each of chips to be stacked and wires the chips together by using the through electrodes.

The wire bonding method has the problem that it is difficult to reduce the distance between the electrodes so as to avoid contact between the wires, and the problem that the high resistances of the wires hamper quick circuit operation. The through electrode method is free from the above-mentioned problems of the wire bonding method.

U.S. Pat. No. 5,953,588 discloses a method of manufacturing a layered chip package as described below. In the method, a plurality of chips cut out from a processed wafer are embedded into an embedding resin and then a plurality of leads are formed to be connected to each chip, whereby a structure called a neo-wafer is fabricated. Next, the neo-wafer is diced into a plurality of structures each called a neo-chip. Each neo-chip includes one or more chips, resin surrounding the chip(s), and a plurality of leads. The plurality of leads connected to each chip have their respective end faces exposed in a side surface of the neo-chip. Next, a plurality of types of neo-chips are laminated into a stack. In the stack, the respective end faces of the plurality of leads connected to the chips of each layer are exposed in the same side surface of the stack.

Keith D. Gann, "Neo-Stacking Technology", HDI Magazine, December 1999, discloses fabricating a stack by the same method as that disclosed in U.S. Pat. No. 5,953,588, and forming wiring on two side surfaces of the stack.

U.S. Pat. No. 7,127,807 B2 discloses a multilayer module formed by stacking a plurality of active layers each including a flexible polymer substrate with at least one electronic element and a plurality of electrically-conductive traces formed within the substrate. U.S. Pat. No. 7,127,807 B2 further discloses a manufacturing method for a multilayer module as described below. In the manufacturing method, a module array stack is fabricated by stacking a plurality of module arrays each of which includes a plurality of multilayer modules arranged in two orthogonal directions. The module array stack is then cut into a module stack which is a stack of a plurality of multilayer modules. Next, a plurality of electrically-conductive lines are formed on the respective side surfaces of the plurality of multilayer modules included in the module stack. The module stack is then separated from each other into individual multilayer modules.

The yield of chips from a wafer that is to be cut later into a plurality of chips, i.e., the ratio of the number of conforming chips to the total number of chips in the wafer, is generally 90% to 99%. A layered chip package includes a plurality of chips. Therefore, the possibility that all the chips included in a layered chip package are conforming is lower than the yield of the chips. As the number of chips included in a layered chip package increases, the possibility that all the chips included in the layered chip package are conforming decreases.

A case will now be considered where a memory device such as a flash memory is constructed using a layered chip package. Generally, in a memory device such as a flash memory, a redundancy technique to replace a defective column of memory cells with a redundant column of memory cells is used so that the memory device can operate normally even when some memory cells are defective. Also in a memory device constructed using a layered chip package, if some of a plurality of memory cells included in a chip are defective, the redundancy technique can be used to allow the memory device to operate normally while allowing the use of the chip including the defective memory cells. Suppose, however, that a chip including a control circuit and a plurality of memory cells becomes defective due to, for example, a wiring failure in the control circuit, and even the redundancy technique cannot allow the chip to operate normally. In such a case, the defective chip is no longer usable. One possible solution to this case is to replace the defective chip with a conforming chip. However, this increases the manufacturing cost of the layered chip package.

Another possible solution is that a plurality of subpackages each of which includes no defective chips are electrically connected to each other to construct a memory device including a desired number of chips.

U.S. Pat. No. 7,745,259 B2 discloses a layered chip package having a configuration as described below. The layered chip package includes: a main body including a plurality of layer portions; wiring disposed on a side surface of the main body; a plurality of first terminals disposed on a top surface of the main body; and a plurality of second terminals disposed on a bottom surface of the main body. Each of the plurality of layer portions includes a semiconductor chip, and a plurality of electrodes connected to the semiconductor chip. The wiring is connected to the plurality of electrodes, the plurality of first terminals, and the plurality of second terminals of the plurality of layer portions. A plurality of such layered chip packages can be stacked on each other and electrically connected to each other.

When a plurality of layered chip packages having the same configuration are stacked on each other to construct a device such as a memory device, however, some of a plurality of signals to be associated with the chips in the respective corresponding layers of the plurality of layered chip packages may need to be varied from one layered chip package to another. This can cause the problem that the wiring of the device including the plurality of layered chip packages becomes complicated.

OBJECT AND SUMMARY OF THE INVENTION

It is an object of the present invention to provide a composite layered chip package that is formed by stacking a plurality of subpackages each of which includes one or more semiconductor chips, the composite layered chip package allowing some of a plurality of signal that are associated with the one or more semiconductor chips to be easily from one subpackage to another, and to provide a stackable chip package that can be used as a subpackage for constructing the composite layered chip package.

A composite layered chip package of the present invention includes a first subpackage and a second subpackage, the second subpackage being stacked on and electrically connected to the first subpackage. Each of the first and second subpackages includes a main body and wiring. The main body includes: a main part including at least one layer portion and having a top surface and a bottom surface; a plurality of first terminals disposed on the top surface of the main part; and a plurality of second terminals disposed on the bottom surface of the main part. The plurality of first terminals and the plurality of second terminals are electrically connected to the wiring. The at least one layer portion includes a semiconductor chip. The plurality of first terminals of the first subpackage and those of the second subpackage are in the same layout. The plurality of second terminals of the first subpackage and those of the second subpackage are in the same layout.

The first subpackage and the second subpackage are arranged in a specific relative positional relationship with each other, the specific relative positional relationship being different from a reference relative positional relationship. The reference relative positional relationship is such that, when viewed in a direction perpendicular to the top surface of the main part of the second subpackage, the plurality of first terminals of the first subpackage and the plurality of first terminals of the second subpackage coincide with each other in position while the plurality of second terminals of the first subpackage and the plurality of second terminals of the second subpackage coincide with each other in position. The specific relative positional relationship is such that, with respect to the reference relative positional relationship, the second subpackage is displaced in a direction parallel to the top surface of the main part of the second subpackage.

The plurality of first terminals and the plurality of second terminals are shaped and arranged so that a plurality of pairs of first and second terminals are formed regardless of whether in the reference relative positional relationship or the specific relative positional relationship, each of the plurality of pairs of first and second terminals being made up of one of the plurality of first terminals of the first subpackage and one of the plurality of second terminals of the second subpackage that are in contact with each other. Combinations of the first and second terminals making up the plurality of pairs of first and second terminals in the specific relative positional relationship are different from those in the reference relative positional relationship.

In the composite layered chip package of the present invention, the main body may have a top surface, a bottom surface, and four side surfaces. The wiring may include a plurality of wires disposed on at least one of the side surfaces of the main body. In this case, the plurality of wires may include a chip connection wire that is used for electrical connection to the semiconductor chip, and a bypass wire that is not electrically connected to the semiconductor chip.

In the composite layered chip package of the present invention, the main body may further include a third terminal disposed on the top surface of the main part, and a fourth terminal disposed on the bottom surface of the main part. The third terminal and the fourth terminal are electrically connected to the wiring. The third terminal and the fourth terminal are shaped and arranged so that the third terminal of the first subpackage and the fourth terminal of the second subpackage are in contact with each other regardless of whether in the reference relative positional relationship or the specific relative positional relationship.

In each of the first and second subpackages of the composite layered chip package of the present invention, the plurality of first terminals and the plurality of second terminals may be in the same layout when viewed in the direction perpendicular to the top surface of the main part.

The composite layered chip package of the present invention may be configured so that the plurality of first terminals include two or more first terminals that align in a first direction to form a first terminal row, and the plurality of second terminals include two or more second terminals that align in the first direction to form a second terminal row. At least either the plurality of first terminals or the plurality of second terminals may further include other two or more first or second terminals that align in the first direction to form a third terminal row. The third terminal row is adjacent to the first or second terminal row in a second direction orthogonal to the first direction. In this case, a plurality of pairs of terminals are formed across the first or second terminal row and the third terminal row, each of the plurality of pairs of terminals being made up of two terminals that are electrically connected to each other. The two terminals are one of the two or more first or second terminals that form the first or second terminal row and one of the other two or more first or second terminals that form the third terminal row, the ones being non-adjacent to each other in the second direction. In this case, the specific relative positional relationship is such that the second subpackage is displaced in the second direction with respect to the reference relative positional relationship.

The composite layered chip package of the present invention may be configured so that the plurality of first terminals include two or more first terminals that align in a first direction to form a first terminal row, and the plurality of second terminals include two or more second terminals that align in the first direction to form a second terminal row. In this case, at least one of the first and second terminal rows is formed by three or more first or second terminals that align in the first direction. Of the three or more first or second terminals, two that are located at opposite ends of the first or second terminal row are electrically connected to each other. In this case, the specific relative positional relationship is such that the second subpackage is displaced in the first direction with respect to the reference relative positional relationship.

In the composite layered chip package of the present invention, the main part may include a plurality of layer portions. In this case, each of the plurality of layer portions further includes a plurality of electrodes that are electrically connected to the wiring. The plurality of electrodes include a plurality of chip connection electrodes for electrical connection to the semiconductor chip. In at least one of the plurality of layer portions, the plurality of chip connection electrodes are in contact with and electrically connected to the semiconductor chip.

In the composite layered chip package of the present invention, when the main part includes a plurality of layer portions, the semiconductor chip may have a first surface and a second surface opposite to each other, and the plurality of electrodes may be located on the side of the first surface of the semiconductor chip. In this case, the plurality of layer portions may include a first layer portion located closest to the top surface of the main part, and a second layer portion located closest to the bottom surface of the main part. The first layer portion and the second layer portion may be arranged such that the second surfaces of the respective semiconductor chips included therein face each other. The plurality of first terminals may be formed by using the plurality of electrodes of the first layer portion. The plurality of second terminals may be formed by using the plurality of electrodes of the second layer portion.

In the composite layered chip package of the present invention, when the main part includes a plurality of layer portions, the main body may have a top surface, a bottom surface, and four side surfaces, and the wiring may include a plurality of wires that are disposed on at least one of the side surfaces of the main body and pass through all the layer portions in the main part. In this case, the plurality of wires may include a common wire that is used for a purpose common to all the layer portions in the main part, and a plurality of layer-dependent wires that are used by different ones of the plurality of layer portions. The plurality of electrodes may include a common electrode that is electrically connected to the common wire, and a selective connection electrode that is selectively electrically connected to only one of the plurality of layer dependent wires that is used by the layer portion to which the selective connection electrode belongs. In this case, in at least one of the plurality of layer portions, the common electrode and the selective connection electrode are electrically connected to the semiconductor chip.

Stackable chip packages of first and second modes of the present invention are each usable as the first and second subpackages to constitute the composite layered chip package of the present invention. Each of the stackable chip packages of the first and second modes includes a main body and wiring. The main body includes: a main part including at least one layer portion and having a top surface and a bottom surface; a plurality of first terminals disposed on the top surface of the main part; and a plurality of second terminals disposed on the bottom surface of the main part. The plurality of first terminals and the plurality of second terminals are electrically connected to the wiring. The at least one layer portion includes a semiconductor chip.

In the stackable chip package of the first mode, the plurality of first terminals include two or more first terminals that align in a first direction to form a first terminal row, while the plurality of second terminals include two or more second terminals that align in the first direction to form a second terminal row. At least either the plurality of first terminals or the plurality of second terminals further include other two or more first or second terminals that align in the first direction to form a third terminal row. The third terminal row is adjacent to the first or second terminal row in a second direction orthogonal to the first direction. A plurality of pairs of terminals are formed across the first or second terminal row and the third terminal row, each of the plurality of pairs of terminals being made up of two terminals that are electrically connected to each other. The two terminals are one of the two or more first or second terminals that form the first or second terminal row and one of the other two or more first or second terminals that form the third terminal row, the ones being non-adjacent to each other in the second direction.

In the stackable chip package of the second mode, the plurality of first terminals include two or more first terminals that align in a first direction to form a first terminal row, while the plurality of second terminals include two or more second terminals that align in the first direction to form a second terminal row. At least one of the first and second terminal rows is formed by three or more first or second terminals that align in the first direction. Of the three or more first or second terminals, two that are located at opposite ends of the first or second terminal row are electrically connected to each other.

In each of the stackable chip packages of the first and second modes, the main body may have a top surface, a bottom surface, and four side surfaces. The wiring may include a plurality of wires disposed on at least one of the side surfaces of the main body. In this case, the plurality of wires may include a chip connection wire that is used for electrical connection to the semiconductor chip, and a bypass wire that is not electrically connected to the semiconductor chip.

In each of the stackable chip packages of the first and second modes, the main body may further include a third terminal disposed on the top surface of the main part, and a fourth terminal disposed on the bottom surface of the main part. The third terminal and the fourth terminal are electrically connected to the wiring. The third terminal and the fourth terminal are shaped and arranged so that, when two stackable chip packages are used as the first and second subpackages, the third terminal of the first subpackage and the fourth terminal of the second subpackage are in contact with each other regardless of whether in the reference relative positional relationship or the specific relative positional relationship.

In each of the stackable chip packages of the first and second modes, the plurality of first terminals and the plurality of second terminals may be in the same layout when viewed in the direction perpendicular to the top surface of the main part.

In each of the stackable chip packages of the first and second modes, the main part may include a plurality of layer portions. In this case, each of the plurality of layer portions further includes a plurality of electrodes that are electrically connected to the wiring. The plurality of electrodes include a plurality of chip connection electrodes for electrical connection to the semiconductor chip. In at least one of the plurality of layer portions, the plurality of chip connection electrodes are in contact with and electrically connected to the semiconductor chip.

In each of the stackable chip packages of the first and second modes, when the main part includes a plurality of layer portions, the semiconductor chip may have a first surface and a second surface opposite to each other, and the plurality of electrodes may be located on the side of the first surface of the semiconductor chip. In this case, the plurality of layer portions may include a first layer portion located closest to the top surface of the main part, and a second layer portion located closest to the bottom surface of the main part. The first layer portion and the second layer portion may be arranged such that the second surfaces of the respective semiconductor chips included therein face each other. The plurality of first terminals may be formed by using the plurality of electrodes of the first layer portion. The plurality of second terminals may be formed by using the plurality of electrodes of the second layer portion.

In each of the stackable chip packages of the first and second modes, when the main part includes a plurality of layer portions, the main body may have a top surface, a bottom surface, and four side surfaces, and the wiring may include a plurality of wires that are disposed on at least one of the side surfaces of the main body and pass through all the layer portions in the main part. In this case, the plurality of wires may include a common wire that is used for a purpose common to all the layer portions in the main part, and a plurality of layer-dependent wires that are used by different ones of the plurality of layer portions. The plurality of electrodes may include a common electrode that is electrically connected to the common wire, and a selective connection electrode that is selectively electrically connected to only one of the plurality of layer-dependent wires that is used by the layer portion to which the selective connection electrode belongs. In this case, in at least one of the plurality of layer portions, the common electrode and the selective connection electrode are electrically connected to the semiconductor chip.

According to the composite layered chip package and the stackable chip packages (subpackages) of the present invention, arranging the first and second subpackages of the composite layered chip package in the specific relative positional relationship allows some of a plurality of signals associated with one or more semiconductor chips in the subpackages to be varied from one subpackage to another easily.

Other and further objects, features and advantages of the present invention will appear more fully from the following description.

BRIEF DESCRIPTION OF THE DRAWINGS

FIG. 45 is an explanatory diagram showing the flow of a plurality of signals in the composite layered chip package shown in FIG. 38.

FIG. 46 is an explanatory diagram showing the flow of a plurality of signals in the composite layered chip package shown in FIG. 39.

FIG. 60 is a perspective view of a composite layered chip package that is formed by arranging eight subpackages of FIG. 59 in the reference relative positional relationship with each other.

DETAILED DESCRIPTION OF THE PREFERRED EMBODIMENTS

First Embodiment

Figure 1:
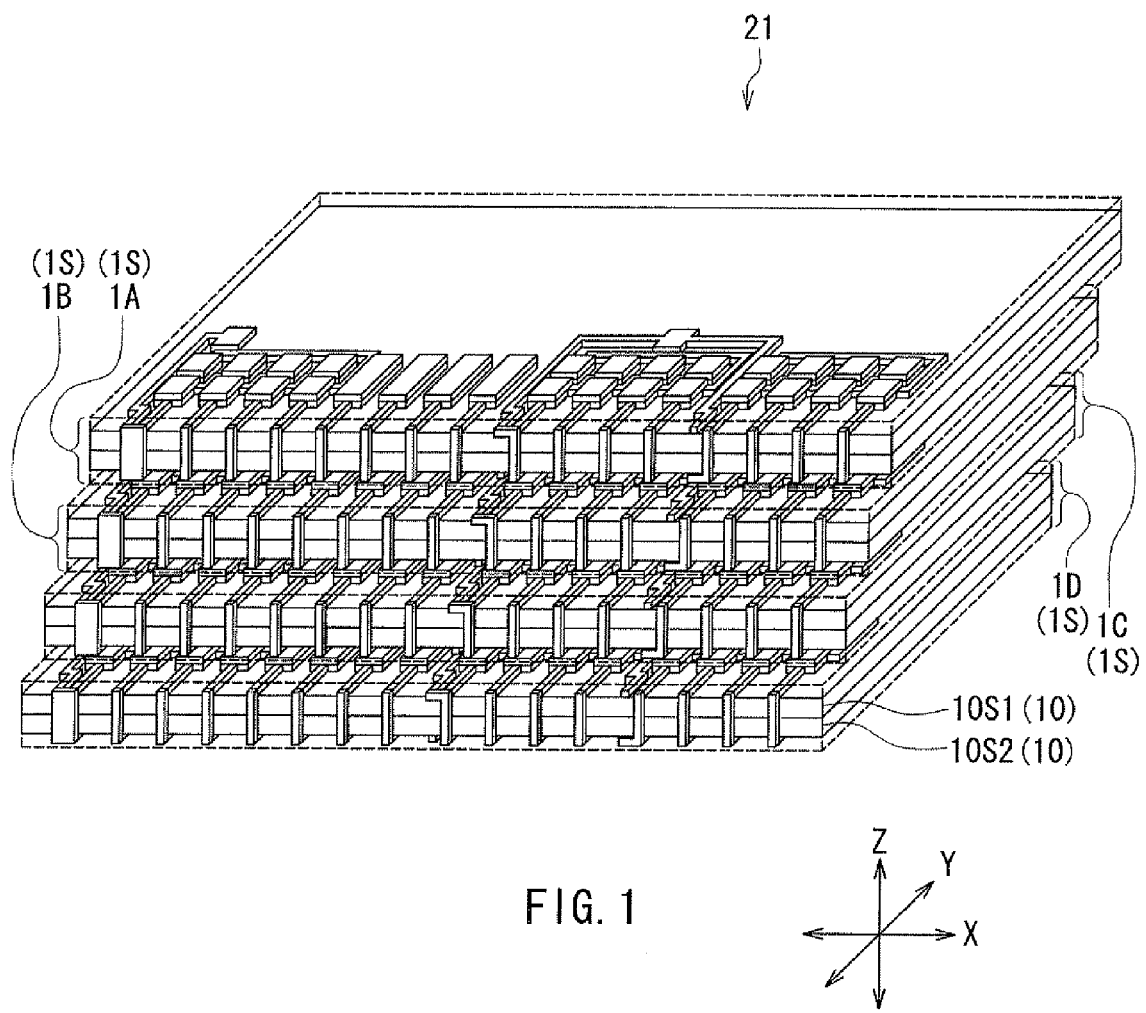
FIG. 1 is a perspective view of a composite layered chip package according to a first embodiment of the invention.
Figure 2:
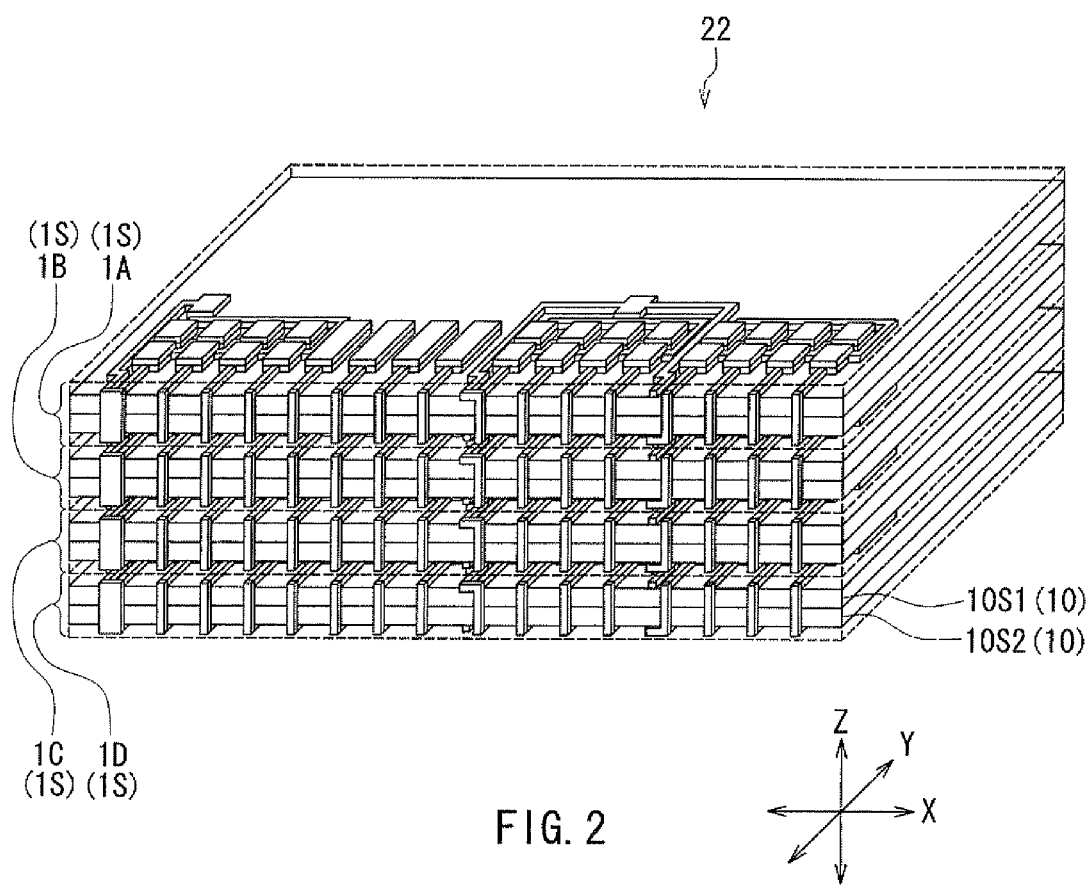
FIG. 2 is a perspective view of a composite layered chip package that is formed by arranging four subpackages of FIG. 1 in a reference relative positional relationship with each other.
Figure 3:
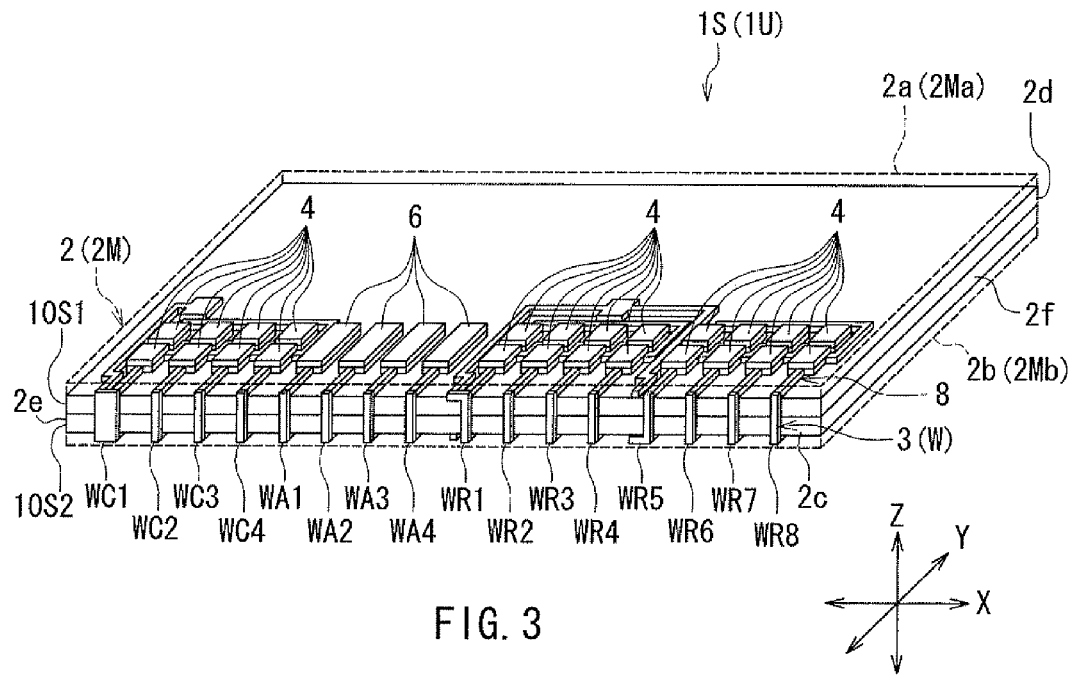
FIG. 3 is a perspective view of a stackable chip package according to the first embodiment of the invention.
Figure 4:
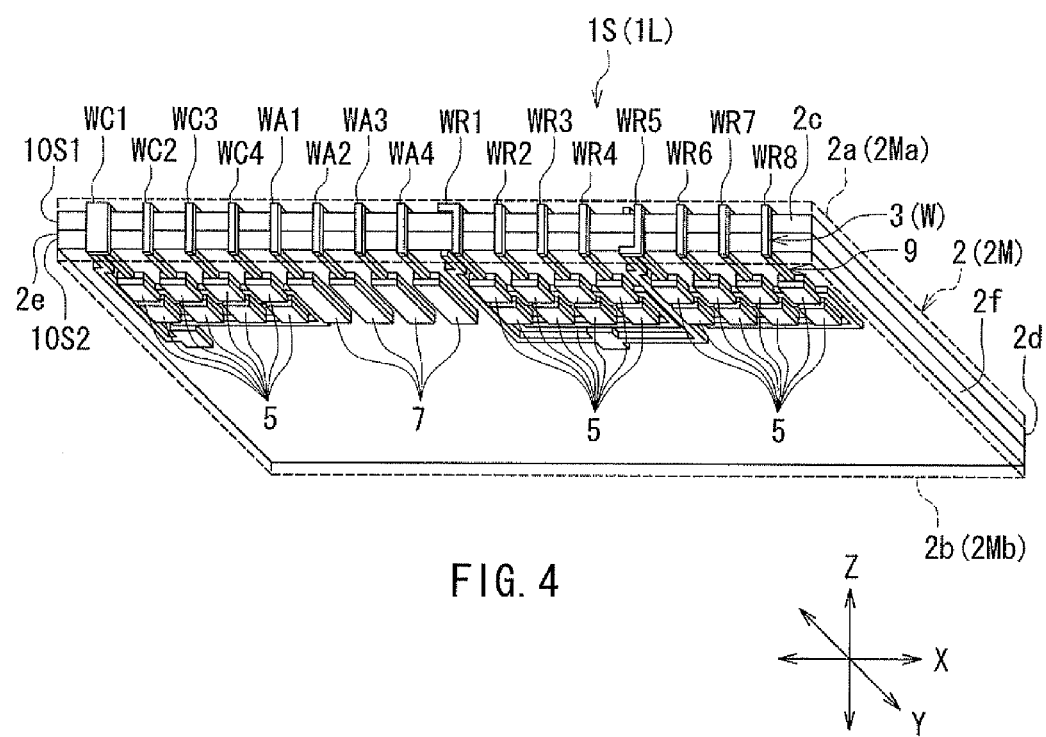
FIG. 4 a perspective view showing the stackable chip package of FIG. 3 as viewed from below.
Figure 5:
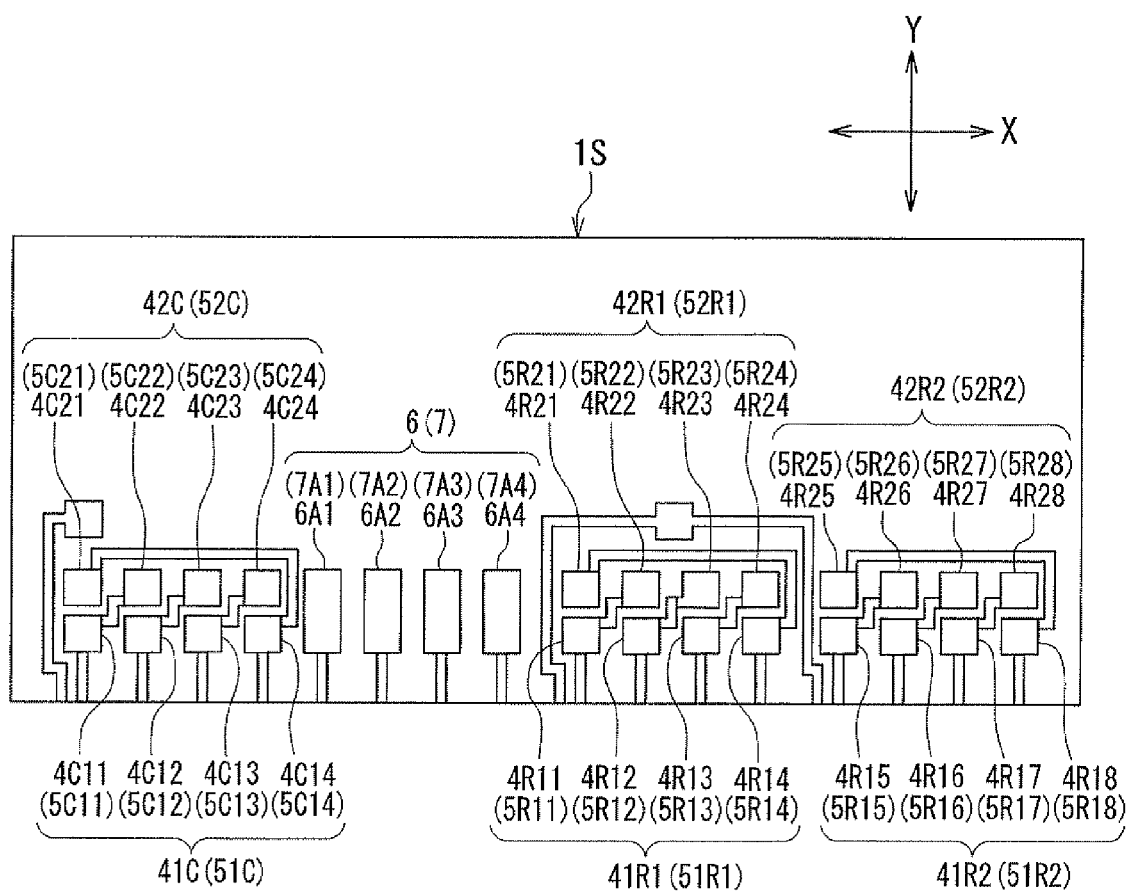
FIG. 5 is a plan view showing a plurality of terminals of the stackable chip package shown in FIG. 3.
Figure 6:
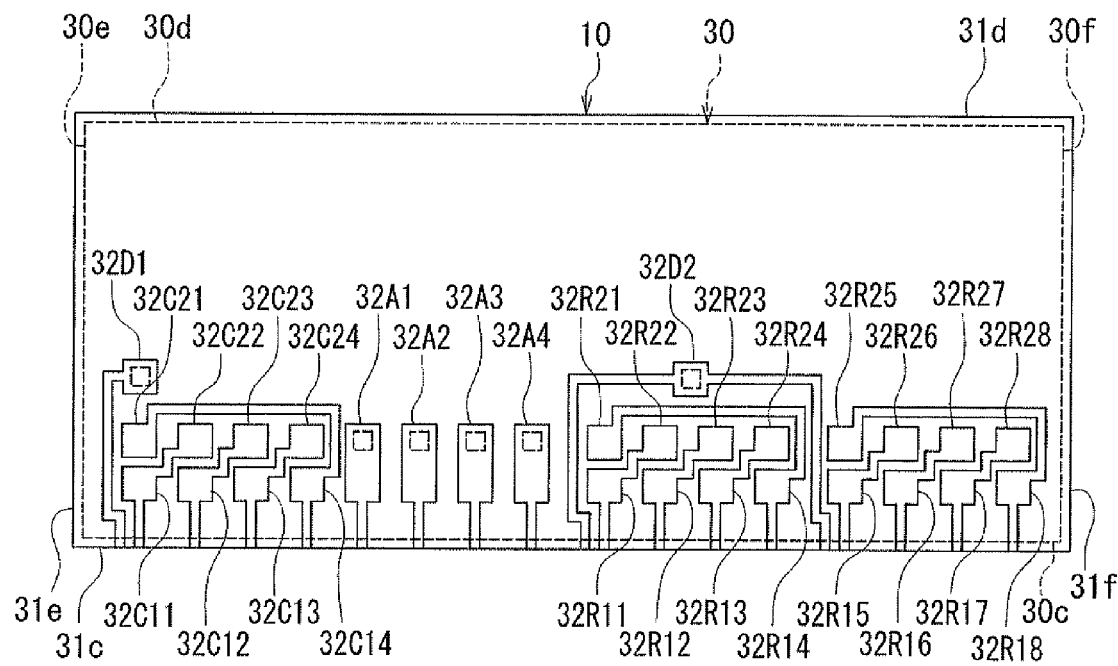
FIG. 6 is a plan view showing a layer portion included in the stackable chip package shown in FIG. 3.
Figure 7:
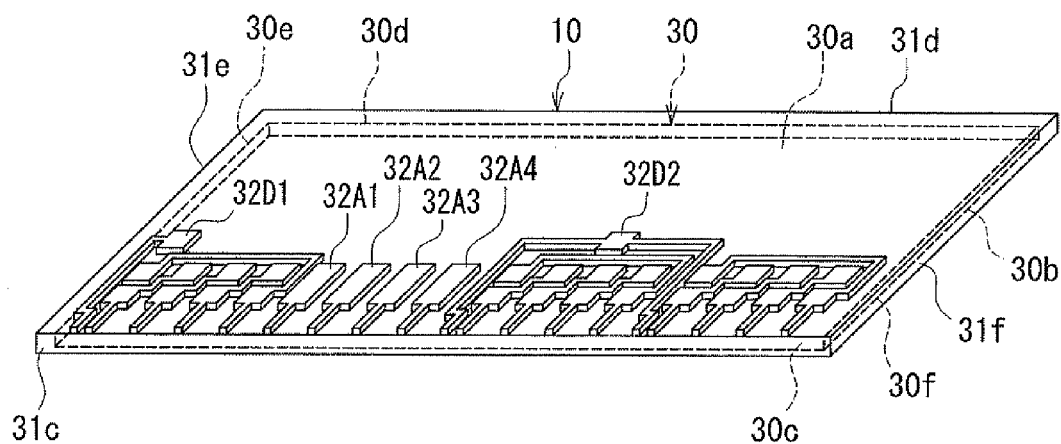
FIG. 7 is a perspective view of the layer portion shown in FIG. 6.

Preferred embodiments of the present invention will now be described in detail with reference to the drawings. First, reference is made to FIG. 1 to FIG. 7 to describe the configurations of a composite layered chip package and a stackable chip package according to a first embodiment of the invention. FIG. 1 is a perspective view of the composite layered chip package according to the present embodiment. FIG. 2 is a perspective view of a composite layered chip package that is formed by arranging four subpackages of FIG. 1 in a reference relative positional relationship with each other. FIG. 3 is a perspective view of the stackable chip package according to the present embodiment. FIG. 4 is a perspective view showing the stackable chip package of FIG. 3 as viewed from below. FIG. 5 is a plan view showing a plurality of terminals of the stackable chip package shown in FIG. 3. FIG. 6 is a plan view showing a layer portion included in the stackable chip package shown in FIG. 3. FIG. 7 is a perspective view of the layer portion shown in FIG. 6.

The composite layered chip package 21 according to the present embodiment includes a first subpackage and a second subpackage. The second subpackage is stacked on and electrically connected to the first subpackage. In particular, as shown in FIG. 1, the composite layered chip package 21 according to the present embodiment includes four subpackages stacked on each other. Hereinafter, the four subpackages will be designated by reference symbols 1A, 1B, 1C, and 1D in order from the top as shown in FIG. 1. In the composite layered chip package 21, any two vertically adjacent subpackages are electrically connected to each other. Of any two vertically adjacent subpackages, the lower subpackage is the first subpackage and the upper subpackage is the second subpackage. Hereinafter, the first subpackage will be designated by reference symbol 1L, and the second subpackage will be designated by reference symbol 1U. Any subpackage will be designated by reference symbol 1S. Each subpackage 1S is the stackable chip package according to the present embodiment. For the sake of convenience, the subpackage 1S shown in FIG. 3 will be regarded as the second subpackage 1U, and the subpackage 1S shown in FIG. 4 as the first subpackage 1L. It follows that the second subpackage 1U shown in FIG. 3 is stacked on the first subpackage 1L shown in FIG. 4.

The composite layered chip package 22 shown in FIG. 2 is formed by arranging the four subpackages 1A to 1D of FIG. 1 in a reference relative positional relationship with each other. The composite layered chip package 21 according to the present embodiment shown in FIG. 1 is a package formed by arranging the four subpackages 1A to 1D in a specific relative positional relationship, different from the reference relative positional relationship, with each other. The reference relative positional relationship and the specific relative positional relationship will be described in detail later.

As shown in FIG. 3 and FIG. 4, the subpackage 1S or the stackable chip package according to the present embodiment includes a main body 2 having a top surface 2a, a bottom surface 2b, and four side surfaces 2c, 2d, 2e, and 2f. The side surfaces 2c and 2d are mutually opposite to each other. The side surfaces 2e and 2f are mutually opposite to each other.

The subpackage 1S further has wiring 3 including a plurality of wires W disposed on at least one of the side surfaces of the main body 2. In the example shown in FIG. 3 and FIG. 4, the plurality of wires W are disposed on the side surface 2c only. The main body 2 includes a main part 2M having a top surface 2Ma and a bottom surface 2Mb. The main part 2M includes a plurality of layer portions. In the present embodiment, in particular, the main part 2M includes two layer portions 10S1 and 10S2. The layer portion 10S1 is disposed on the layer portion 10S2. Hereinafter, any layer portion will be designated by reference numeral 10. The layer portion 10S1 is located closest to the top surface 2Ma of the main part 2M among the plurality of layer portions, and therefore corresponds to the first layer portion according to the invention. The layer portion 10S2 is located closest to the bottom surface 2Mb of the main part 2M among the plurality of layer portions, and therefore corresponds to the second layer portion according to the invention.

The main body 2 further includes: a plurality of first terminals 4 and a plurality of third terminals 6 disposed on the top surface 2Ma of the main part 2M; and a plurality of second terminals 5 and a plurality of fourth terminals 7 disposed on the bottom surface 2Mb of the main part 2M. The plurality of first terminals 4, the plurality of second terminals 5, the plurality of third terminals 6, and the plurality of fourth terminals 7 are electrically connected to the wiring 3 (the plurality of wires W). The main body 2 further includes top wiring 8 and bottom wiring 9. The top wiring 8 is disposed on the top surface 2Ma of the main part 2M and electrically connects the terminals 4 and 6 to the plurality of wires W. The bottom wiring 9 is disposed on the bottom surface 2Mb of the main part 2M and electrically connects the terminals 5 and 7 to the plurality of wires W.

The first and second subpackages 1L and 1U are the same in terms of the layout of the plurality of first terminals 4, the layout of the plurality of second terminals 5, the layout of the plurality of third terminals 6, and the layout of the plurality of fourth terminals 7. In the present embodiment, in particular, the four subpackages 1A to 1D are the same in terms of the layout of the plurality of first terminals 4, the layout of the plurality of second terminals 5, the layout of the plurality of third terminals 6, and the layout of the plurality of fourth terminals 7.

At least either the plurality of terminals 4 and 6 arranged on the top surface 2Ma of the main part 2M or the plurality of terminals 5 and 7 arranged on the bottom surface 2Mb of the main part 2M may include a solder layer that is made of a solder material and exposed in the terminal surfaces. The solder layer can be heated to melt and then solidified to electrically connect the plurality of the terminals 5 and 7 of the second subpackage 1U to the plurality of terminals 4 and 6 of the first subpackage 1L.

Here, as shown in FIG. 1 to FIG. 4, X, Y, and Z directions will be defined as follows. The X direction is parallel to the top surface 2Ma of the main part 2M and the side surfaces 2c and 2d of the main body 2. The Y direction is parallel to the top surface 2Ma of the main part 2M and the side surfaces 2e and 2f of the main body 2. The Z direction is perpendicular to the top surface 2Ma of the main part 2M. The X, Y, and Z directions are orthogonal to each other.

In the present embodiment, each of the first and second subpackages 1L and 1U is configured so that the plurality of first terminals 4 and the plurality of second terminals 5 are in the same layout when viewed in the direction perpendicular to the top surface 2Ma of the main part 2M (the Z direction), and that the plurality of third terminals 6 and the plurality of fourth terminals 7 are in the same layout when viewed in the Z direction. In the present embodiment, in particular, each of the four subpackages 1A to 1D is configured so that the plurality of first terminals 4 and the plurality of second terminals 5 are in the same layout when viewed in the Z direction, and that the plurality of third terminals 6 and the plurality of fourth terminals 7 are in the same layout when viewed in the Z direction.

As shown in FIG. 2, the reference relative positional relationship is such that, when viewed in the direction perpendicular to the top surface 2Ma of the main part 2M of the second subpackage 1U, the plurality of first terminals 4 of the first subpackage 1L and the plurality of first terminals 4 of the second subpackage 1U coincide with each other in position while the plurality of second terminals 5 of the first subpackage 1L and the plurality of second terminals 5 of the second subpackage 1U coincide with each other in position. It should be appreciated that the phrase "the plurality of first terminals 4 of the first subpackage 1L and the plurality of first terminals 4 of the second subpackage 1U coincide with each other in position" refers to the situation where the plurality of first terminals 4 of the subpackage 1L and the plurality of first terminals 4 of the subpackage 1U coincide with each other in position in the direction parallel to the top surface 2Ma of the main part 2M of the second subpackage 1U. Likewise, the phrase "the plurality of second terminals 5 of the first subpackage 1L and the plurality of second terminals 5 of the second subpackage 1U coincide with each other in position" refers to the situation where the plurality of second terminals 5 of the subpackage 1L and the plurality of second terminals 5 of the subpackage 1U coincide with each other in position in the direction parallel to the top surface 2Ma of the main part 2M of the second subpackage 1U.

The specific relative positional relationship shown in FIG. 1 is such that, with respect to the reference relative positional relationship shown in FIG. 2, the second subpackage 1U is displaced in the direction parallel to the top surface 2Ma of the main part 2M of the second subpackage 1U. The specific relative positional relationship may be said to be such that the second subpackage 1U is offset from the first subpackage 1L in the direction parallel to the top surface 2Ma of the main part 2M of the second subpackage 1U. In the present embodiment, in particular, the specific relative positional relationship refers to such a positional relationship that the second subpackage 1U is displaced in the Y direction with respect to the reference relative positional relationship.

The plurality of first terminals 4 and the plurality of second terminals 5 are shaped and arranged so that a plurality of pairs of first and second terminals 4 and 5 are formed regardless of whether in the reference relative positional relationship or the specific relative positional relationship, each of the plurality of pairs of first and second terminals 4 and 5 being made up of one of the plurality of first terminals 4 of the first subpackage 1L and one of the plurality of second terminals 5 of the second subpackage 1U that are in contact with each other. Combinations of the first and second terminals 4 and 5 making up the plurality of pairs of first and second terminals 4 and 5 in the specific relative positional relationship are different from those in the reference relative positional relationship.

The plurality of third terminals 6 and the plurality of fourth terminal 7 are shaped and arranged so that the plurality of third terminals 6 of the first subpackage 1L are in contact with the plurality of fourth terminals 7 of the second subpackage 1U regardless of whether in the reference relative positional relationship or the specific relative positional relationship. The specific shape and arrangement of the plurality of terminals 4, 5, 6, and 7 will be described in detail later.

A description will now be given of the layer portions 10 with reference to FIG. 6 and FIG. 7. FIG. 6 and FIG. 7 show the layer portion 10S1. Differences between the layer portion 10S1 and the layer portion 10S2 will be described later. Each layer portion 10 includes a semiconductor chip 30. The semiconductor chip 30 has: a first surface 30a with a device formed thereon; a second surface 30b opposite to the first surface 30a; a first side surface 30c and a second side surface 30d that are mutually opposite to each other; and a third side surface 30e and a fourth side surface 30f that are mutually opposite to each other.

Each layer portion 10 further includes an insulating portion 31 and a plurality of electrodes 32. The insulating portion 31 covers at least one of the four side surfaces of the semiconductor chip 30. The insulating portion 31 has at least one end face that is located in the at least one of the side surfaces of the main body 2 on which the plurality of wires W are disposed. In the example shown in FIG. 6 and FIG. 7, the insulating portion 31 covers all the four side surfaces 30c, 30d, 30e and 30f of the semiconductor chip 30, and has four end faces 31c, 31d, 31e and 31f located in the four side surfaces of the main body 2. The four end faces 31c, 31d, 31e, and 31f of the insulating portion 31 lie outside the four side surfaces 30c, 30d, 30e, and 30f of the semiconductor chip 30, respectively. The plurality of electrodes 32 are disposed on the side of the first surface 30a of the semiconductor chip 30.

The layer portion 10S1 and the layer portion 10S2 are arranged so that the second surfaces 30b of the respective semiconductor chips 30 included therein face each other. The layer portion 10S1 is arranged with the first surface 30a of the semiconductor chip 30 upward and the side surfaces 30c, 30d, 30e, and 30f of the semiconductor chip 30 toward the side surfaces 2c, 2d, 2e, and 2f of the main body 2, respectively. The layer portion 10S2 is arranged with the first surface 30a of the semiconductor chip 30 downward and the side surfaces 30c, 30d, 30e, and 30f of the semiconductor chip 30 toward the side surfaces 2c, 2d, 2f, and 2e of the main body 2, respectively. The layer portions 10S1 and 10S2 are bonded to each other with an adhesive, for example.

The plurality of electrodes 32 include a plurality of chip connection electrodes for electrical connection to the semiconductor chip 30. In at least one of the layer portions 10S1 and 10S2 in each subpackage 1S, the plurality of chip connection electrodes are in contact with and electrically connected to the semiconductor chip 30, whereby the semiconductor chip 30 is electrically connected to two or more of the plurality of wires W via the plurality of chip connection electrodes.

Now, the plurality of terminals 4, 5, 6, and 7 will be described in detail. In the present embodiment, as shown in FIG. 3 and FIG. 4, each subpackage 1S is configured so that the plurality of first terminals 4 and the plurality of second terminals 5 are in the same layout when viewed in the direction perpendicular to the top surface 2Ma of the main part 2M (the Z direction), and that the plurality of third terminals 6 and the plurality of fourth terminals 7 are in the same layout when viewed in the Z direction. FIG. 5 shows the shape and arrangement of the plurality of terminals 4, 5, 6, and 7 when viewed in the direction perpendicular to the top surface 2Ma of the main part 2M (the Z direction). The shape and arrangement of the plurality of second terminals 5 when viewed from below the bottom surface 2Mb of the main part 2M are a mirror image to those of the plurality of first terminals 4 when viewed from above the top surface 2Ma of the main part 2M. Likewise, the shape and arrangement of the plurality of fourth terminals 7 when viewed from below the bottom surface 2Mb of the main part 2M are a mirror image to those of the plurality of third terminals 6 when viewed from above the top surface 2Ma of the main part 2M.

As shown in FIG. 5, the plurality of first terminals 4 include two or more first terminals 4 that align in a first direction to form a first terminal row. Specifically, the plurality of first terminals 4 include: four first terminals 4C11, 4C12, 4C13, and 4C14 that align in the X direction to form a terminal row 41C; four first terminals 4R11, 4R12, 4R13, and 4R14 that align in the X direction to form a terminal row 41R1; and four first terminals 4R15, 4R16, 4R17, and 4R18 that align in the X direction to form a terminal row 41R2. The X direction corresponds to the first direction. Each of the terminal rows 41C, 41R1, and 41R2 corresponds to the first terminal row.

The plurality of second terminals 5 include two or more second terminals 5 that align in the first direction to form a second terminal row. Specifically, the plurality of second terminals 5 include: four second terminals 5C11, 5C12, 5C13, and 5C14 that align in the X direction to form a terminal row 51C; four second terminals 5R11, 5R12, 5R13, and 5R14 that align in the X direction to form a terminal row 51R1; and four second terminals 5R15, 5R16, 5R17, and 5R18 that align in the X direction to form a terminal row 51R2. Each of the terminal rows 51C, 51R1, and 51R2 corresponds to the second terminal row.

At least either the plurality of first terminals 4 or the plurality of second terminals 5 further include other two or more first or second terminals that align in the first direction (the X direction) to form a third terminal row. The third terminal row is adjacent to the first or second terminal row in a second direction orthogonal to the first direction (the X direction). In the present embodiment, in particular, the plurality of first terminals 4 include other two or more first terminals that align in the first direction (the X direction) to form a third terminal row, and the plurality of second terminals 5 include other two or more second terminals that align in the first direction (the X direction) to form a third terminal row.

Specifically, the plurality of first terminals 4 include: four first terminals 4C21, 4C22, 4C23, and 4C24 that align in the X direction to form a terminal row 42C; four first terminals 4R21, 4R22, 4R23, and 4R24 that align in the X direction to form a terminal row 42R1; and four first terminals 4R25, 4R26, 4R27, and 4R28 that align in the X direction to form a terminal row 42R2. The terminal row 42C is adjacent to the terminal row 41C in the Y direction. The terminal row 42R1 is adjacent to the terminal row 41R1 in the Y direction. The terminal row 42R2 is adjacent to the terminal row 41R2 in the Y direction. The Y direction corresponds to the second direction. Each of the terminal rows 42C, 42R1, and 42R2 corresponds to the third terminal row.

A plurality of pairs of terminals are formed across a first terminal row and an adjacent third terminal row, each of the plurality of pairs of terminals being made up of two terminals that are electrically connected to each other. The two terminals are one of the two or more first terminals that form the first terminal row and one of the other two or more first terminals that form the third terminal row, the ones being non-adjacent to each other in the second direction (the Y direction). Specifically, across the first terminal row and the third terminal row, there are formed the following pairs of two electrically-connected terminals: (4C11, 4C22), (4C12, 4C23), (4C13, 4C24), (4C14, 4C21), (4R11, 4R22), (4R12, 4R23), (4R13, 4R24), (4R14, 4R21), (4R15, 4R26), (4R16, 4R27), (4R17, 4R28), and (4R18, 4R25).

The plurality of second terminals 5 include: four second terminals 5C21, 5C22, 5C23, and 5C24 that align in the X direction to form a terminal row 52C; four second terminals 5R21, 5R22, 5R23, and 5R24 that align in the X direction to form a terminal row 52R1; and four second terminals 5R25, 5R26, 5R27, and 5R28 that align in the X direction to form a terminal row 52R2. The terminal row 52C is adjacent to the terminal row 51C in the Y direction. The terminal row 52R1 is adjacent to the terminal row 51R1 in the Y direction. The terminal row 52R2 is adjacent to the terminal row 51R2 in the Y direction. Each of the terminal rows 52C, 52R1, and 52R2 corresponds to the third terminal row.

A plurality of pairs of terminals are formed across a second terminal row and an adjacent third terminal row, each of the plurality of pairs of terminals being made up of two terminals that are electrically connected to each other. The two terminals are one of the two or more second terminals that form the second terminal row and one of the other two or more second terminals that form the third terminal row, the ones being non-adjacent to each other in the second direction (the Y direction). Specifically, across the second terminal row and the third terminal row, there are formed the following pairs of two electrically-connected terminals: (5C11, 5C22), (5C12, 5C23), (5C13, 5C24), (5C14, 5C21), (5R11, 5R22), (5R12, 5R23), (5R13, 5R24), (5R14, 5R21), (5R15, 5R26), (5R16, 5R27), (5R17, 5R28), and (5R18, 5R25).

The plurality of third terminals 6 include four terminals 6A1 to 6A4. The terminals 6A1 to 6A4 are each shaped to be elongated in the Y direction as compared with the first terminals 4. The plurality of fourth terminals 7 include four terminals 7A1 to 7A4. The terminals 7A1 to 7A4 are each shaped to be elongated in the Y direction as compared with the second terminals 5.

In each subpackage 1S, two terminals in each of the following pairs of terminals coincide with each other in position when viewed in the direction perpendicular to the top surface 2Ma of the main part 2M (the Z direction): (4C11, 5C11), (4C12, 5C12), (4C13, 5C13), (4C14, 5C14), (4R11, 5R11), (4R12, 5R12), (4R13, 5R13), (4R14, 5R14), (4R15, 5R15), (4R16, 5R16), (4R17, 5R17), (4R18, 5R18), (4C21, 5021), (4C22, 5022), (4C23, 5C23), (4C24, 5C24), (4R21, 5R21), (4R22, 5R22), (4R23, 5R23), (4R24, 5R24), (4R25, 5R25), (4R26, 5R26), (4R27, 5R27), (4R28, 5R28), (6A1, 7A1), (6A2, 7A2), (6A3, 7A3), and (6A4, 7A4).

Now, the plurality of wires W will be described in detail. The plurality of wires W are disposed on the side surface 2c of the main body 2 and pass through all the layer portions 10S1 and 10S2 in the main part 2M. The plurality of wires W include wires WC1, WC2, WC3, WC4, WR1, WR2, WR3, WR4, WR5, WR6, WR7, WR8, WA1, WA2, WA3, and WA4 that electrically connect two terminals in the respective pairs of terminals (4C11, 5C11), (4C12, 5C12), (4C13, 5C13), (4C14, 5C14), (4R11, 5R11), (4R12, 5R12), (4R13, 5R13), (4R14, 5R14), (4R15, 5R15), (4R16, 5R16), (4R17, 5R17), (4R18, 5R18), (6A1, 7A1), (6A2, 7A2), (6A3, 7A3), and (6A4, 7A4).

The wires WA1 to WA4 are used for a purpose common to all the layer portions 10S1 and 10S2 in the main part 2M. Each of these wires therefore corresponds to the common wire according to the invention. The wires WR1 and WR5 are used by different ones of the plurality of layer portions. These wires therefore correspond to the layer-dependent wires according to the invention.

The wires WA1 to WA4, WC1, WR1, and WR5 are used for electrical connection to the semiconductor chip 30. These wires therefore correspond to the chip connection wires according to the invention. The wires WC2 to WC4, WR2 to WR4, and WR6 to WR8 are electrically non-connected to the semiconductor chip 30. These wires therefore correspond to the bypass wires according to the invention.

The plurality of electrodes 32 will now be described. In the present embodiment, the plurality of terminals 4 and 6 are formed by using the plurality of electrodes 32 of the layer portion 10S1, and the plurality of terminals 5 and 7 are formed by using the plurality of electrodes 32 of the layer portion 10S2.

FIG. 6 and FIG. 7 illustrate the shape and arrangement of the plurality of electrodes 32 of the layer portion 10S1. The shape and arrangement of the plurality of electrodes 32 of the layer portion 10S2 when viewed from the side of the first surface 30a of the semiconductor chip 30 are a mirror image to those of the plurality of electrodes 32 shown in FIG. 6 and FIG. 7.

The plurality of electrodes 32 include electrodes 32C11 to 32C14, 32C21 to 32C24, 32R11 to 32R18, 32R21 to 32R28, 32A1 to 32A4, 32D1, and 32D2. In FIG. 7, the reference symbols of the electrodes other than the electrodes 32A1 to 32A4, 32D1, and 32D2 are omitted.

The electrodes 32C11 to 32C14, 32R11 to 32R18, 32C21 to 32C24, 32R21 to 32R28, and 32A1 to 32A4 of the layer portion 10S1 include terminal component parts that are used for forming the terminals 4C11 to 4C14, 4R11 to 4R18, 4C21 to 4C24, 4R21 to 4R28, and 6A1 to 6A4.

The electrodes 32C11 to 32C14, 32R11 to 32R18, 32C21 to 32C24, 32R21 to 32R28, and 32A1 to 32A4 of the layer portion 10S2 include terminal component parts that are used for forming the terminals 5C11 to 5C14, 5R11 to 5R18, 5C21 to 5C24, 5R21 to 5R28, and 7A1 to 7A4.

The electrodes 32C11 to 32C14, 32R11 to 32R18, and 32A1 to 32A4 have respective end faces located in the end face 31c of the insulating portion 31, and are electrically connected to the wires WC1 to WC4, WR1 to WR8, and WA1 to WA4 via those end faces. The electrodes 32A1 to 32A4 correspond to the common electrodes according to the invention.

A plurality of pairs of electrodes are formed across a group of electrodes 32C11 to 32C14 and 32R11 to 32R18 and a group of electrodes 32C21 to 32C24 and 32R21 to 32R28, each of the plurality of pairs of electrodes being made up of two electrodes that are electrically connected to each other. The two electrodes are ones that are not adjacent to each other in the second direction (the Y direction). Specifically, there are formed the following pairs of two electrically-connected electrodes: (32C11, 32C22), (32C12, 32C23), (32C13, 32C24), (32C14, 32C21), (32R11, 32R22), (32R12, 32R23), (32R13, 32R24), (32R14, 32R21), (32R15, 32R26), (32R16, 32R27), (32R17, 32R28), and (32R18, 32R25).

The electrodes 32A1 to 32A4, 32D1, and 32D2 are in contact with and electrically connected to the semiconductor chip 30. These electrodes therefore correspond to the chip connection electrodes according to the invention. In FIG. 6, the dashed squares in the electrodes 32A1 to 32A4, 32D1, and 32D2 represent the areas where these electrodes make contact with the semiconductor chip 30. None of the electrodes 32C11 to 32C14, 32R11 to 32R18, 32C21 to 32C24, and 32R21 to 32R28 are in contact with the semiconductor chip 30. Neither of the electrodes 32D1 and 32D2 are used for forming any terminal.

The electrode 32D1 has an end face located in the end face 31c of the insulating portion 31. This end' face is located near the end face of the electrode 32C11. The electrode 32D2 has first and second branch portions. Each of the first and second branch portions has an end face located in the end face 31c of the insulating portion 31. The end face of the first branch portion is located near the end face of the electrode 32R11. The end face of the second branch portion is located near the end face of the electrode 32R15.

In each of the layer portions 10S1 and 10S2, the wire WC1 is broadened to come into contact with the end face of the electrode 32D1. The electrode 32D1 of each of the layer portions 10S1 and 10S2 is thereby electrically connected to the wire WC1. In the layer portion 10S1, the wire WR1 is broadened in part to come into contact with the end face of the first branch portion of the electrode 32D2. The electrode 32D2 of the layer portion 10S1 is thereby electrically connected to the wire WR1. In the layer portion 10S2, the wire WR5 is broadened in part to come into contact with the end face of the second branch portion of the electrode 32D2. The electrode 32D2 of the layer portion 10S2 is thereby electrically connected to the wire WR5. The electrode 32D2 corresponds to the selective connection electrode according to the invention.

In each of the layer portions 10S1 and 10S2, the insulating portion 31 does not cover the terminal component parts of the plurality of electrodes but covers the other portions of the plurality of electrodes and the first surface 30a of the semiconductor chip 30. The terminal component parts not covered by the insulating portion 31 form conductor pads. Conductor layers are formed on the conductor pads. The terminal component parts and the conductor layers of the layer portion 10S1 constitute the plurality of terminals 4 and 6. The terminal component parts and the conductor layers of the layer portion 10S2 constitute the plurality of terminals 5 and 7. In the present embodiment, the plurality of terminals 4 and 6 are thus formed by using the plurality of electrodes (the plurality of terminal component parts) of the layer portion 10S1. Part of the portions of the plurality of electrodes covered by the insulating portion 31 in the layer portion 10S1 forms the top wiring 8. The plurality of terminals 5 and 7 are thus formed by using the plurality of electrodes (the plurality of terminal component parts) of the layer portion 10S2. Part of the portions of the plurality of electrodes covered by the insulating portion 31 in the layer portion 10S2 forms the bottom wiring 9. In FIG. 1 to FIG. 4, the insulating portions 31 in the layer portions 10S1 and 10S2 are partly shown in broken lines.

The semiconductor chip 30 may be a memory chip that constitutes a memory such as a flash memory, DRAM, SRAM, MRAM, PROM, or FeRAM. In such a case, the semiconductor chip 30 includes a plurality of memory cells. It is possible in this case to construct a memory device of large capacity by using the composite layered chip package 21 including a plurality of semiconductor chips 30. With the composite layered chip package 21 according to the present embodiment, it is also possible to easily construct a memory device of various capacities such as 64 GB (gigabytes), 128 GB, and 256 GB by varying the number of the semiconductor chips 30 to be included in the composite layered chip package 21.

The semiconductor chips 30 are not limited to memory chips, and may be ones used for constructing other devices such as CPUs, sensors, and driving circuits for sensors.

Now, the reference relative positional relationship and the specific relative positional relationship will be described in detail. The reference relative positional relationship will be described first, with reference to FIG. 2. The reference relative positional relationship is such that, when viewed in the direction perpendicular to the top surface 2Ma of the main part 2M of the subpackage 1U (the Z direction), the plurality of first terminals 4 of the subpackage 1L and the plurality of first terminals 4 of the subpackage 1U coincide with each other in position while the plurality of second terminals 5 of the subpackage 1L and the plurality of second terminals 5 of the subpackage 1U coincide with each other in position. When in the reference relative positional relationship, terminals 4 and 6 of the subpackage 1L and terminals 5 and 7 of the subpackage 1U that coincide with each other in position when viewed in the Z direction are in contact with each other and electrically connected to each other. In this way, there are formed a plurality of pairs of first and second terminals each of which is made up of one of the plurality of first terminals 4 of the first subpackage 1L and one of the plurality of second terminals 5 of the second subpackage 1U that are in contact with each other and electrically connected to each other.

The specific relative positional relationship shown in FIG. 1 is such that the second subpackage 1U is displaced in the Y direction (the second direction) with respect to the reference relative positional relationship. Combinations of the first terminals 4 of the first subpackage 1L and the second terminals 5 of the second subpackage 1U making up the plurality of pairs of first and second terminals in the specific relative positional relationship are different from those in the reference relative positional relationship. In the example shown in FIG. 1, the second subpackage 1U is displaced in the direction from the side surface 2c of the main body 2 toward the side surface 2d of the main body 2, with respect to the reference relative positional relationship. It should be noted that the specific relative positional relationship may be such that the second subpackage 1U is displaced in the direction from the side surface 2d toward the side surface 2c, with respect to the reference relative positional relationship.

When in the specific relative positional relationship shown in FIG. 1, the plurality of pairs of first and second terminals, each of which is made up of one of the first terminals 4 of the first subpackage 1L and one of the second terminals 5 of the second subpackage 1U that are in contact with each other and electrically connected to each other, are as follows: (4C21, 5C11), (4C22, 5C12), (4C23, 5C13), (4C24, 5C14), (4R21, 5R11), (4R22, 5R12), (4R23, 5R13), (4R24, 5R14), (4R25, 5R15), (4R26, 5R16), (4R27, 5R17), and (4R28, 5R18).

When in a not-shown specific relative positional relationship where the second subpackage 1U is displaced in the direction from the side surface 2d toward the side surface 2c with respect to the reference relative positional relationship, the terminals 5C21 to 5C24, 5R21 to 5R28, and 7A1 to 7A4 of the second subpackage 1U are in contact with and electrically connected to the terminals 4C11 to 4C14, 4R11 to 4R18, and 6A1 to 6A4 of the first subpackage 1L.

Because of the shape and arrangement of the terminals 6A1 to 6A4 and 7A1 to 7A4 described above, there are formed a plurality of pairs of terminals (6A1, 7A1), (6A2, 7A2), (6A3, 7A3), and (6A4, 7A4) in each of which the two terminals are in contact with and electrically connected to each other, across the terminals 6A1 to 6A4 of the first subpackage 1L and the terminals 7A1 to 7A4 of the second subpackage 1U regardless of whether in the reference relative positional relationship or the specific relative positional relationship.

Figure 8:
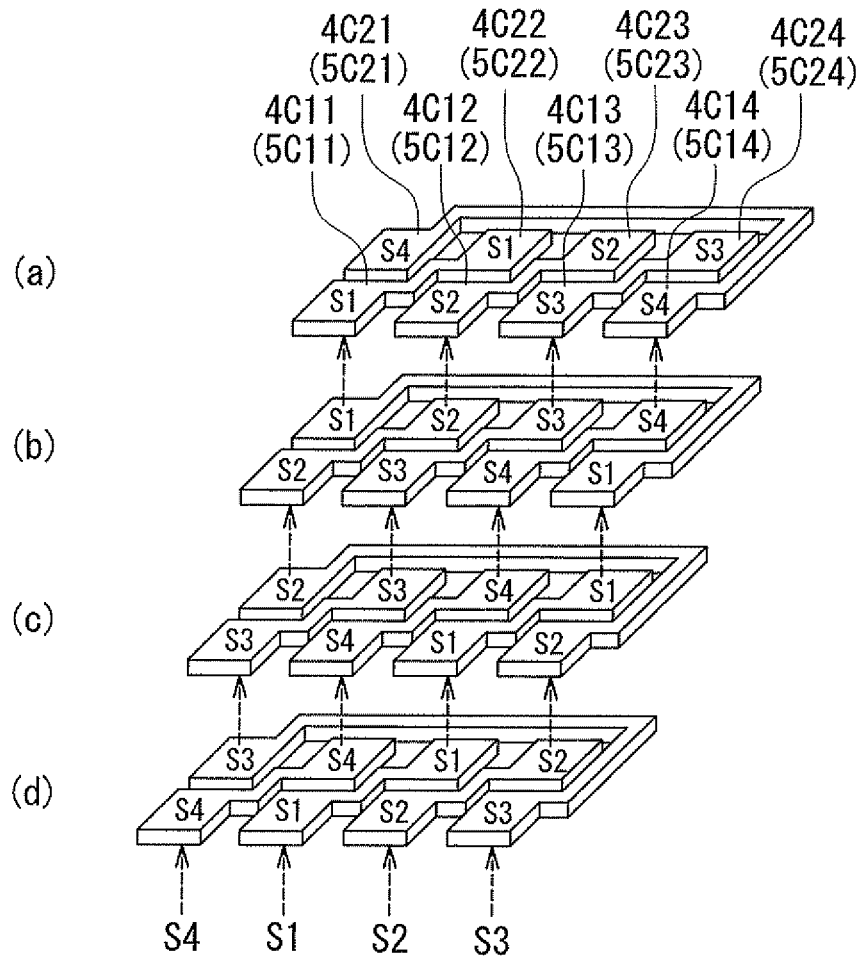
FIG. 8 is an explanatory diagram showing the flow of a plurality of signals in the composite layered chip package shown in FIG. 1.
Figure 9:
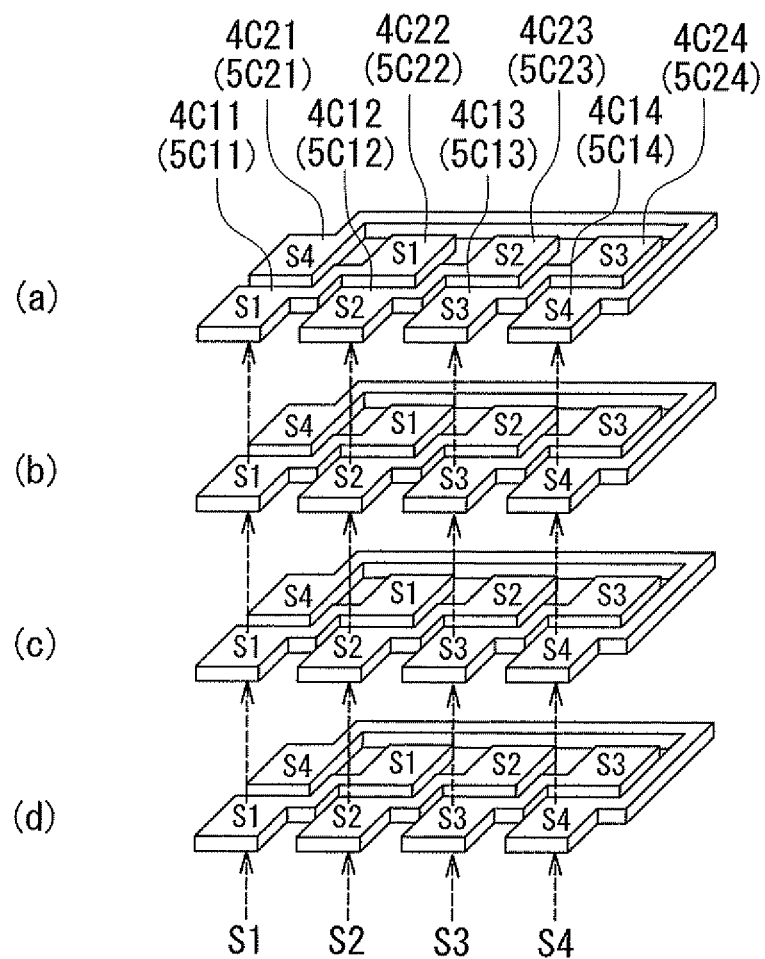
FIG. 9 is an explanatory diagram showing the flow of a plurality of signals in the composite layered chip package shown in FIG. 2.

Next, the flow of a plurality of signals in the composite layered chip package 21 shown in FIG. 1 and the composite layered chip package 22 shown in FIG. 2 will be described. FIG. 8 is an explanatory diagram showing the flow of a plurality of signals in the composite layered chip package 21 shown in FIG. 1. FIG. 9 is an explanatory diagram showing the flow of a plurality of signals in the composite layered chip package 22 shown in FIG. 2.

Portions (a), (b), (c), and (d) of FIG. 8 show the terminals 4C11 to 4C14, 4C21 to 4C24, 5C11 to 5C14, and 5C21 to 5C24 in the subpackages 1A, 1B, 1C, and 1D of the composite layered chip package 21 shown in FIG. 1 and signals to appear thereon. Portions (a), (b), (c), and (d) of FIG. 9 show the terminals 4C11 to 4C14, 4C21 to 4C24, 5C11 to 5C14, and 5C21 to 5C24 in the subpackages 1A, 1B, 1C, and 1D of the composite layered chip package 22 shown in FIG. 2 and signals to appear thereon. Symbols S1, S2, S3, and S4 in FIG. 8 and FIG. 9 represent respective signals.

In each subpackage 1S, the same signal appears on a plurality of terminals that are electrically connected to each other. More specifically, the signals to appear on the terminals 4C21, 4C22, 4C23, and 4C24 are the same as those on the terminals 4C14, 4C11, 4C12, and 4C13, respectively. The signals to appear on the terminals 5C21, 5C22, 5C23, and 5C24 are the same as those on the terminals 5C14, 5C11, 5C12, and 5C13, respectively. The signals to appear on the terminals 5C11 to 5C14 and 5C21 to 5C24 are the same as those on the terminals 4C11 to 4C14 and 4C21 to 4C24, respectively.

FIG. 8 shows an example where the signals S4, 51, S2, and S3 are supplied to the terminals 5C11, 5C12, 5C13, and 5C14 of the subpackage 1D as shown in portion (d) of FIG. 8. In this case, in the subpackage 1D, the signals S4, S1, S2, and S3 appear on the terminals 4C11, 4C12, 4C13, and 4C14, respectively, while the signals S3, S4, 51, and S2 appear on the terminals 4C21, 4C22, 4C23, and 4C24, respectively.

When in the specific relative positional relationship shown in FIG. 1, the terminals 5C11, 5C12, 5C13, and 5C14 of the subpackage 1C are in contact with the terminals 4C21, 4C22, 4C23, and 4C24 of the subpackage 1D. Consequently, in the subpackage 10, as shown in portion (c) of FIG. 8, the signals S3, S4, S1, and S2 are transmitted to the terminals 5C11, 5C12, 5C13, and 5C14. As a result, the signals S3, S4, S1, and S2 appear on the terminals 4C11, 4C12, 4C13, and 4C14, respectively, while the signals S2, S3, S4, and S1 appear on the terminals 4C21, 4C22, 4C23, and 4C24, respectively.

In the subpackage 1B, as shown in portion (b) of FIG. 8, the signals S2, S3, S4, and S1 are transmitted to the terminals 5C11, 5C12, 5C13, and 5C14. As a result, the signals S2, S3, S4, and S1 appear on the terminals 4C11, 4C12, 4C13, and 4C14, respectively, while the signals S1, S2, S3, and S4 appear on the terminals 4C21, 4C22, 4C23, and 4C24, respectively.

In the subpackage 1A, as shown in portion (a) of FIG. 8, the signals S1, S2, S3, and S4 are transmitted to the terminals 5C11, 5C12, 5C13, and 5C14. As a result, the signals S1, S2, S3, and S4 appear on the terminals 4C11, 4C12, 4C13, and 4C14, respectively, while the signals S4, S1, S2, and S3 appear on the terminals 4C21, 4C22, 4C23, and 4C24, respectively.

In each of the layer portions 10S1 and 10S2, the terminals 4C11 and 5C11 are electrically connected to the semiconductor chip 30 through the wire WC1 and the electrode 32D1. As described above, when in the specific relative positional relationship shown in FIG. 1, the signal to appear on the terminals 4C11 and 5C11 varies from one subpackage 1S to another. Consequently, in the composite layered chip package 21 shown in FIG. 1, the signals associated with the semiconductor chips 30 of the respective corresponding layers of different subpackages 1S through the wire WC1 and the electrodes 32D1 can be varied from one subpackage is to another. In the example shown in FIG. 8, the signal associated with the semiconductor chips 30 of the layer portions 10S1 and 10S2 through the wire WC1 and the electrodes 32D1 in the subpackage 1A is the signal S1. The signal S2 is associated in the subpackage 1B, the signal S3 in the subpackage 1C, and the signal S4 in the subpackage 1D.

On the other hand, when in the reference relative positional relationship shown in FIG. 2, the signals to appear on the terminals 4C11 to 4C14, 4C21 to 4C24, 5C11 to 5C14, and 5C21 to 5C24 do not vary from one subpackage 1S to another as shown in FIG. 9. FIG. 9 shows an example where the signals S1, S2, S3, and S4 are supplied to the terminals 5C11, 5C12, 5C13, and 5C14 of the subpackage 1D. In the composite layered chip package 22 shown in FIG. 2, the same signals are associated with the semiconductor chips 30 of the respective corresponding layers in all the subpackages 1A to 1D, through the wire WC1 and the electrodes 32D1.

The mode of signal flow described with reference to FIG. 8 and FIG. 9 also applies to the group of terminals 4R11 to 4R14, 4R21 to 4R24, 5R11 to 5R14, and 5R21 to 5R24, and the group of terminals 4R15 to 4R18, 4R25 to 4R28, 5R15 to 5R18, and 5R25 to 5R28.

For the composite layered chip package 21 shown in FIG. 1, suppose a case where signals S4, 51, S2, and S3 are associated with the terminals 5R11 to 5R14 of the subpackage 1D, respectively. In this case, the signal associated with the semiconductor chip 30 of the layer portion 10S1 through the wire WR1 and the electrode 32D2 in the subpackage 1A is the signal S1. The signal S2 is associated in the subpackage 1B, the signal S3 in the subpackage 1C, and the signal S4 in the subpackage 1D. On the other hand, in the composite layered chip package 22 shown in FIG. 2, the signal associated with the semiconductor chip 30 of the layer portion 10S1 through the wire WR1 and the electrode 32D2 is the same among all the subpackages 1A to 1D.

For the composite layered chip package 21 shown in FIG. 1, suppose also a case where signals S4, S1, S2, and S3 are associated with the terminals 5R15 to 5R18 of the subpackage 1D, respectively. In this case, the signal associated with the semiconductor chip 30 of the layer portion 10S2 through the wire WR5 and the electrode 32D2 in the subpackage 1A is the signal S1. The signal S2 is associated in the subpackage 1B, the signal S3 in the subpackage 1C, and the signal S4 in the subpackage 1D. On the other hand, in the composite layered chip package 22 shown in FIG. 2, the signal associated with the semiconductor chip 30 of the layer portion 10S2 through the wire WR5 and the electrode 32D2 is the same among all the subpackages 1A to 1D.

In the present embodiment, a plurality of subpackages 1S of the same configuration are arranged in the specific relative positional relationship shown in FIG. 1 to construct the composite layered chip package 21. This makes it possible that some of a plurality of signals associated with one or more semiconductor chips 30 in the subpackages 1S are varied from one subpackage 1S to another easily.

Figure 10:
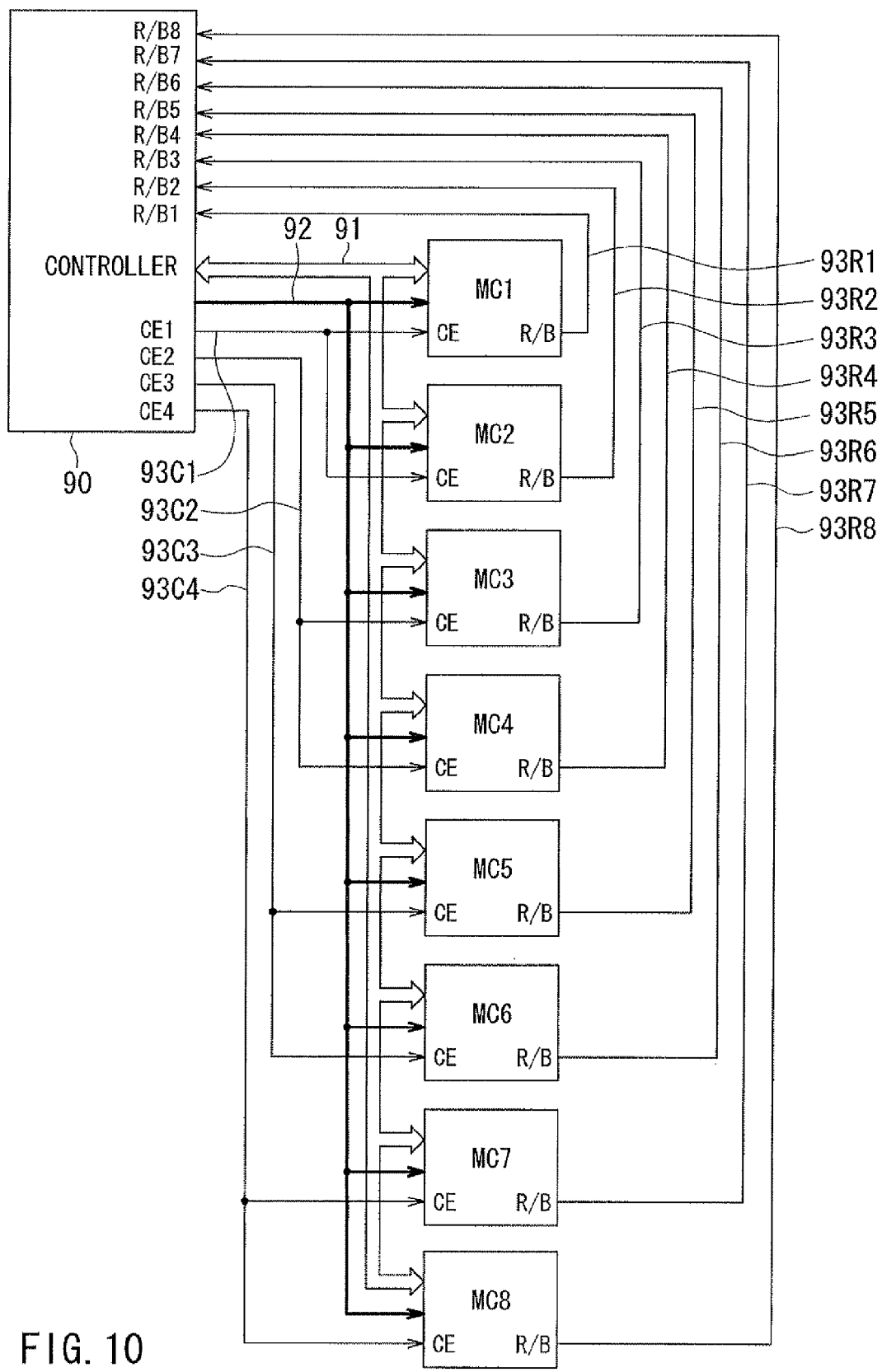
FIG. 10 is a block diagram showing the configuration of a memory device that uses the composite layered chip package according to the first embodiment of the invention.

The composite layered chip package 21 according to the present embodiment will now be described in more detail with reference to a case where the composite layered chip package 21 is used to construct a memory device. FIG. 10 is a block diagram showing the configuration of the memory device that uses the composite layered chip package 21 according to the present embodiment. The memory device includes eight memory chips MC1, MC2, MC3, MC4, MC5, MC6, MC7, and MC8, and a controller 90 which controls these memory chips.

The memory chips MC1, MC2, MC3, MC4, MC5, MC6, MC7, and MC8 are the respective semiconductor chips 30 in the layer portions 10S1 and 10S2 of the subpackage 1A, the layer portions 10S1 and 10S2 of the subpackage 1B, the layer portions 10S1 and 10S2 of the subpackage 1C, and the layer portions 10S1 and 10S2 of the subpackage 1D, which are shown in FIG. 1. Each of the memory chips includes a plurality of memory cells and a peripheral circuit such as an address decoder. The controller 90 is provided independent of the composite layered chip package 21, and is electrically connected to the plurality of terminals 4 and 6 of the subpackage 1A or the plurality of terminals 5 and 7 of the subpackage 1D.

The memory device further includes a data bus 91 which electrically connects the controller 90 to the eight memory chips, and one or more common lines 92 which electrically connect the controller 90 to the eight memory chips. Each of the eight memory chips includes a plurality of electrode pads to which the data bus 91 is electrically connected, and one or more electrode pads to which the one or more common lines 92 are electrically connected. The data bus 91 transmits addresses, commands, data, etc. The one or more common lines 92 include power lines as well as signal lines for transmitting signals that are other than those transmitted by the data bus 91 and are used in common by the eight memory chips.

Each of the eight memory chips further includes an electrode pad CE for receiving a chip enable signal and an electrode pad RB for outputting a ready/busy signal. The chip enable signal is a signal for controlling whether to select or deselect the memory chip. The ready/busy signal is a signal for indicating the operating state of the memory chip.

The memory device shown in FIG. 10 further includes signal lines 93C1, 93C2, 93C3, and 93C4. The signal line 93C1 electrically connects the controller 90 to the electrode pads CE of the memory chips MC1 and MC2, and transmits a chip enable signal CE1. The signal line 93C2 electrically connects the controller 90 to the electrode pads CE of the memory chips MC3 and MC4, and transmits a chip enable signal CE2. The signal line 93C3 electrically connects the controller 90 to the electrode pads CE of the memory chips MC5 and MC6, and transmits a chip enable signal CE3. The signal line 93C4 electrically connects the controller 90 to the electrode pads CE of the memory chips MC7 and MC8, and transmits a chip enable signal CE4. Thus, in the example shown in FIG. 10, the signal line 93C1 is used by the memory chips MC1 and MC2 in common, the signal line 93C2 is used by the memory chips MC3 and MC4 in common, the signal line 93C3 is used by the memory chips MC5 and MC6 in common, and the signal line 93C4 is used by the memory chips MC7 and MC8 in common. Nevertheless, eight signal lines for transmitting respective different chip enable signals to the memory chips may be provided instead of the signal lines 93C1, 93C2, 93C3, and 93C4.

The memory device shown in FIG. 10 further includes signal lines 93R1, 93R2, 93R3, 93R4, 93R5, 93R6, 93R7, and 93R8. One end of each of the signal lines 93R1 to 93R8 is electrically connected to the controller 90. The other ends of the signal lines 93R1 to 93R8 are electrically connected to the electrode pads R/B of the memory chips MC1 to MC8, respectively. The signal lines 93R1 to 93R8 transmit ready/busy signals R/B1 to R/B8, respectively.

Now, a description will be made as to the flow of a plurality of signals for the case where the composite layered chip package 21 shown in FIG. 1 is used to construct the memory device shown in FIG. 10. In the subpackages 1A to 1D of the composite layered chip package 21 shown in FIG. 1, the terminals 6A1 and 7A1 are electrically connected to the wire WA1, the terminals 6A2 and 7A2 are electrically connected to the wire WA2, the terminals 6A3 and 7A3 are electrically connected to the wire WA3, and the terminals 6A4 and 7A4 are electrically connected to the wire WA4. As a result, there are formed a plurality of electrical paths that lead from the terminals 6A1-6A4 of the subpackage 1A to the terminals 7A1-7A4 of the subpackage 1D. The plurality of electrical paths constitute parts of the data bus 91 and the one or more common lines 92.

The chip enable signal CE1 is supplied to the terminal 4C11 of the subpackage 1A or the terminal 5C12 of the subpackage 1D. The chip enable signal CE2 is supplied to the terminal 4C12 of the subpackage 1A or the terminal 5C13 of the subpackage 1D. The chip enable signal CE3 is supplied to the terminal 4C13 of the subpackage 1A or the terminal 5C14 of the subpackage 1D. The chip enable signal CE4 is supplied to the terminal 4C14 of the subpackage 1A or the terminal 5C11 of the subpackage 1D.

The chip enable signals CE1, CE2, CE3, and CE4 correspond to the signals S1, S2, S3, and S4 in FIG. 8, respectively. As can be seen from the description that has been made with reference to FIG. 8, in the composite layered chip package 21, the chip enable signal CE1 is supplied only to the semiconductor chips 30 of the layer portions 10S1 and 10S2 of the subpackage 1A, i.e., the memory chips MC1 and MC2. Likewise, the chip enable signal CE2 is supplied only to the semiconductor chips 30 of the layer portions 10S1 and 10S2 of the subpackage 1B, i.e., the memory chips MC3 and MC4. The chip enable signal CE3 is supplied only to the semiconductor chips 30 of the layer portions 10S1 and 10S2 of the subpackage 1C, i.e., the memory chips MC5 and MC6. The chip enable signal CE4 is supplied only to the semiconductor chips 30 of the layer portions 10S1 and 10S2 of the subpackage 1D, i.e., the memory chips MC7 and MC8.

The semiconductor chip 30 outputs a ready/busy signal from the electrode 32D2. In the layer portion 10S1 of the subpackage 1A, the ready/busy signal R/B1 is output from the electrode 32D2. The signal R/B1 is transmitted to the wire WR1 of the subpackage 1A and is output from the terminal 4R11 of the subpackage 1A or the terminal 5R12 of the subpackage 1D. In the layer portion 10S2 of the subpackage 1A, the ready/busy signal R/B2 is output from the electrode 32D2. The signal R/B2 is transmitted to the wire WR5 of the subpackage 1A and is output from the terminal 4R15 of the subpackage 1A or the terminal 5R16 of the subpackage 1D.

In the layer portion 10S1 of the subpackage 1B, the ready/busy signal R/B3 is output from the electrode 32D2. The signal R/B3 is transmitted to the wire WR1 of the subpackage 1B and is output from the terminal 4R12 of the subpackage 1A or the terminal 5R13 of the subpackage 1D. In the layer portion 10S2 of the subpackage 1B, the ready/busy signal R/B4 is output from the electrode 32D2. The signal R/B4 is transmitted to the wire WR5 of the subpackage 1B and is output from the terminal 4R16 of the subpackage 1A or the terminal 5R17 of the subpackage 1D.

In the layer portion 10S1 of the subpackage 1C, the ready/busy signal R/B5 is output from the electrode 32D2. The signal R/B5 is transmitted to the wire WR1 of the subpackage 1C and is output from the terminal 4R13 of the subpackage 1A or the terminal 5R14 of the subpackage 1D. In the layer portion 10S2 of the subpackage 1C, the ready/busy signal R/B6 is output from the electrode 32D2. The signal R/B6 is transmitted to the wire WR5 of the subpackage 1C and is output from the terminal 4R17 of the subpackage 1A or the terminal 5R18 of the subpackage 1D.

In the layer portion 10S1 of the subpackage 1D, the ready/busy signal R/B7 is output from the electrode 32D2. The signal R/B7 is transmitted to the wire WR1 of the subpackage 1D and is output from the terminal 4R14 of the subpackage 1A or the terminal 5R11 of the subpackage 1D. In the layer portion 10S2 of the subpackage 1D, the ready/busy signal R/B8 is output from the electrode 32D2. The signal R/B8 is transmitted to the wire WR5 of the subpackage 1D and is output from the terminal 4R18 of the subpackage 1A or the terminal 5R15 of the subpackage 1D.

As has been described, according to the composite layered chip package 21 shown in FIG. 1, the chip enable signals or ready/busy signals associated with the semiconductor chips 30 (memory chips) in the respective corresponding layers of the subpackages 1A to 1D of the same configuration can easily be varied between the subpackages 1A to 1D.

Figure 11:
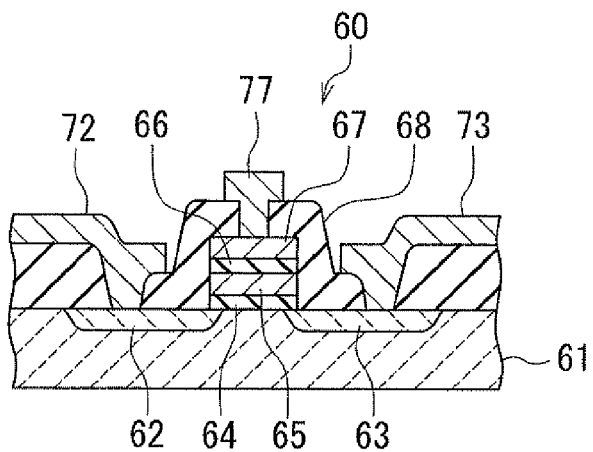
FIG. 11 is a cross-sectional view showing an example of a memory cell included in a semiconductor chip.

Reference is now made to FIG. 11 to describe an example of the configuration of the memory cells included in the semiconductor chip 30 (memory chip). The memory cell 60 shown in FIG. 11 includes a source 62 and a drain 63 formed near a surface of a P-type silicon substrate 61. The source 62 and the drain 63 are both N-type regions. The source 62 and the drain 63 are disposed at a predetermined distance from each other so that a channel composed of a part of the P-type silicon substrate 61 is provided between the source 62 and the drain 63. The memory cell 40 further includes an insulating film 64, a floating gate 65, an insulating film 66, and a control gate 67 that are stacked in this order on the surface of the substrate 61 at the location between the source 62 and the drain 63. The memory cell 40 further includes an insulating layer 68 that covers the source 62, the drain 63, the insulating film 64, the floating gate 65, the insulating film 66 and the control gate 67. The insulating layer 68 has contact holes that open in the tops of the source 62, the drain 63 and the control gate 67, respectively. The memory cell 40 includes a source electrode 72, a drain electrode 73, and a control gate electrode 77 that are formed on the insulating layer 68 at locations above the source 62, the drain 63 and the control gate 67, respectively. The source electrode 72, the drain electrode 73 and the control gate electrode 77 are connected to the source 62, the drain 63 and the control gate 67, respectively, through the corresponding contact holes.

A description will now be given of a method of manufacturing the subpackage 1S, i.e., the stackable chip package according to the present embodiment. The method of manufacturing the subpackage 1S according to the embodiment is a method by which a plurality of subpackages 1S are manufactured. The method includes the step of fabricating a layered substructure by stacking a plurality of substructures and the step of producing a plurality of subpackages 1S from the layered substructure. Each of the plurality of substructures includes a plurality of preliminary layer portions that are arrayed. Each of the preliminary layer portions is to become any one of the layer portions 10 included in the main part 2M. The plurality of substructures are to be cut at the positions of boundaries between every adjacent preliminary layer portions.

Figure 12:
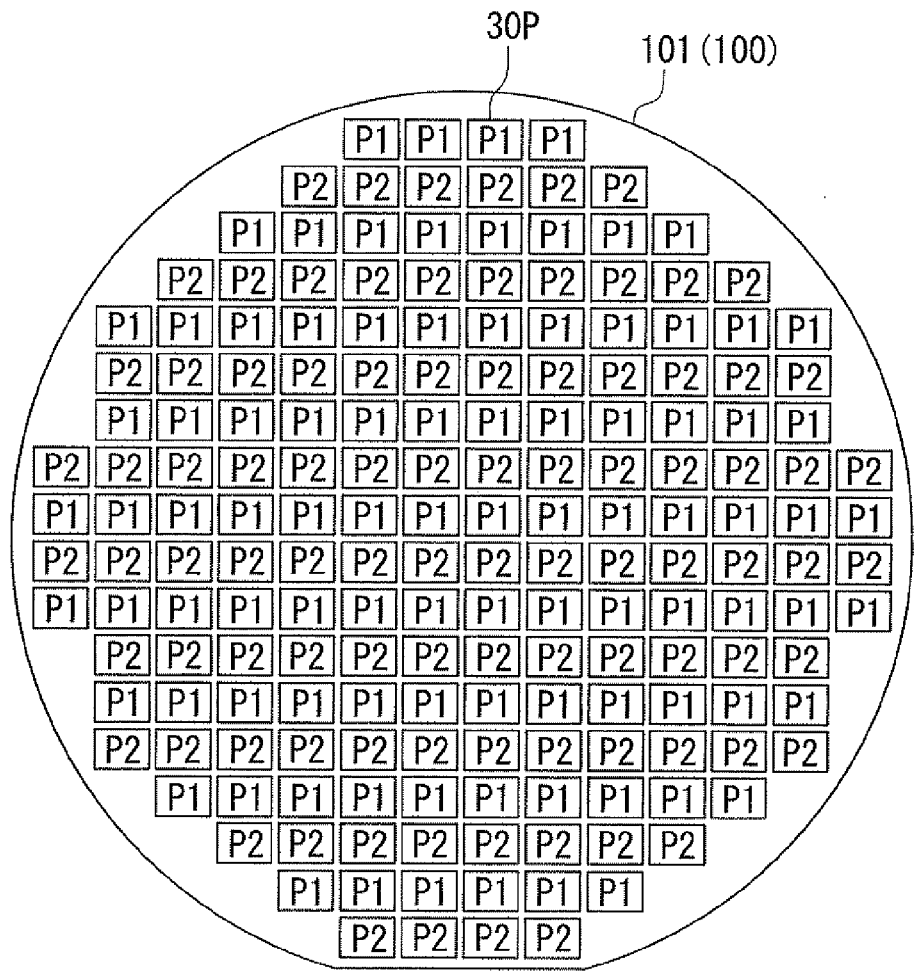
FIG. 12 is a plan view showing a pre-substructure wafer fabricated in a step of a method of manufacturing the stackable chip package according to the first embodiment of the invention.
Figure 13:
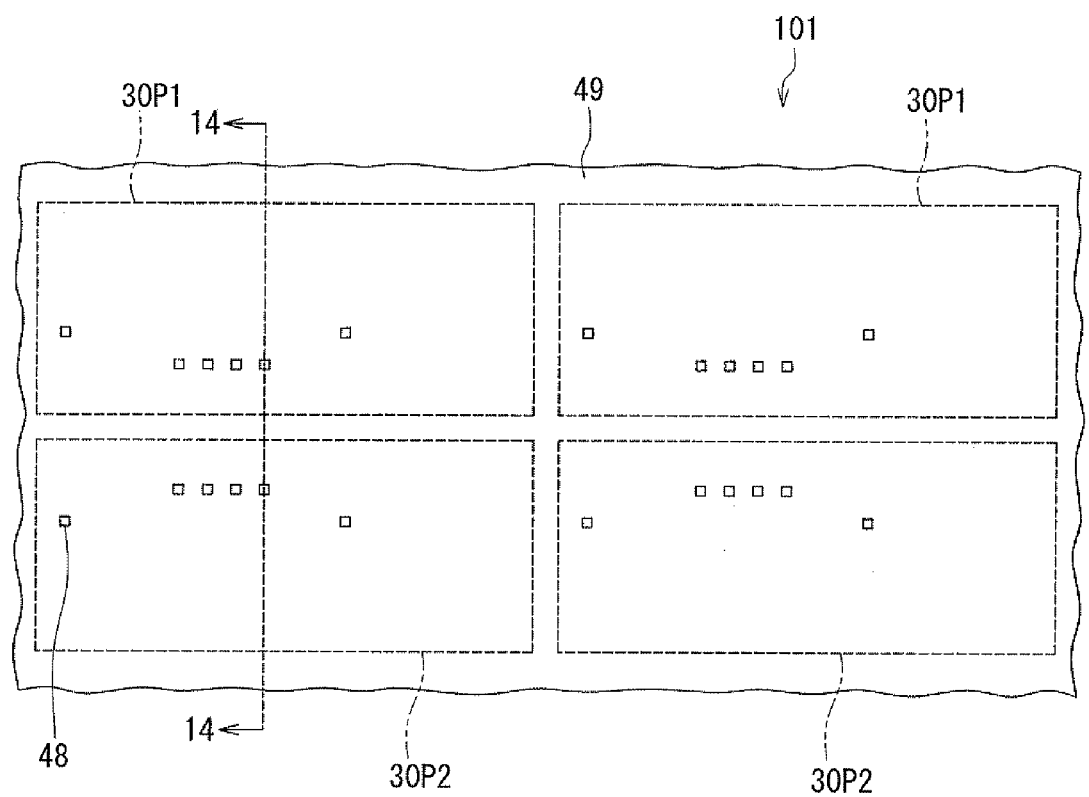
FIG. 13 is a magnified plan view of a part of the pre-substructure wafer shown in FIG. 12.
Figure 14:
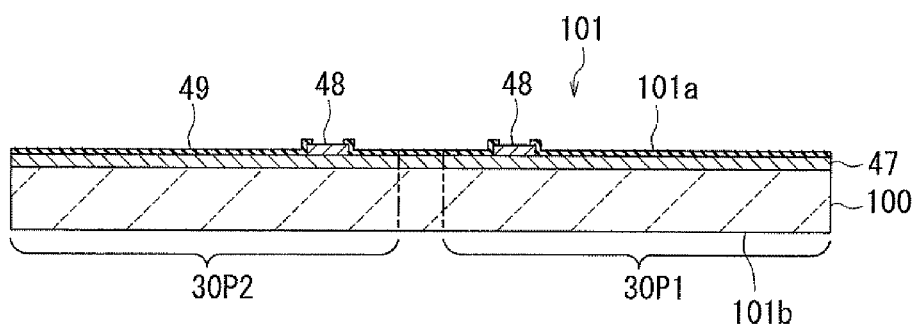
FIG. 14 shows a cross section taken along line 14-14 of FIG. 13.

The step of fabricating the layered substructure will now be described in detail with reference to FIG. 12 to FIG. 24. In the step of fabricating the layered substructure, a pre-substructure wafer 101 is fabricated first. The pre-substructure wafer 101 includes a plurality of pre-semiconductor-chip portions that are arrayed. The pre-semiconductor-chip portions are to become individual semiconductor chips 30. FIG. 12 is a plan view of the pre-substructure wafer 101. FIG. 13 is a magnified plan view of a part of the pre-substructure wafer 101 shown in FIG. 12. FIG. 14 shows a cross section taken along line 14-14 of FIG. 13.

Specifically, in the step of fabricating the pre-substructure wafer 101, the pre-substructure wafer 101 is fabricated by performing processing, such as a wafer process, on one of two mutually opposite surfaces of a semiconductor wafer 100. The plurality of pre-semiconductor-chip portions 30P, each of which includes a device, are arrayed in the pre-substructure wafer 101. In the pre-substructure wafer 101, the plurality of pre-semiconductor-chip portions 30P may be in a row, or in a plurality of rows such that a number of pre-semiconductor-chip portions 30P align both in vertical and horizontal directions. The following description assumes that the plurality of pre-semiconductor-chip portions 30P in the pre-substructure wafer 101 are in a plurality of rows such that a number of pre-semiconductor-chip portions 30P align both in vertical and horizontal directions. Hereinafter, pre-semiconductor-chip portions 30P that are to become the semiconductor chips 30 of the layer portions 10S1 and pre-semiconductor-chip portions 30P that are to become the semiconductor chips 30 of the layer portions 10S2 will be designated by reference symbols 30P1 and 30P2, respectively, when a distinction is needed.

According to the present embodiment, in particular, in the step of fabricating the pre-substructure wafer 101, the pre-substructure wafer 101 is fabricated such that the pre-semiconductor-chip portions 30P1 and the pre-semiconductor-chip portions 30P2 are arranged to alternate at least in one direction as shown in FIG. 12 to FIG. 14. In FIG. 12, the pre-semiconductor-chip portions 30P1 and 30P2 are represented by reference symbols P1 and P2, respectively. FIG. 12 shows an example where the pre-semiconductor-chip portions 30P1 and 30P2 are arranged to alternate only in the vertical direction. However, the pre-semiconductor-chip portions 30P1 and 30P2 may be arranged to alternate only in the horizontal direction, or both in the vertical and horizontal directions. Taking two symmetrical positions of the pre-substructure wafer 101 about a virtual line that passes the center in the direction of alternate arrangement of the pre-semiconductor-chip portions 30P1 and 30P2, a pre-semiconductor-chip portion 30P1 is arranged on one side and a pre-semiconductor-chip portion 30P2 on the other.

The semiconductor wafer 100 may be a silicon wafer, for example. The wafer process is a process in which a semiconductor wafer is processed into a plurality of devices yet to be separated into a plurality of chips. For ease of understanding, FIG. 12 depicts the pre-semiconductor-chip portions (P1 and P2) larger relative to the semiconductor wafer 100. For example, if the semiconductor wafer 100 is a 12-inch wafer and the top surface of each pre-semiconductor-chip portion 30 is 8 to 10 mm long at each side, then 700 to 900 pre-semiconductor-chip portions are obtainable from a single semiconductor wafer 100.

As shown in FIG. 14, the pre-semiconductor-chip portions 30P1 and 30P2 include a device-forming region 47 formed near one of the two surfaces of the semiconductor wafer 100. The device-forming region 47 is a region where devices are formed by processing the one of the two surfaces of the semiconductor wafer 100. The pre-semiconductor-chip portions 30P1 and 30P2 further include a plurality of electrode pads 48 disposed on the device-forming region 47, and a passivation film 49 disposed on the device-forming region 47. The passivation film 49 is made of an insulating material such as phospho-silicate-glass (PSG), silicon nitride, or polyimide resin. The passivation film 49 has a plurality of openings for exposing the top surfaces of the plurality of electrode pads 48. The plurality of electrode pads 48 are located in the positions corresponding to the plurality of electrodes to be formed later, and are electrically connected to the devices formed in the device-forming region 47. Hereinafter, the surface of the pre-substructure wafer 101 located closer to the plurality of electrode pads 48 and the passivation film 49 will be referred to as a first surface 101a, and the opposite surface will be referred to as a second surface 101b.

Figure 15:
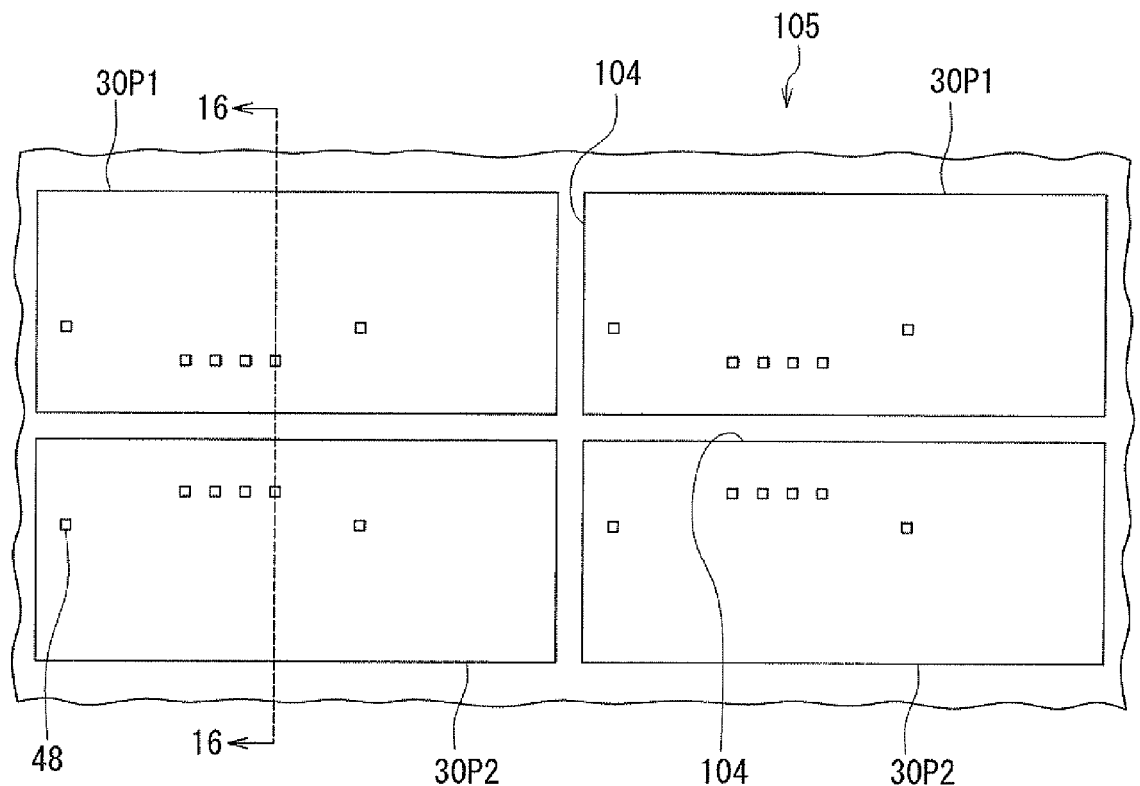
FIG. 15 is a plan view showing a step that follows the step shown in FIG. 13.
Figure 16:
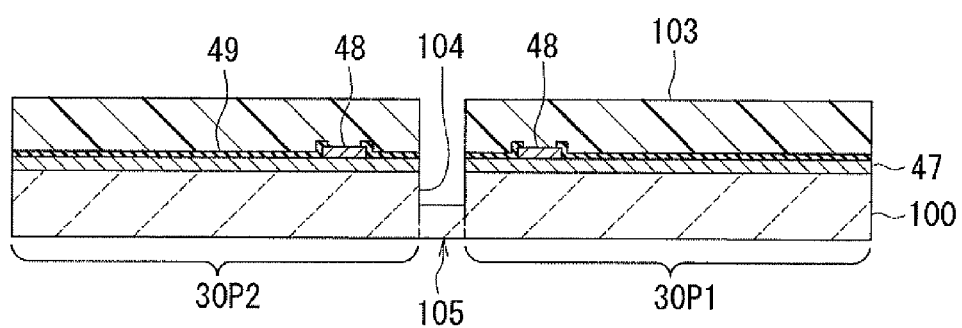
FIG. 16 shows a cross section taken along line 16-16 of FIG. 15.

FIG. 15 is a plan view showing a step that follows the step shown in FIG. 13. FIG. 16 shows a cross section taken along line 16-16 of FIG. 15. In this step, first, a protective layer 103 is formed to cover the first surface 101a of the pre-substructure wafer 101. The protective layer 103 is made of a photoresist, for example. Next, a plurality of grooves 104 that open in the first surface 101a of the pre-substructure wafer 101 are formed in the pre-substructure wafer 101 so as to define the respective areas of the plurality of pre-semiconductor-chip portions 30P1 and 30P2. Note that the protective layer 103 is not shown in FIG. 15.

In the positions of boundaries between every two adjacent pre-semiconductor-chip portions, the grooves 104 are formed to pass through the boundaries between every two adjacent pre-semiconductor-chip portions. The grooves 104 are formed such that their bottoms do not reach the second surface 101b of the pre-substructure wafer 101. The grooves 104 have a width in the range of 50 to 150 μm, for example. The grooves 104 have a depth in the range of 20 to 80 μm, for example.

The grooves 104 may be formed using a dicing saw or by performing etching, for example. The etching may be reactive ion etching or anisotropic wet etching using KOH as the etching solution, for example. When forming the grooves 104 by etching, an etching mask may be formed by patterning the protective layer 103 by photolithography. The protective layer 103 is removed after the grooves 104 are formed. As a result, there is formed a pre-polishing substructure main body 105 which is composed of the pre-substructure wafer 101 with the plurality of grooves 104 formed therein.

Figure 17:
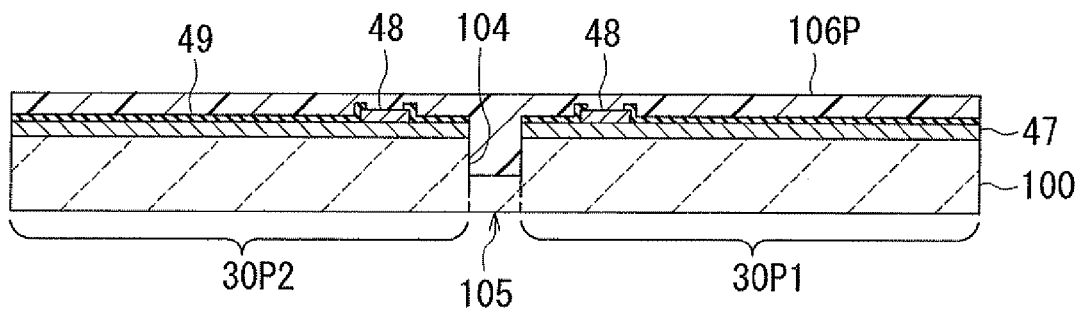
FIG. 17 is a cross-sectional view showing a step that follows the step shown in FIG. 16.

FIG. 17 shows a step that follows the step shown in FIG. 16. In this step, an insulating film 106P is formed to fill the plurality of grooves 104 of the pre-polishing substructure main body 105 and to cover the plurality of electrode pads 48 and the passivation film 49. The insulating film 106P is to later become part of the insulating portion 31. The insulating film 106P may be formed of a resin such as an epoxy resin or a polyimide resin. The insulating film 106P may also be formed of a photosensitive material such as a sensitizer-containing polyimide resin. The insulating film 106P may also be formed of an inorganic material such as silicon oxide or silicon nitride.

It is preferred that the insulating film 106P be formed of a resin having a low thermal expansion coefficient. If the insulating film 106P is formed of a resin having a low thermal expansion coefficient, it becomes easy to cut the insulating film 106P when it is cut later with a dicing saw.

The insulating film 106P is preferably transparent. If the insulating film 106P is transparent, alignment marks that are recognizable through the insulating film 106P can be formed on the insulating film 106P. Such alignment marks facilitates alignment of a plurality of substructures to be stacked.

The insulating film 106P may include a first layer that fills the plurality of grooves 104, and a second layer that covers the first layer, the electrode pads 48 and the passivation film 49. In such a case, the first layer and the second layer may be formed of the same material or different materials. The first layer is preferably formed of a resin having a low thermal expansion coefficient. The second layer may be formed of a photosensitive material such as a sensitizer-containing polyimide resin. The first layer may be flattened at the top by, for example, ashing or chemical mechanical polishing (CMP) before forming the second layer on the first layer.

Figure 18:
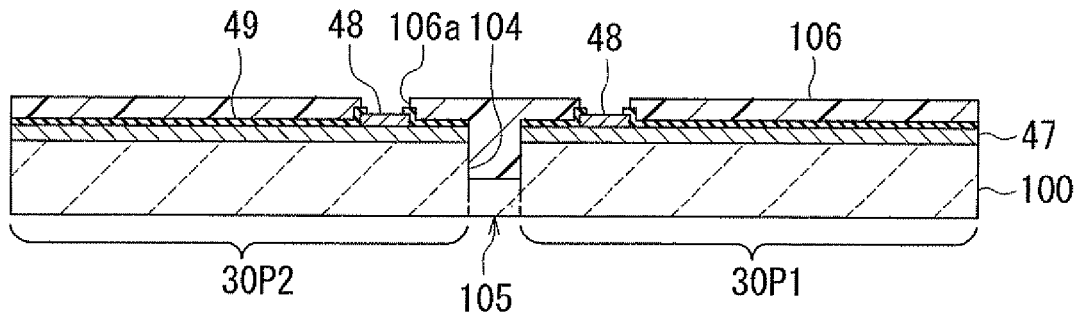
FIG. 18 is a cross-sectional view showing a step that follows the step shown in FIG. 17.

Reference is now made to FIG. 18 to describe the step of forming a plurality of openings in the insulating film 106P that are intended to expose the plurality of electrode pads 48. FIG. 18 shows a step that follows the step shown in FIG. 17. Here, a description will initially be given of a case where either the entire insulating film 106P or the second layer of the insulating film 106P is formed of a negative photosensitive material and photolithography is employed to form the openings in the insulating film 106P. In this example, first, all the pre-semiconductor-chip portions 30P1 and 30P2 are simultaneously subjected to the exposure of the insulating film 106P by using a mask (not shown). The mask has such a pattern that the areas of the insulating film 106P where to form the openings are not irradiated with light while the other areas are irradiated with light. The non-irradiated areas of the insulating film 106P are soluble in a developing solution, and the irradiated areas become insoluble in the developing solution.

Next, the insulating film 106P is developed with the developing solution. As a result, as shown in FIG. 18, a plurality of openings 106a for exposing the plurality of electrode pads 48 are formed in the insulating film 106P in each of the pre-semiconductor-chip portions 30P1 and 30P2. Having undergone the development, the insulating film 106P makes the insulating layer 106.

Now, an example of the method for forming the plurality of openings 106a in the insulating film 106P will be described for the case where either the entire insulating film 106P or the second layer of the insulating film 106P is formed of a non-photosensitive material. In this example, first, a negative photoresist layer is formed on the insulating film 106P. The photoresist layer is then exposed and developed by the same method as with the exposure and development of the insulating film 106P described above. As a result, a plurality of openings are formed in the photoresist layer at positions corresponding to the plurality of electrode pads 48. Next, the insulating film 106P is selectively etched by using the photoresist layer as the etching mask, whereby the plurality of openings 106a are formed in the insulating film 106P. The photoresist layer may be subsequently removed, or may be left and used as part of the insulating layer 106.

Figure 19:
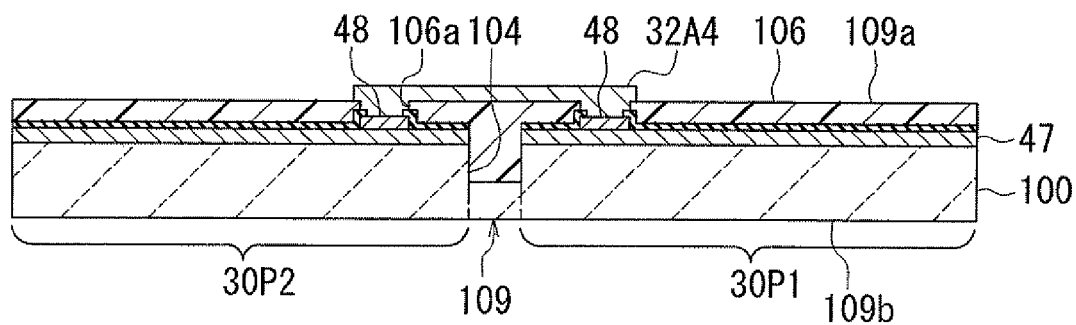
FIG. 19 is a cross-sectional view showing a step that follows the step shown in FIG. 18.
Figure 20:
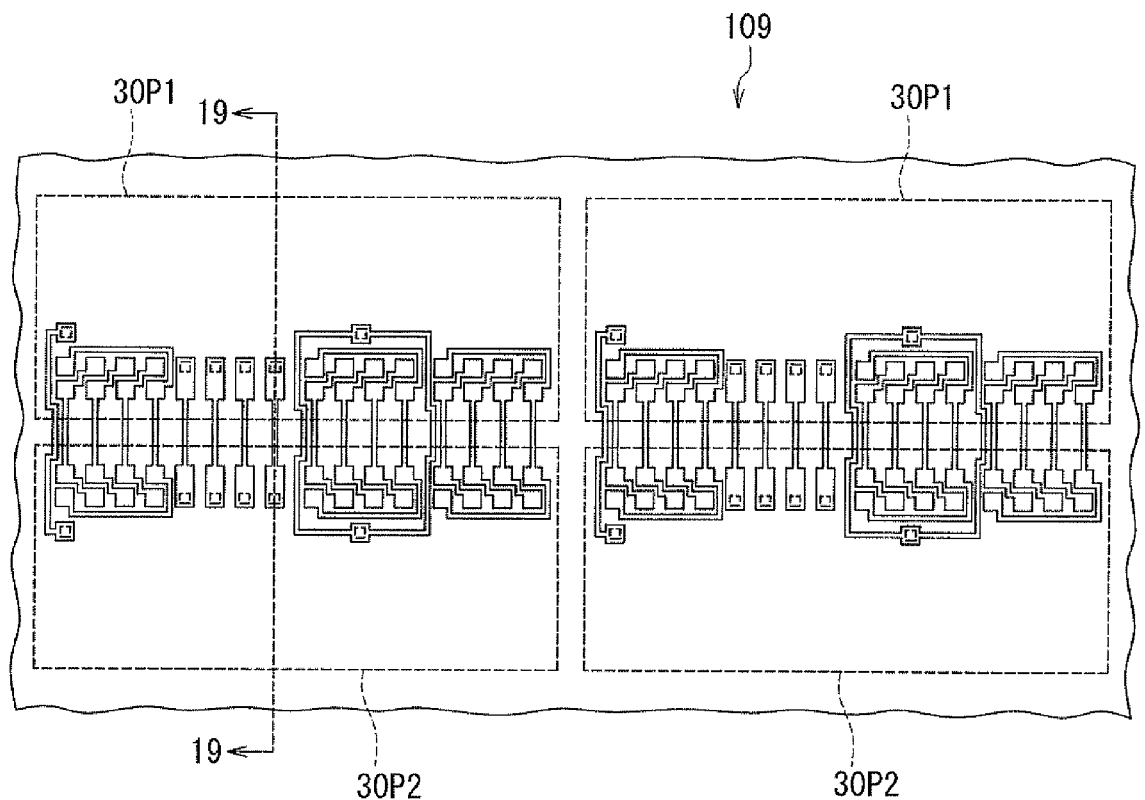
FIG. 20 is a plan view showing the step of FIG. 19.

FIG. 19 and FIG. 20 show a step that follows the step shown in FIG. 18. FIG. 19 shows a cross section taken along line 19-19 of FIG. 20. In this step, the plurality of electrodes are formed on the insulating layer 106 by plating, for example. Among the plurality of electrodes, the electrodes 32A1 to 32A4, 32D1, and 32D2 are in contact with and electrically connected to the respective corresponding electrode pads 48 through the plurality of openings 106a of the insulating layer 106. The plurality of electrodes other than the electrodes 32A1 to 32A4, 32D1, and 32D2 are in non-contact with the pre-semiconductor-chip portions 30P1 and 30P2.

In this way, there is fabricated a pre-polishing substructure 109 shown in FIG. 19 and FIG. 20. The pre-polishing substructure 109 has a first surface 109a corresponding to the first surface 101a of the pre-substructure wafer 101, and a second surface 109b corresponding to the second surface 101b of the pre-substructure wafer 101.

The electrodes are formed of a conductive material such as Cu. In the case of forming the electrodes by plating, a seed layer for plating is initially formed. Next, a photoresist layer is formed on the seed layer. The photoresist layer is then patterned by photolithography to form a frame that has a plurality of openings in which the electrodes are to be accommodated later. Next, plating layers that are intended to constitute respective portions of the electrodes are formed by plating on the seed layer in the openings of the frame. The plating layers have a thickness in the range of 5 to 15 μm, for example. Next, the frame is removed, and portions of the seed layer other than those lying under the plating layers are also removed by etching. The plating layers and the remaining portions of the seed layer under the plating layers thus form the electrodes.

Figure 21:
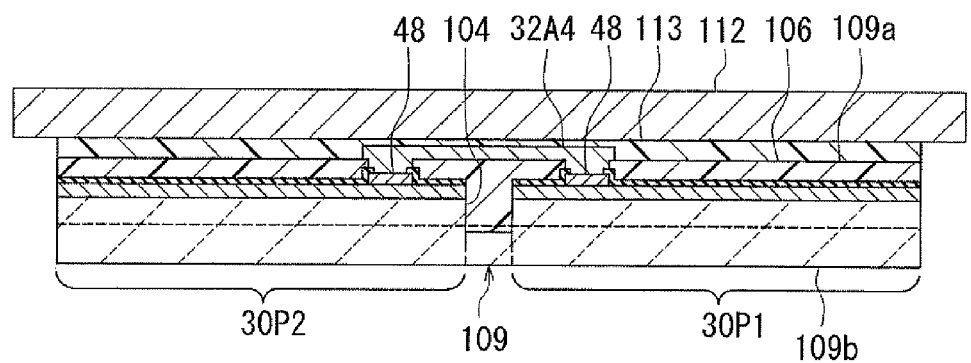
FIG. 21 is a cross-sectional view showing a step that follows the step shown in FIG. 19.

FIG. 21 shows a step that follows the step shown in FIG. 19. In this step, using an insulating adhesive, the pre-polishing substructure 109 is bonded to a plate-shaped jig 112 shown in FIG. 18, with the first surface 109a of the pre-polishing substructure 109 arranged to face a surface of the jig 112. In FIG. 21, the reference numeral 113 indicates an insulating layer formed by the adhesive. The insulating layer 113 is to become part of the insulating portion 31 later.

Figure 22:
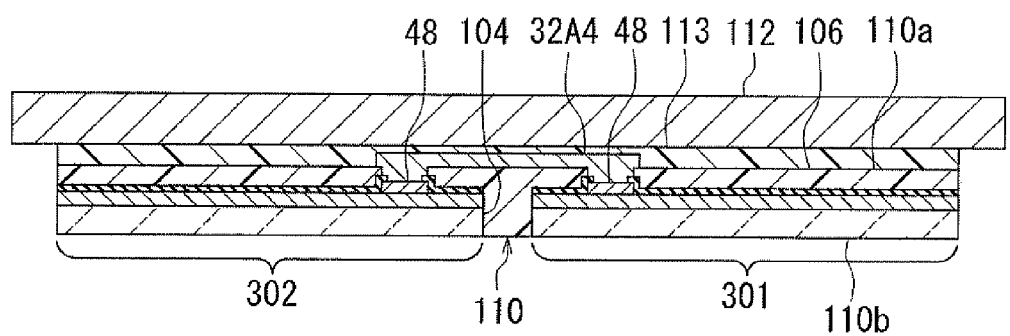
FIG. 22 is a cross-sectional view showing a step that follows the step shown in FIG. 21.

FIG. 22 shows a step that follows the step shown in FIG. 21. In this step, the second surface 109b of the pre-polishing substructure 109 is polished. The polishing is performed until the plurality of grooves 104 are exposed. The broken line in FIG. 21 indicates the level of the second surface 109b after the polishing. By polishing the second surface 109b of the pre-polishing substructure 109, the pre-polishing substructure 109 is reduced in thickness, and a substructure 110 bonded to the jig 112 is thereby formed. The substructure 110 is 20 to 80 μm thick, for example. The substructure 110 has a first surface 110a corresponding to the first surface 109a of the pre-polishing substructure 109, and a second surface 110b opposite to the first surface 110a. The second surface 110b is the polished surface. By polishing the second surface 109b of the pre-polishing substructure 109 until the plurality of grooves 104 are exposed, the plurality of pre-semiconductor-chip portions 30P1 and 30P2 are separated from each other into individual semiconductor chips 30. Hereinafter, the semiconductor chip 30 of the layer portion 10S1 and the semiconductor chip 30 of the layer portion 10S2 will be designated by reference numerals 301 and 302, respectively, when a distinction is needed. The first surface 110a of the substructure 110 corresponds to the first surface 30a of the semiconductor chip 30 shown in FIG. 7. The second surface 110b of the substructure 110 corresponds to the second surface 30b of the semiconductor chip 30 shown in FIG. 7.

Figure 23:
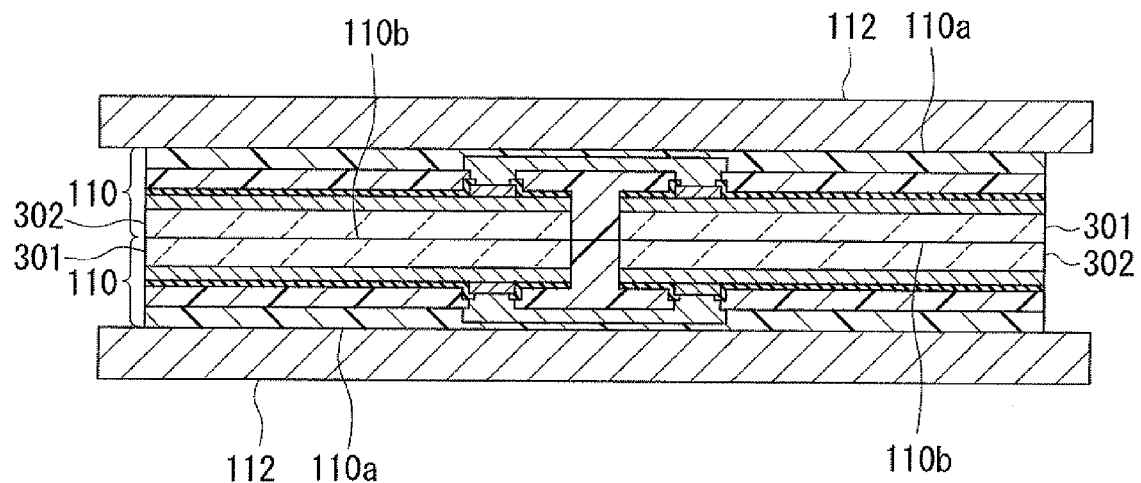
FIG. 23 is a cross-sectional view showing a step that follows the step shown in FIG. 22.

FIG. 23 shows a step that follows the step shown in FIG. 22. In this step, two substructures 110 bonded to the respective jigs 112 are bonded to each other with an insulating adhesive, with the respective second surfaces 110b arranged to face each other, whereby a stack of two substructures 110 is fabricated. The two substructures 110 are bonded to each other such that the semiconductor chip 301 and the semiconductor chip 302 are vertically laid over each other.

Figure 24:
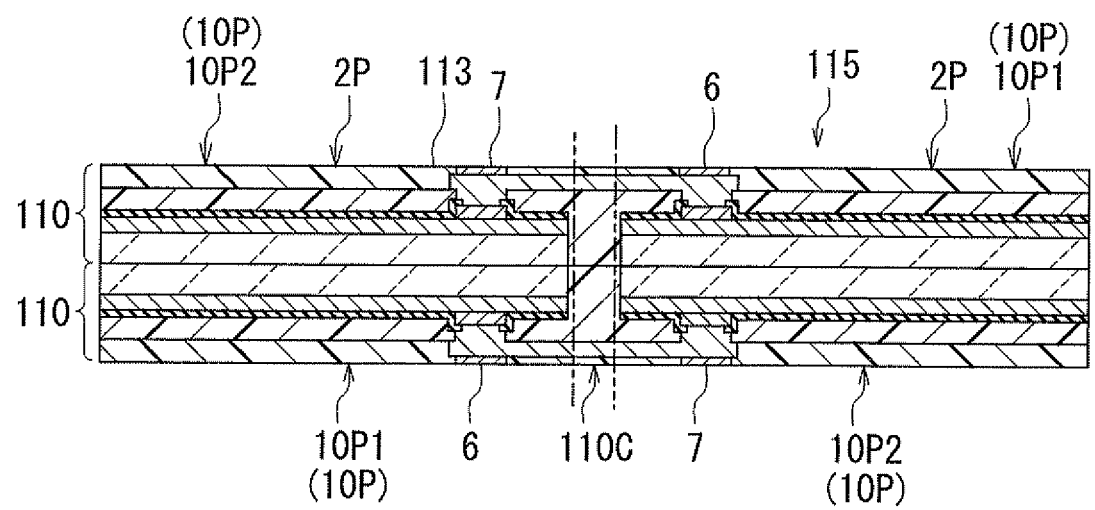
FIG. 24 is a cross-sectional view showing a part of a first layered substructure fabricated in a step that follows the step shown in FIG. 23.

FIG. 24 shows a step that follows the step shown in FIG. 23. In this step, first, the two jigs 112 are released from the stack of two substructures 110. Next, part of the insulating layer 113 of each substructure 110 is removed by, for example, etching, so that the terminal component parts of the plurality of electrodes are exposed to form a plurality of conductor pads. Next, a plurality of conductor layers are formed on the plurality of conductor pads, whereby the plurality of terminals 4, 5, 6, and 7 are formed.

At least either the terminals 4 and 6 or the terminals 5 and 7 may include a solder layer that is made of a solder material and exposed in the terminal surfaces. An example of the solder material is AuSn. The solder layer has a thickness in the range of 1 to 2 μm, for example. The solder layer is formed on the surface of each of the electrodes directly or via an underlayer by plating, for example.

AuSn is highly adhesive to Au. When either the terminals 4 and 6 or the terminals 5 and 7 include a solder layer made of AuSn, it is preferred that the other include an Au layer exposed in the terminal surfaces. The Au layer is formed by plating or sputtering, for example.

In this way, there is formed a first layered substructure 115 including two stacked substructures 110, as shown in FIG. 24. Each of the substructures 110 includes a plurality of preliminary layer portions 10P that are arrayed. Each of the preliminary layer portions 10P is to become any one of the layer portions 10 included in the main part 2M of the main body 2. The substructures 110 are to be cut later in the positions of the boundaries between every adjacent preliminary layer portions 10P. In FIG. 24, the reference symbol 110C indicates the cutting positions in the substructures 110.

Hereinafter, the preliminary layer portion 10P to be the layer portion 10S1 and the preliminary layer portion 10P to be the layer portion 10S2 will be designated by reference symbols 10P1 and 10P2, respectively, when a distinction is needed. The first layered substructure 115 includes a plurality of pre-separation main bodies 2P that are arrayed. The plurality of pre-separation main bodies 2P are to be separated from each other into individual main bodies 2 later. Each single pre-separation main body 2P includes a preliminary layer portion 10P1 and a preliminary layer portion 10P2.

Now, with reference to FIG. 25 to FIG. 28, a detailed description will be given of the step of producing a plurality of subpackages 1S by using the first layered substructure 115.

Figure 25:
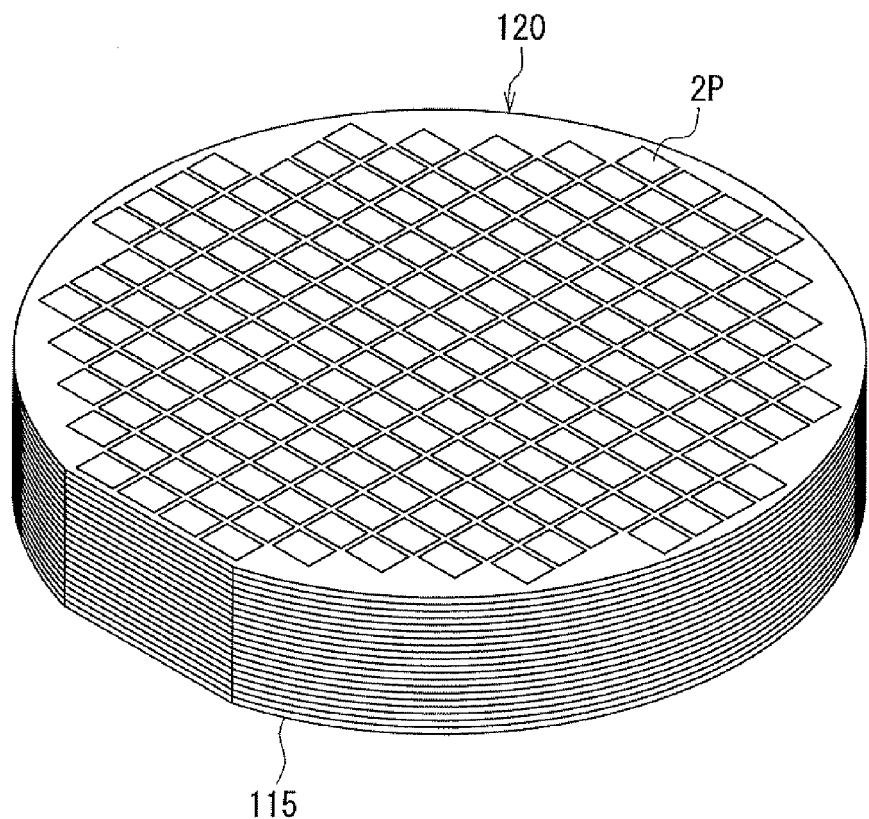
FIG. 25 is a perspective view showing a second layered substructure fabricated in a step that follows the step shown in FIG. 24.
Figure 26:
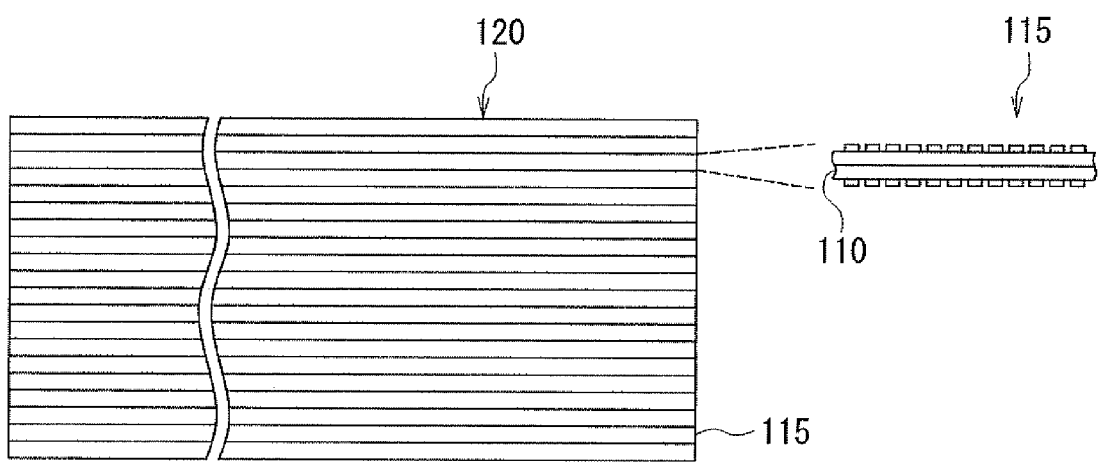
FIG. 26 is a side view of the second layered substructure shown in FIG. 25.

FIG. 25 and FIG. 26 show a step that follows the step shown in FIG. 24. In this step, a plurality of first layered substructures 115 are stacked on each other and every two vertically adjacent first layered substructures 115 are bonded to each other to fabricate a second layered substructure 120. FIG. 25 and FIG. 26 show an example where 20 first layered substructures 115 are stacked to fabricate the second layered substructure 120. Every two vertically adjacent first layered substructures 115 are bonded to each other with an adhesive so as to be easily detachable. In this example, as shown in FIG. 26, the second layered substructure 120 includes a stack of 20 first layered substructures 115, each of the first layered substructures 115 including a stack of two substructures 110. The second layered substructure 120 therefore includes a stack of 40 substructures 110. Suppose that each individual substructure 110 has a thickness of 50 μm. Ignoring the thickness of the adhesive that bonds the two substructures 110 to each other and the thickness of the adhesive that bonds every two vertically adjacent first layered substructures 115 to each other, the second layered substructure 120 has a thickness of 50 μm×40, i.e., 2 mm.

Figure 27:
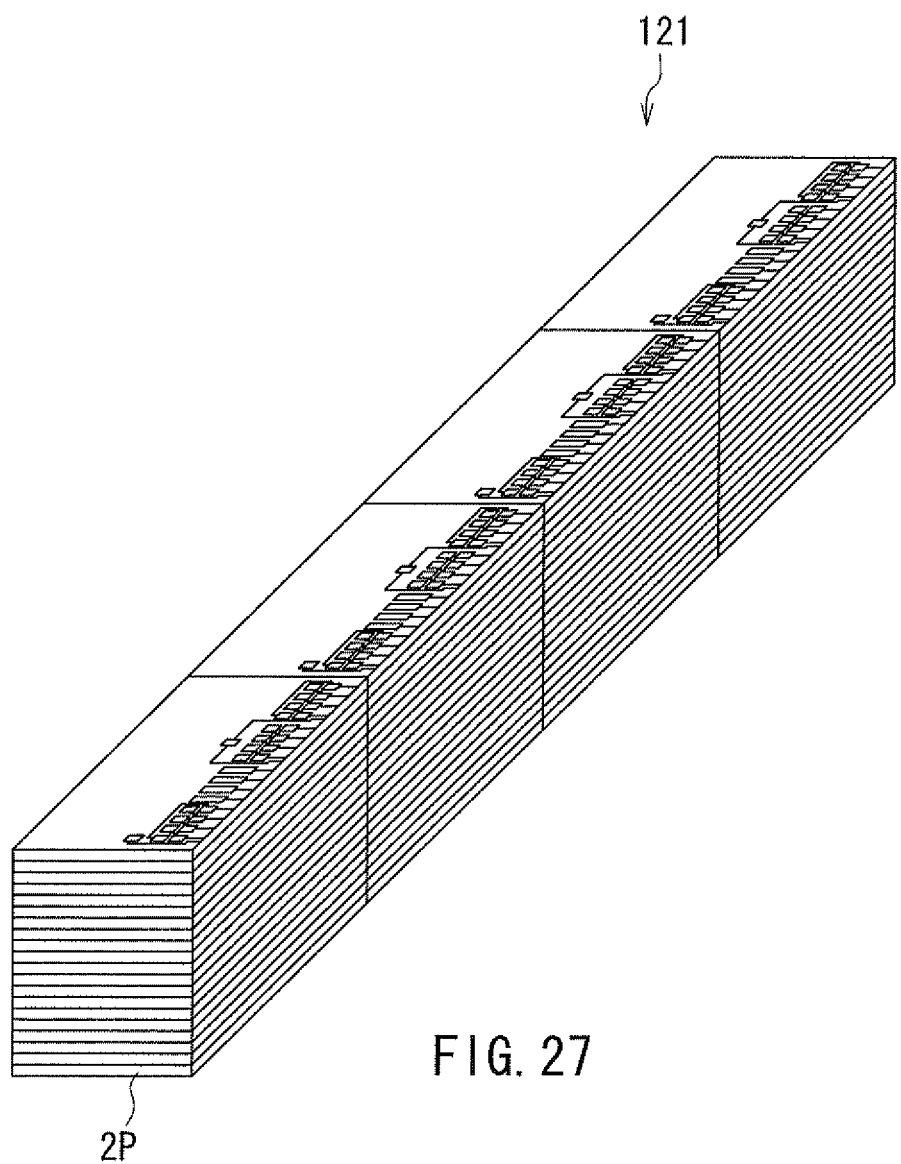
FIG. 27 is a perspective view showing an example of a block obtained by cutting the second layered substructure.

FIG. 27 shows a step that follows the step shown in FIG. 25 and FIG. 26. In this step, first, the second layered substructure 120 is cut into at least one block 121 in which a plurality of pre-separation main bodies 2P align both in the stacking direction of the first layered substructures 115 and a direction orthogonal to the stacking direction. FIG. 27 shows an example of the block 121. In the block 121 shown in FIG. 27, twenty pre-separation main bodies 2P align in the stacking direction of the first layered substructures 115, and four pre-separation main bodies 2P align in the direction orthogonal to the stacking direction of the first layered substructures 115. In this example, the block 121 includes eighty pre-separation main bodies 2P.

Next, the wiring 3 is simultaneously formed on all the pre-separation main bodies 2P included in the block 121. In the case of forming the wiring 3 by plating, a seed layer for plating is formed first. Then, a photoresist layer is formed on the seed layer and the photoresist layer is patterned by photolithography to form a frame having a plurality of openings in which a plurality of units of wiring 3 corresponding to the plurality of pre-separation main bodies 2P are to be accommodated later. Next, plating layers to constitute portions of the wiring 3 are formed by plating on the seed layer in the openings of the frame. The frame is then removed, and portions of the seed layer other than those lying under the plating layers are also removed by etching. The plating layers and the remaining portions of the seed layer under the plating layers thus form the wiring 3. The wiring 3 is formed for each of the pre-separation main bodies 2P.

Figure 28:
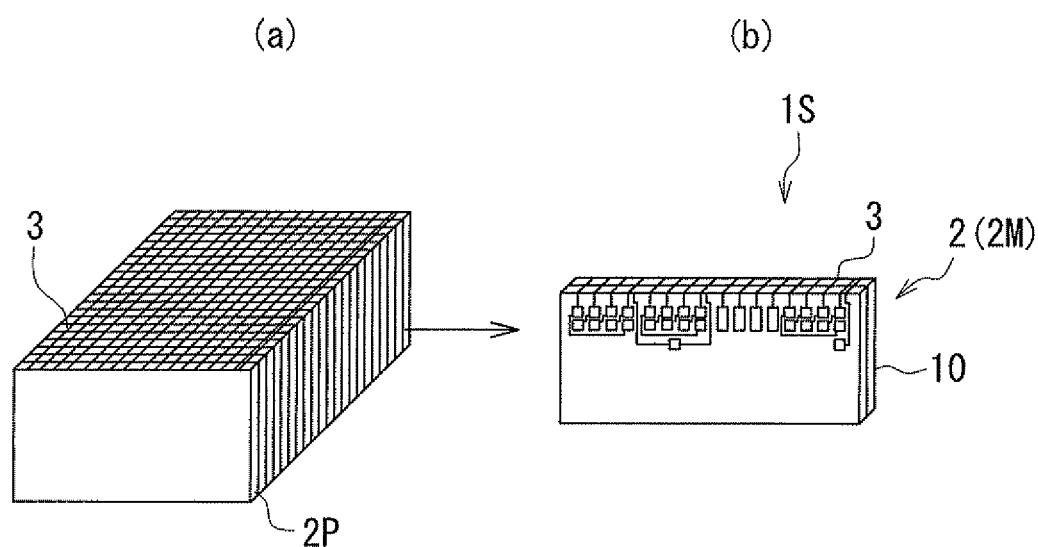
FIG. 28 is an explanatory diagram showing a step that follows the step shown in FIG. 27.

The process for forming the subpackages 1S then proceeds to the step of separating the plurality of pre-separation main bodies 2P, each of which has the wiring 3, from each other so that a plurality of subpackages 1S are produced. This step will be described with reference to FIG. 28. In this step, first, the block 121 is cut in the positions of the boundaries between every two pre-separation main bodies 2P that are adjacent to each other in the direction orthogonal to the stacking direction of the pre-separation main bodies 2P. This produces a plurality of stacks shown in portion (a) of FIG. 28. Each of the stacks includes a plurality of pre-separation main bodies 2P stacked on each other. In each of the stacks, every two adjacent pre-separation main bodies 2P are easily detachably bonded to each other by the adhesive that was used to bond every two vertically adjacent first layered substructures 115 when fabricating the second layered substructure 120 in the step shown in FIG. 25 and FIG. 26. Next, the plurality of pre-separation main bodies 2P included in the stack shown in portion (a) of FIG. 28 are separated from each other. This makes the pre-separation main bodies 2P into main bodies 2, and as a result, there are produced a plurality of subpackages 1S each of which includes the main body 2 and the wiring 3. Portion (b) of FIG. 28 shows one of the subpackages 1S.

A plurality of subpackages 1S are thus produced through the series of steps that have been described with reference to FIG. 12 to FIG. 28. So far the description has dealt with the case where the first layered substructure 115 including two substructures 110 as shown in FIG. 24 is used to produce a plurality of subpackages 1S each of which includes two layer portions 10. As will be described in relation to other embodiments, however, the number of the substructures 110 to be included in the first layered substructure 115 can be varied to produce subpackages 1S with different numbers of layer portions 10.

Now, a description will be made as to the effects of the composite layered chip package 21 and the stackable chip package (subpackage 1S) according to the present embodiment:

In the composite layered chip package 21 according to the present embodiment, the plurality of first and second terminals 4 and 5 of the subpackages 1S are shaped and arranged so that a plurality of pairs of first and second terminals 4 and 5 are formed regardless of whether in the reference relative positional relationship or the specific relative positional relationship, each of the plurality of pairs of first and second terminals 4 and 5 being made up of one of the plurality of first terminals 4 of the first subpackage 1L and one of the plurality of second terminals 5 of the second subpackage 1U that are in contact with each other. Combinations of the first and second terminals 4 and 5 making up the plurality of pairs of first and second terminals 4 and 5 in the specific relative positional relationship are different from those in the reference relative positional relationship. In the composite layered chip package 21, the first and second subpackages 1L and 1U are arranged in the specific relative positional relationship where the second subpackage 1U is displaced in the direction parallel to the top surface 2Ma of the main part 2M of the second subpackage 1U with respect to the reference relative positional relationship.

In the present embodiment, as shown in FIG. 5, the plurality of first terminals 4 include two or more first terminals 4 that align in the first direction (the X direction) to form a first terminal row (41C, 41R1, and 41R2). The plurality of first terminals 4 further include other two or more first terminals 4 that align in the first direction (the X direction) to form a third terminal row (42C, 42R1, and 42R2). The third terminal row is adjacent to the first terminal row in the second direction (the Y direction) orthogonal to the first direction (the X direction).

The plurality of second terminals 5 include two or more second terminals 5 that align in the first direction (the X direction) to form a second terminal row (51C, 51R1, and 51R2). The plurality of second terminals 5 further include other two or more second terminals 5 that align in the first direction (the X direction) to form a third terminal row (52C, 52R1, and 52R2). The third terminal row is adjacent to the second terminal row in the second direction (the Y direction) orthogonal to the first direction (the X direction).

A plurality of pairs of terminals are formed across the first or second terminal row and the third terminal row, each of the plurality of pairs of terminals being made up of two terminals electrically connected to each other. The two terminals are one of the two or more first or second terminals that form the first or second terminal row and one of the other two or more first or second terminals that form the third terminal row, the ones being non-adjacent to each other in the second direction (the Y direction). The specific relative positional relationship is such that the second subpackage 1U is displaced in the second direction (the Y direction) with respect to the reference relative positional relationship.

According to the present embodiment, a plurality of subpackages 1S of the same configuration are arranged in the specific relative positional relationship shown in FIG. 1 to construct the composite layered chip package 21. In such a composite layered chip package 21, as has been described with reference to FIG. 8, some of a plurality of signals associated with the one or more semiconductor chips 30 in the subpackages 1S can easily be varied from one subpackage 1S to another. According to the present embodiment, it is therefore possible to stack a plurality of subpackages 1S of the same configuration into a composite layered chip package 21 while varying the functions of the subpackages 1S from one subpackage 1S to another.

In the present embodiment, only either the plurality of first terminals 4 or the plurality of second terminals 5 may include the two or more first or second terminals that align in the first direction (the X direction) to form a third terminal row. In such a case also, it is possible to construct a composite layered chip package 21 by arranging a plurality of subpackages 1S in the specific relative positional relationship with each other.

A plurality of subpackages 1S according to the present embodiment may also be arranged in the reference relative positional relationship shown in FIG. 2 to construct the composite layered chip package 22. In the composite layered chip package 22, a plurality of signals associated with the one or more semiconductor chips 30 in the subpackages 1S are the same among all the subpackages 1S. Such a composite layered chip package 22 is suited to the case of operating the plurality of subpackages 1S in parallel, with the same function given to the plurality of subpackages 1S.

According to the subpackage 1S of the present embodiment, it is thus possible to construct a composite layered chip package in two ways of configuration by simply changing the relative positional relationship between a plurality of subpackages 1S having the same configuration.

The plurality of third and fourth terminals 6 and 7 of the subpackage 1S according to the present embodiment are shaped and arranged so that the plurality of third terminals 6 of the first subpackage 1L are in contact with the plurality of fourth terminals 7 of the second subpackage 1U regardless of whether in the reference relative positional relationship or the specific relative positional relationship. Consequently, according to the present embodiment, the composite layered chip package 21 can be configured so that some of a plurality of signals associated with the one or more semiconductor chips 30 in the subpackages 1S vary from one subpackage 1S to another while some others of the plurality of signals remain the same among all the subpackages 1S.

In the subpackage 1S according to the present embodiment, the plurality of terminals 4 and 6 are formed by using the plurality of electrodes 32 of the layer portion 10S1 which is located closest to the top surface 2Ma of the main part 2M, whereas the plurality of terminals 5 and 7 are formed by using the plurality of electrodes 32 of the layer portion 10S2 which is located closest to the bottom surface 2Mb of the main part 2M. The present embodiment thus facilitates the formation of the plurality of electrodes 4, 5, 6, and 7.

In the subpackage 1S according to the present embodiment, the plurality of wires W include the plurality of common wires WA1 to WA4 that are used for a purpose common to all the layer portions 10S1 and 10S2 in the main part 2M, and the plurality of layer-dependent wires WR1 and WR5 that are used by different layer portions. The plurality of electrodes 32 include the common electrodes 32A1 to 32A4 that are electrically connected to the common wires WA1 to WA4, and the selective connection electrode 32D2 that is selectively electrically connected to only one of the plurality of layer-dependent wires WR1 and WR5 that is used by the layer portion to which the selective connection electrode belongs. In at least one of the plurality of layer portions 10S1 and 10S2, the common electrodes 32A1 to 32A4 and the selective connection electrode 32D2 are electrically connected to the semiconductor chip 30. Consequently, according to the present embodiment, it is possible that the layer-dependent wire to which the semiconductor chip 30 is to be connected is varied from one layer portion 10 to another within a single subpackage 1S.

Second Embodiment

Figure 29:
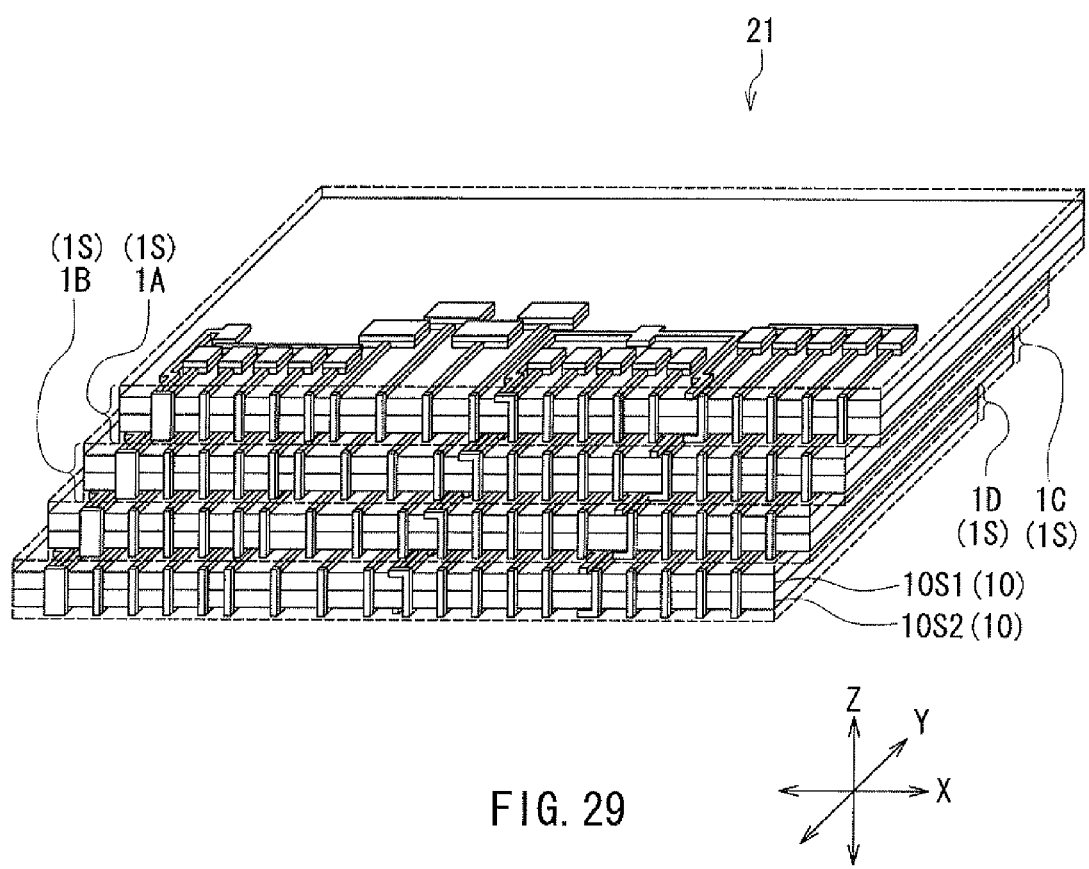
FIG. 29 is a perspective view of a composite layered chip package according to a second embodiment of the invention.
Figure 30:
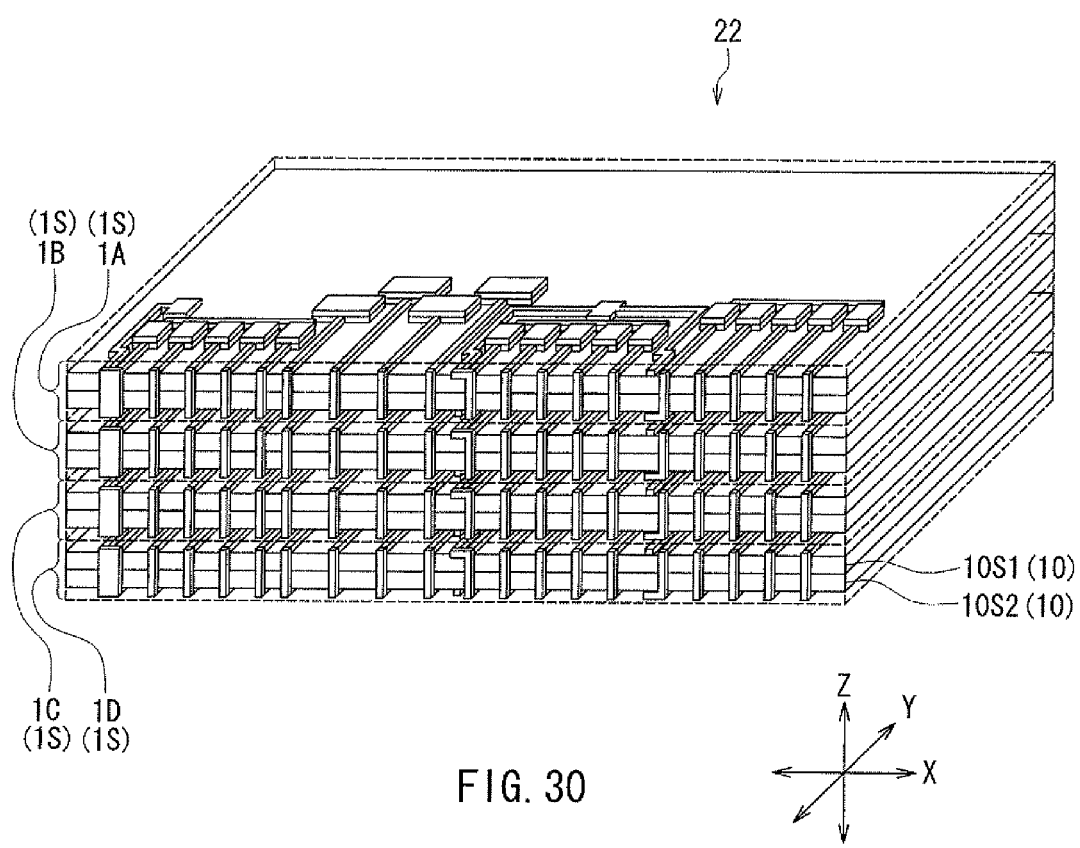
FIG. 30 is a perspective view of a composite layered chip package that is formed by arranging four subpackages of FIG. 29 in the reference relative positional relationship with each other.
Figure 31:
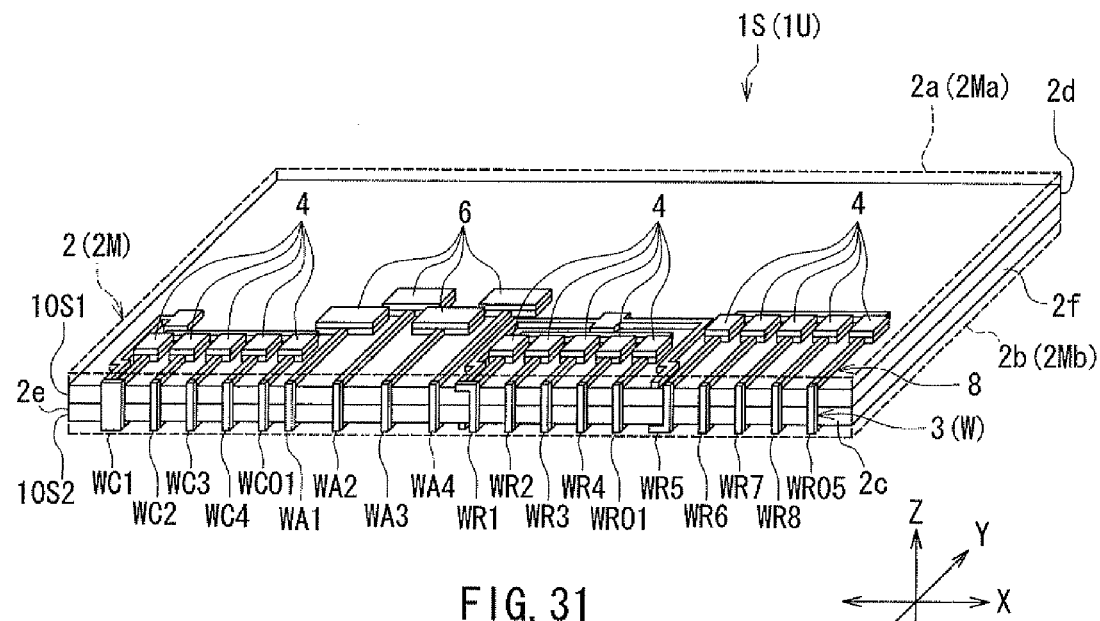
FIG. 31 is a perspective view of a stackable chip package according to the second embodiment of the invention.
Figure 32:
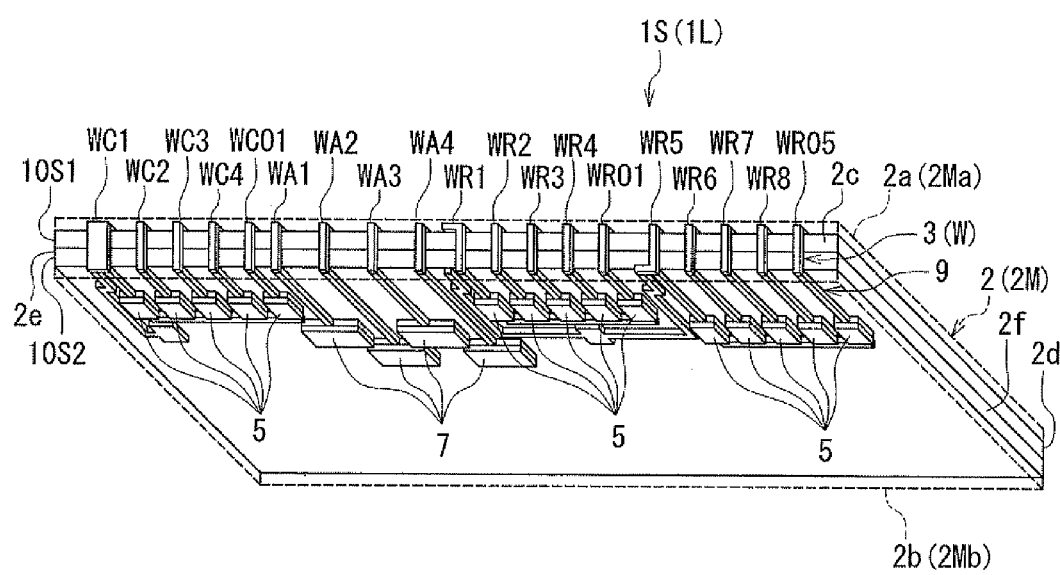
FIG. 32 a perspective view showing the stackable chip package of FIG. 31 as viewed from below.
Figure 33:
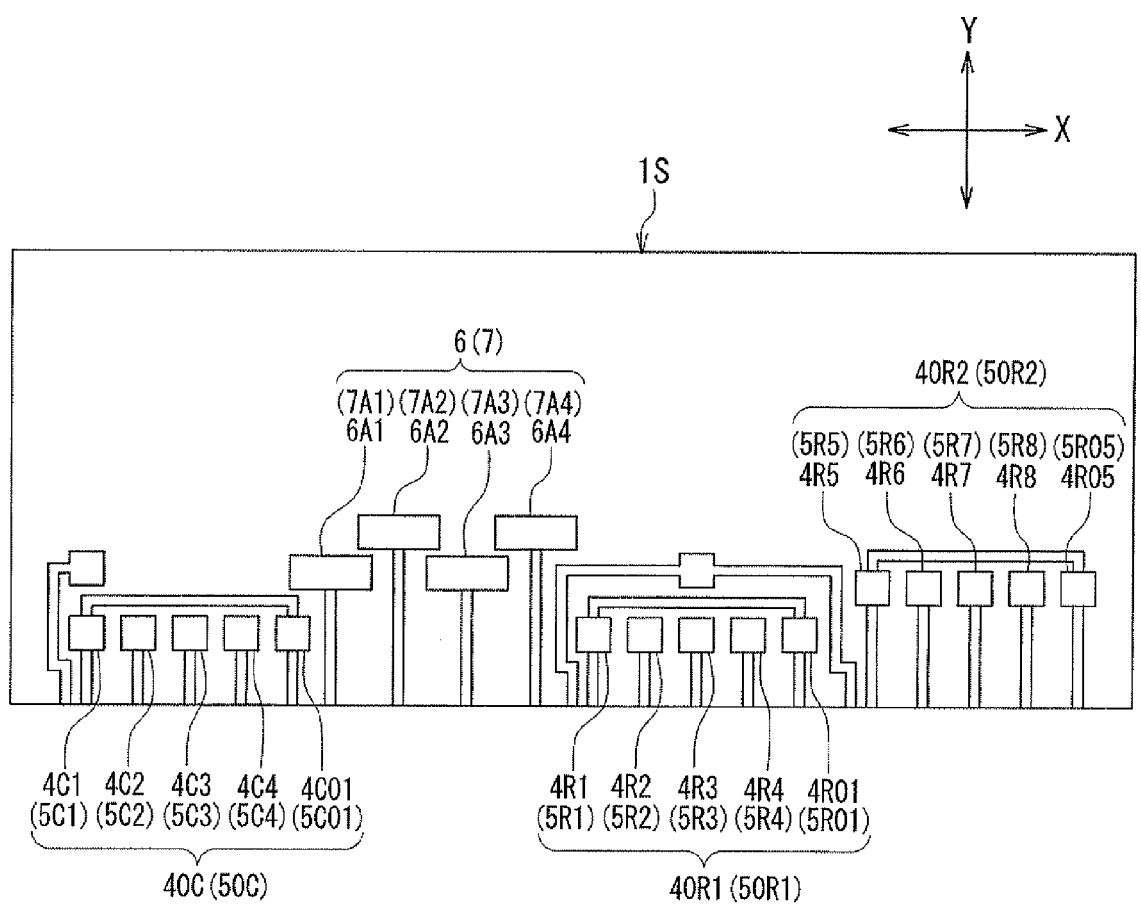
FIG. 33 is a plan view showing a plurality of terminals of the stackable chip package shown in FIG. 31.
Figure 34:
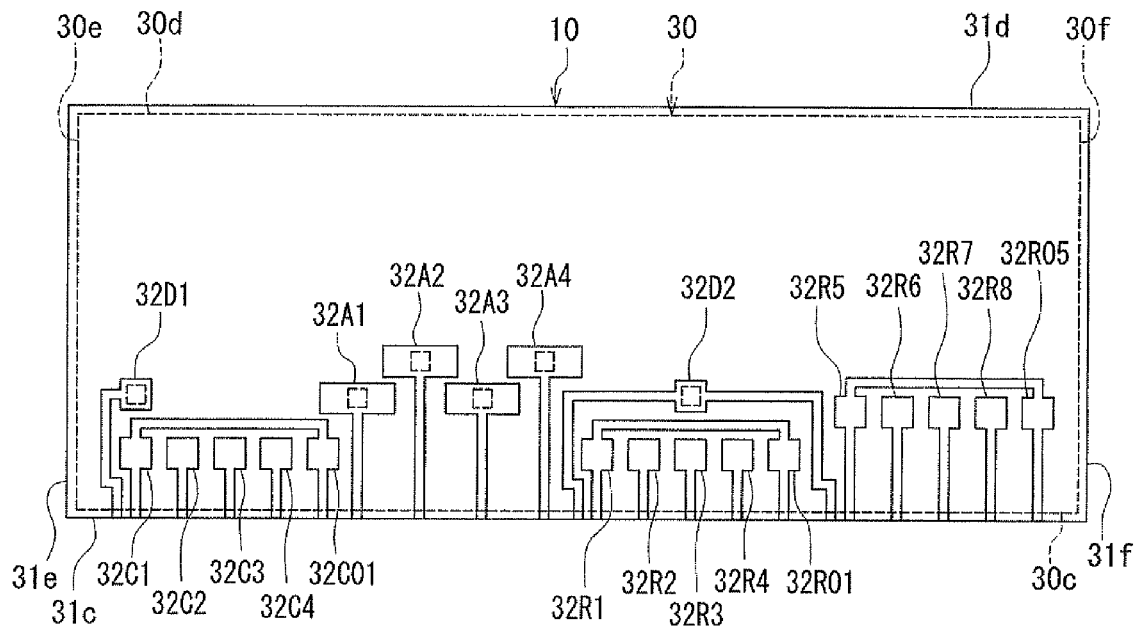
FIG. 34 is a plan view showing a layer portion included in the stackable chip package shown in FIG. 31.
Figure 35:
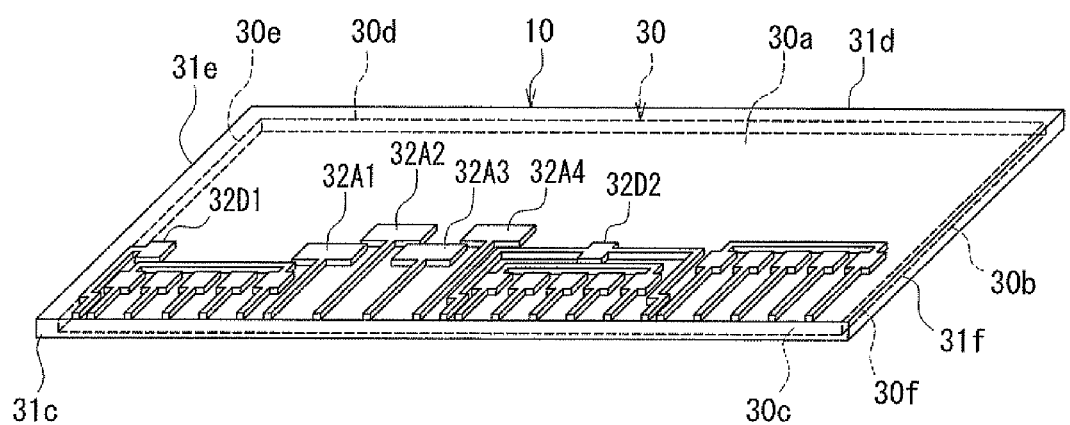
FIG. 35 is a perspective view of the layer portion shown in FIG. 34.

A second embodiment of the invention will now be described. First, reference is made to FIG. 29 to FIG. 35 to describe the configurations of a composite layered chip package and a stackable chip package according to the present embodiment. FIG. 29 is a perspective view of the composite layered chip package according to the present embodiment. FIG. 30 is a perspective view of a composite layered chip package that is formed by arranging four subpackages of FIG. 29 in a reference relative positional relationship with each other. FIG. 31 is a perspective view of the stackable chip package according to the present embodiment. FIG. 32 is a perspective view showing the stackable chip package of FIG. 31 as viewed from below. FIG. 33 is a plan view showing a plurality of terminals of the stackable chip package shown in FIG. 31. FIG. 34 is a plan view showing a layer portion included in the stackable chip package shown in FIG. 31. FIG. 35 is a perspective view of the layer portion shown in FIG. 34.

The composite layered chip package 22 shown in FIG. 30 is formed by arranging the four subpackages 1A to 1D in the reference relative positional relationship with each other. The composite layered chip package 21 according to the present embodiment shown in FIG. 29 is formed by arranging the four subpackages 1A to 1D in a specific relative positional relationship, different from the reference relative positional relationship, with each other.

Now, the plurality of terminals 4, 5, 6, and 7 of the present embodiment will be described in detail. As shown in FIG. 31 and FIG. 32, each subpackage 1S is configured so that the plurality of first terminals 4 and the plurality of second terminals 5 are in the same layout when viewed in the direction perpendicular to the top surface 2Ma of the main part 2M (the Z direction), and that the plurality of third terminals 6 and the plurality of fourth terminals 7 are in the same layout when viewed in the Z direction. FIG. 33 shows the shape and arrangement of the plurality of terminals 4, 5, 6, and 7 when viewed in the direction perpendicular to the top surface 2Ma of the main part 2M (the Z direction).

As shown in FIG. 33, the plurality of first terminals 4 include two or more first terminals 4 that align in a first direction to form a first terminal row. The plurality of second terminals 5 include two or more second terminals 5 that align in the first direction to form a second terminal row. At least one of the first and second terminal rows is formed by three or more first or second terminals that align in the first direction. Of the three or more first or second terminals, two that are located at opposite ends of the first or second terminal row are electrically connected to each other. In the present embodiment, in particular, the first terminal row is formed by three or more first terminals that align in the first direction, and the second terminal row is formed by three or more second terminals that align in the first direction. Of the three or more first/second terminals, two that are located at opposite ends of the first/second terminal row are electrically connected to each other.

Specifically, the plurality of first terminals 4 include: five first terminals 4C1, 4C2, 4C3, 4C4, and 4C01 that align in the X direction to form a terminal row 40C; five first terminals 4R1, 4R2, 4R3, 4R4, and 4R01 that align in the X direction to form a terminal row 40R1; and five first terminals 4R5, 4R6, 4R7, 4R8, and 4R05 that align in the X direction to form a terminal row 40R2. In each of the terminal rows, two terminals located at opposite ends are electrically connected to each other. The X direction corresponds to the first direction. Each of the terminal rows 40C, 40R1, and 40R2 corresponds to the first terminal row.

The plurality of second terminals 5 include: five second terminals 5C1, 5C2, 5C3, 5C4, and 5C01 that align in the X direction to form a terminal row 50C; five second terminals 5R1, 5R2, 5R3, 5R4, and 5R01 that align in the X direction to form a terminal row 50R1; and five second terminals 5R5, 5R6, 5R7, 5R8, and 5R05 that align in the X direction to form a terminal row 50R2. In each of the terminal rows, two terminals located at opposite ends are electrically connected to each other. Each of the terminal rows 50C, 50R1, and 50R2 corresponds to the second terminal row.

In all the terminal rows, the five terminals making up each terminal row are at equal pitches. The amount of displacement of the second subpackage 1U in the specific relative positional relationship with respect to the reference relative positional relationship is the same as the foregoing pitch.

The terminal rows 40R1 and 40R2 are offset from each other in the Y direction. The terminal rows 50R1 and 50R2 are offset from each other in the Y direction.

The plurality of third terminals 6 include four terminals 6A1 to 6A4. The terminals 6A1 to 6A4 are each shaped to be elongated in the X direction as compared with the first terminals 4. A pair of terminals 6A1 and 6A3 and a pair of terminals 6A2 and 6A4 are offset from each other in the Y direction. The interval between the terminals 6A1 and 6A3 and the interval between the terminals 6A2 and 6A4 are both greater than the amount of displacement of the second subpackage 1U in the specific relative positional relationship with respect to the reference relative positional relationship. The plurality of fourth terminals 7 include four terminals 7A1 to 7A4. The shape and arrangement of the terminals 7A1 to 7A4 are the same as those of the terminals 6A1 to 6A4.

In each subpackage 1S, two terminals in each of the following pairs of terminals coincide with each other in position when viewed in the direction perpendicular to the top surface 2Ma of the main part 2M (the Z direction): (4C1, 5C1), (4C2, 5C2), (4C3, 5C3), (4C4, 5C4), (4C01, 5C01), (4R1, 5R1), (4R2, 5R2), (4R3, 5R3), (4R4, 5R4), (4R01, 5R01), (4R5, 5R5), (4R6, 5R6), (4R7, 5R7), (4R8, 5R8), (4R05, 5R05), (6A1, 7A1), (6A2, 7A2), (6A3, 7A3), and (6A4, 7A4).

Now, the plurality of wires W will be described in detail. The plurality of wires W are disposed on the side surface 2c of the main body 2 and pass through all the layer portions 10S1 and 10S2 in the main part 2M. The plurality of wires W include wires WC1, WC2, WC3, WC4, WC01, WR1, WR2, WR3, WR4, WR01, WR5, WR6, WR7, WR8, WR05, WA1, WA2, WA3, and WA4 that electrically connect two terminals in the respective pairs of terminals (4C1, 5C1), (4C2, 5C2), (4C3, 5C3), (4C4, 5C4), (4C01, 5C01), (4R1, 5R1), (4R2, 5R2), (4R3, 5R3), (4R4, 5R4), (4R01, 5R01), (4R5, 5R5), (4R6, 5R6), (4R7, 5R7), (4R8, 5R8), (4R05, 5R05), (6A1, 7A1), (6A2, 7A2), (6A3, 7A3), and (6A4, 7A4). Note that the wires WC01, WR01, and WRO5 may be omitted.

The plurality of electrodes 32 will now be described. As with the first embodiment, the plurality of terminals 4 and 6 are formed by using the plurality of electrodes 32 of the layer portion 10S1, and the plurality of terminals 5 and 7 are formed by using the plurality of electrodes 32 of the layer portion 10S2.

FIG. 34 and FIG. 35 illustrate the shape and arrangement of the plurality of electrodes 32 of the layer portion 10S1. The shape and arrangement of the plurality of electrodes 32 of the layer portion 10S2 when viewed from the side of the first surface 30a of the semiconductor chip 30 are a mirror image to those of the plurality of electrodes 32 shown in FIG. 34 and FIG. 35.

The plurality of electrodes 32 include electrodes 32C1 to 32C4, 32C01, 32R1 to 32R8, 32R01, 32R05, 32A1 to 32A4, 32D1, and 32D2. In FIG. 35, the reference symbols of the electrodes other than the electrodes 32A1 to 32A4, 32D1, and 32D2 are omitted.

The electrodes 32C1 to 32C4, 32C01, 32R1 to 32R8, 32R01, 32R05, and 32A1 to 32A4 of the layer portion 10S1 include terminal component parts that are used for forming the terminals 4C1 to 4C4, 4C01, 4R1 to 4R8, 4R01, 4R05, and 6A1 to 6A4.

The electrodes 32C1 to 32C4, 32C01, 32R1 to 32R8, 32R01, 32R05, and 32A1 to 32A4 of the layer portion 10S2 include terminal component parts that are used for forming the terminals 5C1 to 5C4, 5C01, 5R1 to 5R8, 5R01, 5R05, and 7A1 to 7A4.

The electrodes 32C1 to 32C4, 32C01, 32R1 to 32R8, 32R01, 32R05, and 32A1 to 32A4 have respective end faces located in the end face 31c of the insulating portion 31, and are electrically connected to the wires WC1 to WC4, WC01, WR1 to WR8, WR01, WR05, and WA1 to WA4 via those end faces.

The electrodes 32A1 to 32A4, 32D1, and 32D2 are the same as those of the first embodiment. None of the electrodes 32C1 to 32C4, 32C01, 32R1 to 32R8, 32R01, and 32R05 are in contact with the semiconductor chip 30.

The electrode 32D1 has an end face located in the end face 31c of the insulating portion 31. This end face is located near the end face of the electrode 32C1. The electrode 32D2 has first and second branch portions. Each of the first and second branch portions has an end face located in the end face 31c of the insulating portion 31. The end face of the first branch portion is located near the end face of the electrode 32R1. The end face of the second branch portion is located near the end face of the electrode 32R5.

In each of the layer portions 10S1 and 10S2, the wire WC1 is broadened to come into contact with the end face of the electrode 32D1, as with the first embodiment. In the layer portion 10S1, the wire WR1 is broadened in part to come into contact with the end face of the first branch portion of the electrode 32D2. In the layer portion 10S2, the wire WR5 is broadened in part to come into contact with the end face of the second branch portion of the electrode 32D2.

Now, the reference relative positional relationship and the specific relative positional relationship in the present embodiment will be described in detail. The reference relative positional relationship will be described first, with reference to FIG. 30. The reference relative positional relationship is such that, when viewed in the direction perpendicular to the top surface 2Ma of the main part 2M of the second subpackage 1U (the Z direction), the plurality of first terminals 4 of the first subpackage 1L and the plurality of first terminals 4 of the second subpackage 1U coincide with each other in position while the plurality of second terminals 5 of the first subpackage 1L and the plurality of second terminals 5 of the second subpackage 1U coincide with each other in position. When in the reference relative positional relationship, terminals 4 and 6 of the subpackage 1L and terminals 5 and 7 of the subpackage 1U that coincide with each other in position when viewed in the Z direction are in contact with each other and electrically connected to each other. In this way, there are formed a plurality of pairs of first and second terminals each of which is made up of one of the plurality of first terminals 4 of the first subpackage 1L and one of the plurality of second terminals 5 of the second subpackage 1U that are in contact with each other and electrically connected to each other.

The specific relative positional relationship shown in FIG. 29 is such that the second subpackage 1U is displaced in the direction parallel to the top surface 2Ma of the main part 2M of the second subpackage 1U with respect to the reference relative positional relationship shown in FIG. 30. In the present embodiment, the specific relative positional relationship is particularly such that the second subpackage 1U is displaced in the X direction (the first direction) with respect to the reference relative positional relationship.

Combinations of the first terminals 4 of the first subpackage 1L and the second terminals 5 of the second subpackage 1U making up the plurality of pairs of first and second terminals in the specific relative positional relationship are different from those in the reference relative positional relationship. In the example shown in FIG. 29, the second subpackage 1U is displaced in the direction from the side surface 2e of the main body 2 toward the side surface 2f of the main body 2, with respect to the reference relative positional relationship. It should be noted that the specific relative positional relationship may be such that the second subpackage 1U is displaced in the direction from the side surface 2f toward the side surface 2e, with respect to the reference relative positional relationship.

When in the specific relative positional relationship shown in FIG. 29, the plurality of pairs of first and second terminals, each of which is made up of one of the first terminals 4 of the first subpackage 1L and one of the second terminals 5 of the second subpackage 1U that are in contact with each other and electrically connected to each other, are as follows: (4C2, 5C1), (4C3, 5C2), (4C4, 5C3), (4C01, 5C4), (4R2, 5R1), (4R3, 5R2), (4R4, 5R3), (4R01, 5R4), (4R6, 5R5), (4R7, 5R6), (4R8, 5R7), and (4R05, 5R8).

When in a not-shown specific relative positional relationship where the second subpackage 1U is displaced in the direction from the side surface 2f toward the side surface 2e with respect to the reference relative positional relationship, the terminals 5C2 to 5C4, 5C01, 5R2 to 5R4, 5R01, 5R6 to 5R8, 5R05, and 7A1 to 7A4 of the second subpackage 1U are in contact with and electrically connected to the terminals 4C1 to 4C4, 4R1 to 4R8, and 6A1 to 6A4 of the first subpackage 1L.

Because of the shape and arrangement of the terminals 6A1 to 6A4 and 7A1 to 7A4 described above, there are formed a plurality of pairs of terminals (6A1, 7A1), (6A2, 7A2), (6A3, 7A3), and (6A4, 7A4) in each of which the two terminals are in contact with and electrically connected to each other, across the terminals 6A1 to 6A4 of the first subpackage 1L and the terminals 7A1 to 7A4 of the second subpackage 1U regardless of whether in the reference relative positional relationship or the specific relative positional relationship.

Figure 36:
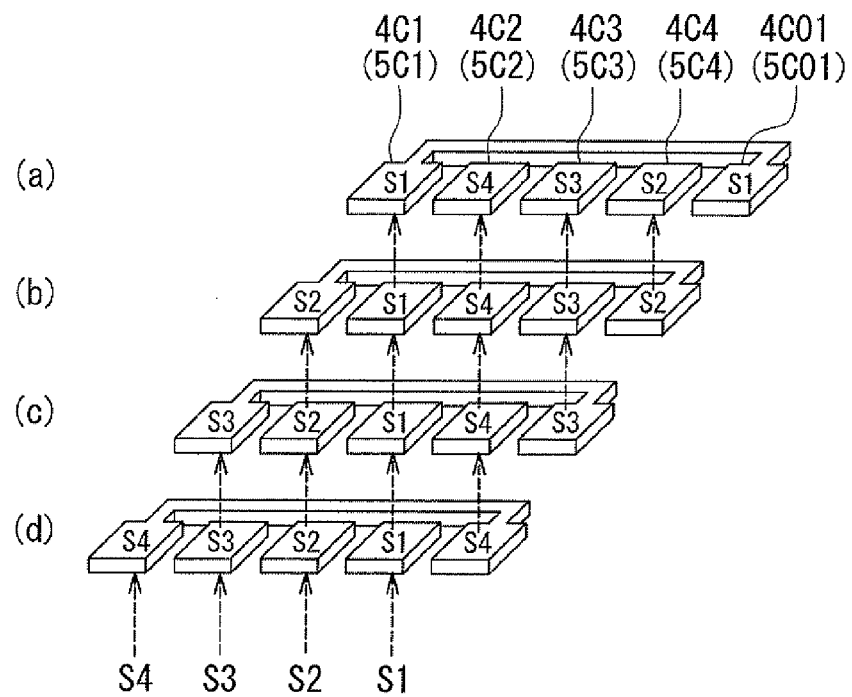
FIG. 36 is an explanatory diagram showing the flow of a plurality of signals in the composite layered chip package shown in FIG. 29.
Figure 37:
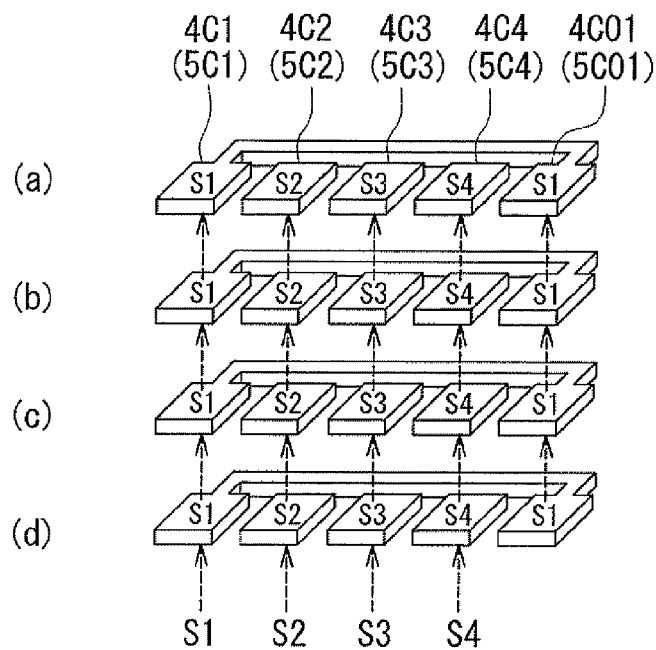
FIG. 37 is an explanatory diagram showing the flow of a plurality of signals in the composite layered chip package shown in FIG. 30.

Next, the flow of a plurality of signals in the composite layered chip package 21 shown in FIG. 29 and the composite layered chip package 22 shown in FIG. 30 will be described. FIG. 36 is an explanatory diagram showing the flow of a plurality of signals in the composite layered chip package 21 shown in FIG. 29. FIG. 37 is an explanatory diagram showing the flow of a plurality of signals in the composite layered chip package 22 shown in FIG. 30.

Portions (a), (b), (c), and (d) of FIG. 36 show the terminals 4C1 to 4C4, 4C01, 5C1 to 5C4, and 5C01 in the subpackages 1A, 1B, 1C, and 1D of the composite layered chip package 21 shown in FIG. 29 and signals to appear thereon. Portions (a), (b), (c), and (d) of FIG. 37 show the terminals 4C1 to 4C4, 4C01, 5C1 to 5C4, and 5C01 in the subpackages 1A, 1B, 1C, and 1D of the composite layered chip package 22 shown in FIG. 30 and signals to appear thereon. Symbols S1, S2, S3, and S4 in FIG. 36 and FIG. 37 represent respective signals.

In each subpackage 1S, the same signal appears on a plurality of terminals that are electrically connected to each other. More specifically, the signal to appear on the terminal 4C01 is the same as that on the terminal 4C1. The signal to appear on the terminal 5C01 is the same as that on the terminal 5C1. The signals to appear on the terminals 5C1 to 5C4, and 5C01 are the same as those on the terminals 4C1 to 4C4, and 4C01, respectively.

FIG. 36 shows an example where the signals S4, S3, S2, and S1 are supplied to the terminals 5C1, 5C2, 5C3, and 5C4 of the subpackage 1D as shown in portion (d) of FIG. 36. In this case, in the subpackage 1D, the signals S4, S3, S2, S1, and S4 appear on the terminals 4C1, 4C2, 4C3, 4C4, and 4C01, respectively.

When in the specific relative positional relationship shown in FIG. 29, the terminals 5C1, 5C2, 5C3, and 5C4 of the subpackage 1C are in contact with the terminals 4C2, 4C3, 4C4, and 4C01 of the subpackage 1D. Consequently, in the subpackage 1C, as shown in portion (c) of FIG. 36, the signals S3, S2, S1, and S4 are transmitted to the terminals 5C1, 5C2, 5C3, and 5C4. As a result, the signals S3, S2, S1, S4, and S3 appear on the terminals 4C1, 4C2, 4C3, and 4C4, and 4C01, respectively.

In the subpackage 1B, as shown in portion (b) of FIG. 36, the signals S2, S1, S4, and S3 are transmitted to the terminals 5C1, 5C2, 5C3, and 5C4. As a result, the signals S2, S1, S4, S3, and S2 appear on the terminals 4C1, 4C2, 4C3, 4C4, and 4C01, respectively.

In the subpackage 1A, as shown in portion (a) of FIG. 36, the signals S1, S4, S3, and S2 are transmitted to the terminals 5C1, 5C2, 5C3, and 5C4. As a result, the signals S1, S4, S3, S2, and S1 appear on the terminals 4C1, 4C2, 4C3, and 4C4, and 4C01, respectively.

In each of the layer portions 10S1 and 10S2, the terminals 4C1 and 5C1 are electrically connected to the semiconductor chip 30 through the wire WC1 and the electrode 32D1. As described above, when in the specific relative positional relationship shown in FIG. 29, the signal to appear on the terminals 4C1 and 5C1 varies from one subpackage 1S to another. Consequently, in the composite layered chip package 21 shown in FIG. 29, the signals associated with the semiconductor chips 30 of the respective corresponding layers of different subpackages 1S through the wire WC1 and the electrodes 32D1 can be varied from one subpackage 1S to another. In the example shown in FIG. 36, the signal associated with the semiconductor chips 30 of the layer portions 10S1 and 10S2 through the wire WC1 and the electrodes 32D1 in the subpackage 1A is the signal S1. The signal S2 is associated in the subpackage 1B, the signal S3 in the subpackage 1C, and the signal S4 in the subpackage 1D.

On the other hand, when in the reference relative positional relationship shown in FIG. 30, the signals to appear on the terminals 4C1 to 4C4, 4C01, 5C1 to 5C4, and 5C01 do not vary from one subpackage 1S to another as shown in FIG. 37. FIG. 37 shows an example where the signals S1, S2, S3, and S4 are supplied to the terminals 5C1, 5C2, 5C3, and 5C4 of the subpackage 1D. In the composite layered chip package 22 shown in FIG. 30, the same signals are associated with the semiconductor chips 30 of the respective corresponding layers in all the subpackages 1A to 1D, through the wire WC1 and the electrodes 32D1.

The mode of signal flow described with reference to FIG. 36 and FIG. 37 also applies to the group of terminals 4R1 to 4R4, 4R01, 5R1 to 5R4 and 5R01, and the group of terminals 4R5 to 4R8, 4R05, 5R5 to 5R8 and 5R05.

The present embodiment may be configured so that only one of the first and second terminal rows is formed by three or more first or second terminals that align in the first direction (the X direction) and, of the three or more first or second terminals, two that are located at opposite ends of the first or second terminal row are electrically connected to each other. In such a case also, it is possible to construct a composite layered chip package 21 by arranging a plurality of subpackages 1S in the specific relative positional relationship with each other.

The remainder of configuration, function and effects of the present embodiment are similar to those of the first embodiment.

Third Embodiment

Figure 38:
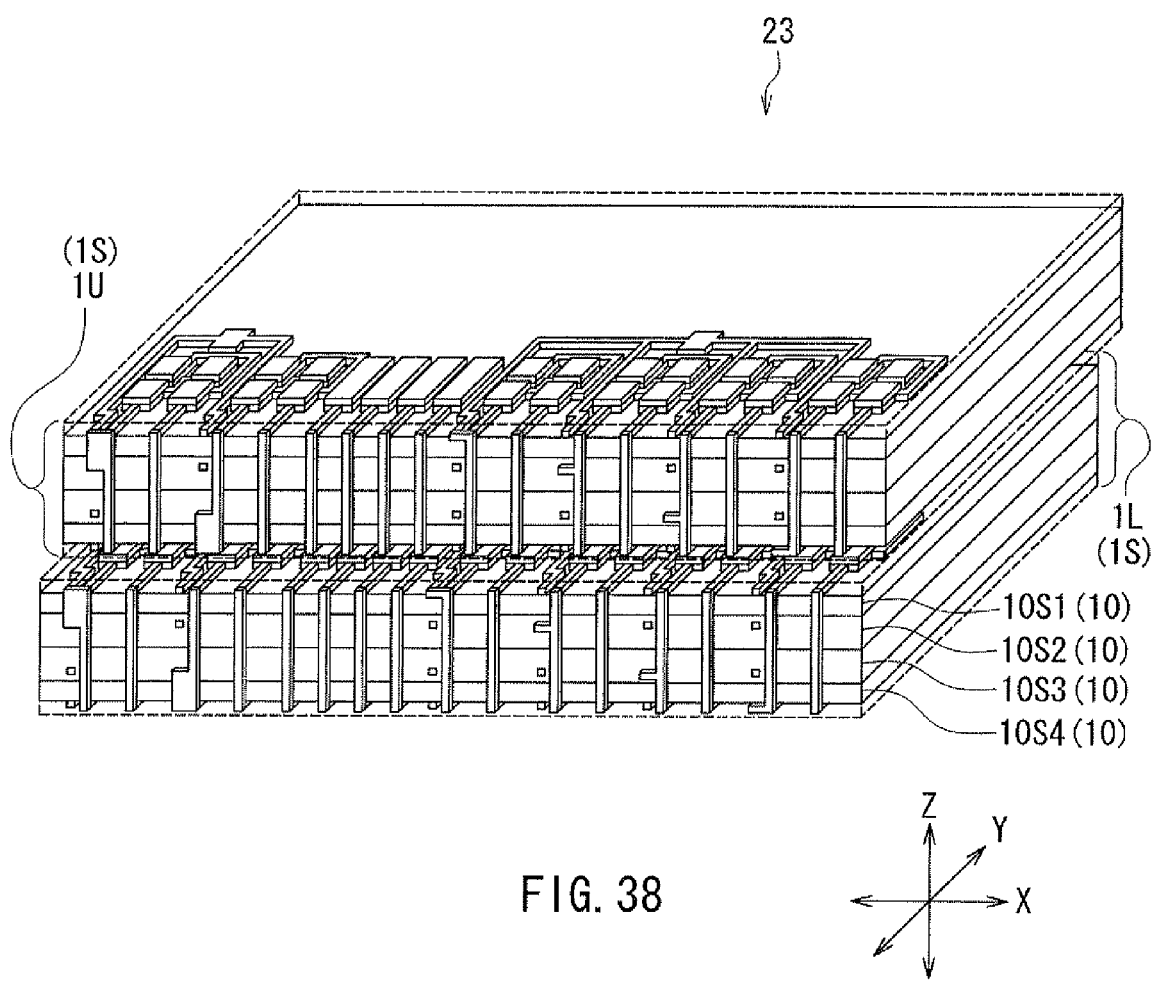
FIG. 38 is a perspective view of a composite layered chip package according to a third embodiment of the invention.
Figure 39:
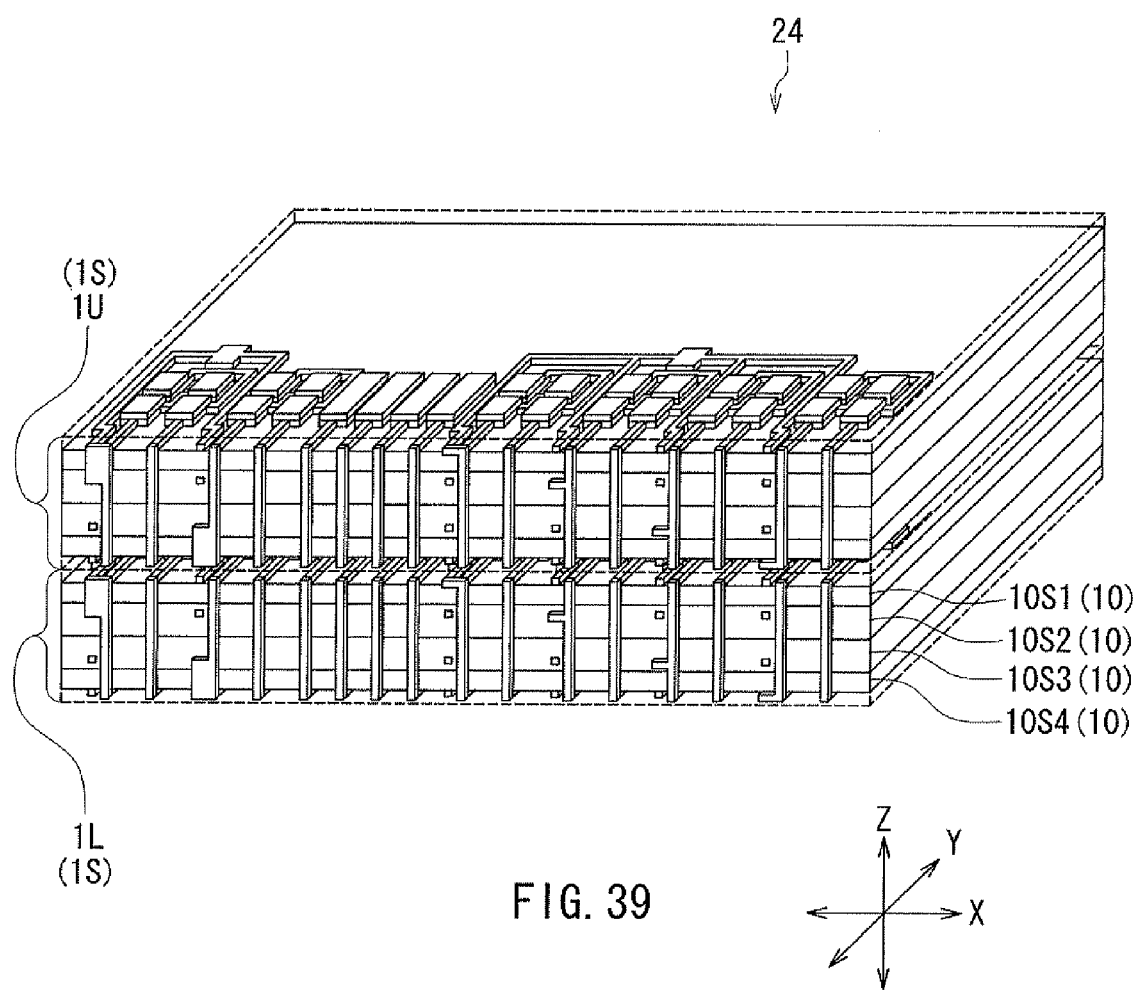
FIG. 39 is a perspective view of a composite layered chip package that is formed by arranging two subpackages of FIG. 38 in the reference relative positional relationship with each other.
Figure 40:
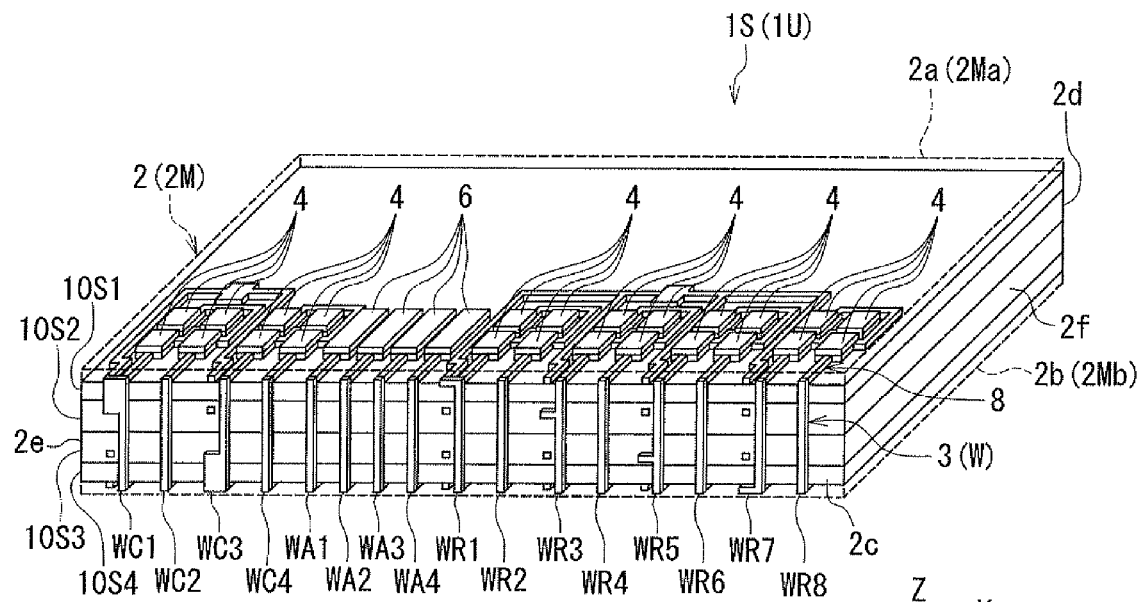
FIG. 40 is a perspective view of a stackable chip package according to the third embodiment of the invention.
Figure 41:
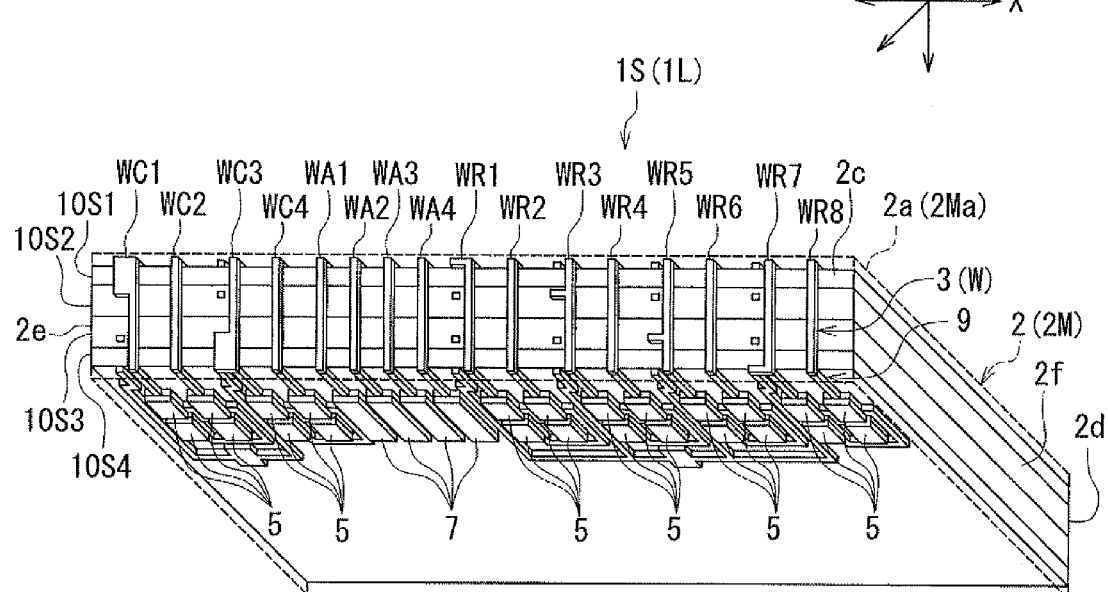
FIG. 41 a perspective view showing the stackable chip package of FIG. 40 as viewed from below.
Figure 42:
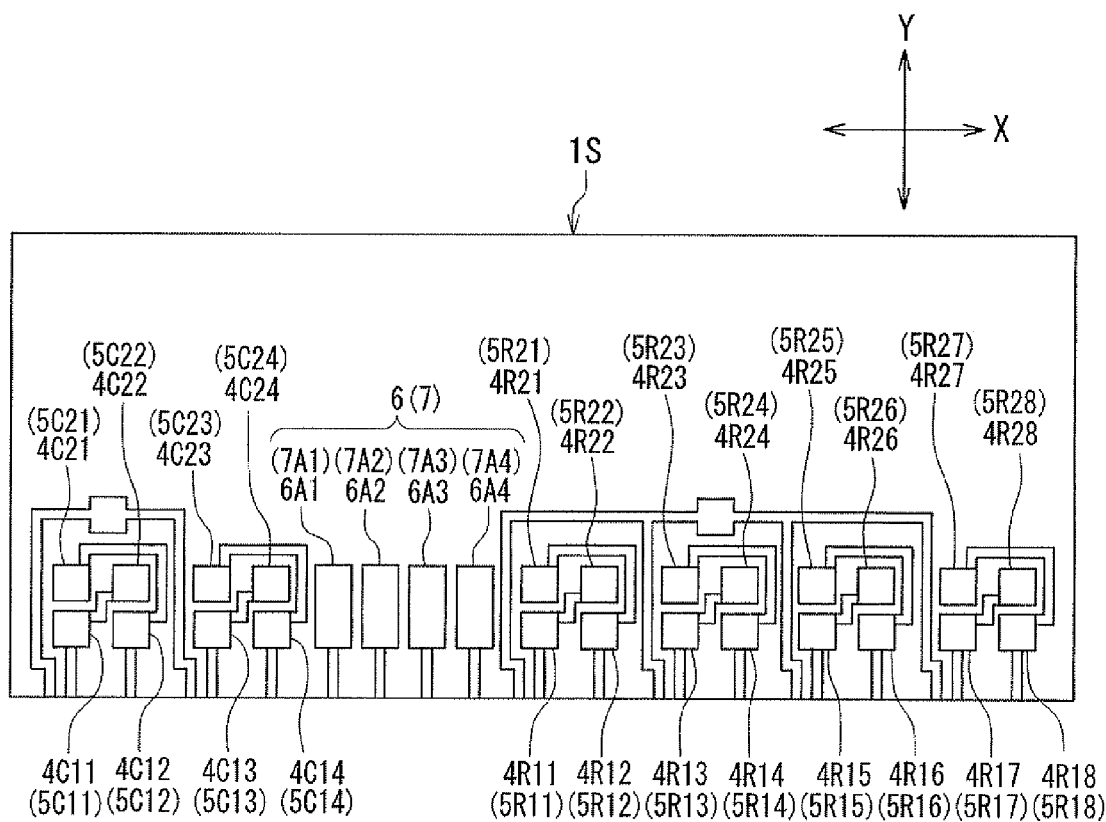
FIG. 42 is a plan view showing a plurality of terminals of the stackable chip package shown in FIG. 40.
Figure 43:
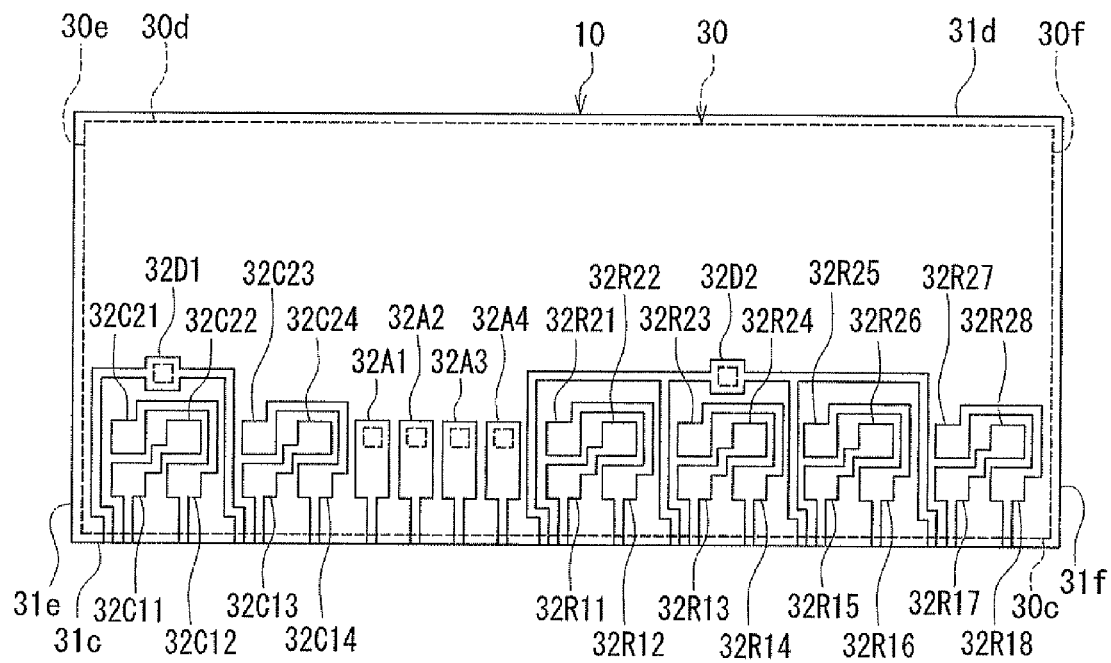
FIG. 43 is a plan view showing a layer portion included in the stackable chip package shown in FIG. 40.
Figure 44:
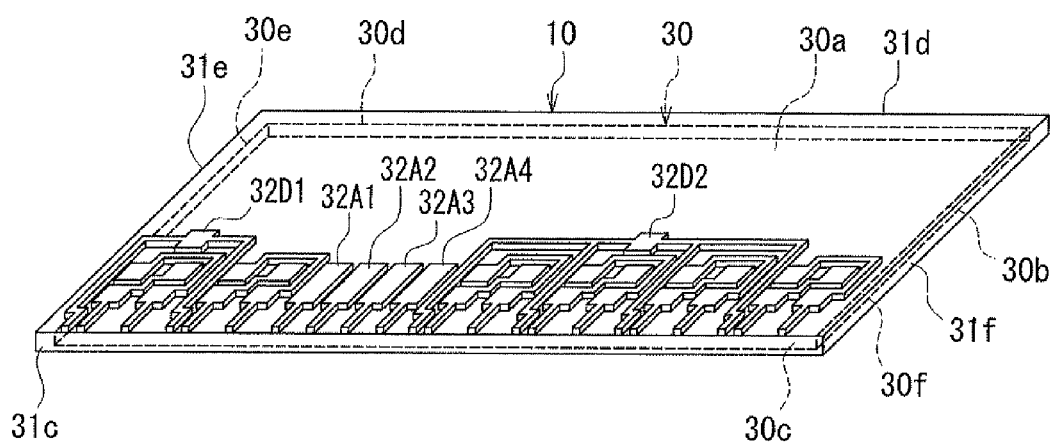
FIG. 44 is a perspective view of the layer portion shown in FIG. 43.

A third embodiment of the invention will now be described. First, reference is made to FIG. 38 to FIG. 44 to describe the configurations of a composite layered chip package and a stackable chip package according to the present embodiment. FIG. 38 is a perspective view of the composite layered chip package according to the present embodiment. FIG. 39 is a perspective view of a composite layered chip package that is formed by arranging two subpackages of FIG. 38 in a reference relative positional relationship with each other. FIG. 40 is a perspective view of the stackable chip package according to the present embodiment. FIG. 41 is a perspective view showing the stackable chip package of FIG. 40 as viewed from below. FIG. 42 is a plan view showing a plurality of terminals of the stackable chip package shown in FIG. 40. FIG. 43 is a plan view showing a layer portion included in the stackable chip package shown in FIG. 40. FIG. 44 is a perspective view of the layer portion shown in FIG. 43.

The composite layered chip package 23 according to the present embodiment shown in FIG. 38 includes a first subpackage 1L and a second subpackage 1U. The second subpackage 1U is stacked on and electrically connected to the first subpackage 1L. As with the first embodiment, any subpackage will be designated by reference symbol 1S. Each subpackage 1S is the stackable chip package according to the present embodiment.

The composite layered chip package 24 shown in FIG. 39 is formed by arranging the two subpackages 1L and 1U shown in FIG. 38 in the reference relative positional relationship with each other. The composite layered chip package 23 according to the present embodiment shown in FIG. 38 is formed by arranging the two subpackages 1L and 1U in a specific relative positional relationship, different from the reference relative positional relationship, with each other.

As shown in FIG. 40 and FIG. 41, the subpackage 1S or the stackable chip package according to the present embodiment includes a main body 2 and wiring 3. The main body 2 has a main part 2M. The wiring 3 includes a plurality of wires W. The main part 2M of the present embodiment includes four layer portions 10S1, 10S2, 10S3, and 10S4. The four layer portions 10S1, 10S2, 10S3, and 10S4 are arranged in this order from the top. Hereinafter, any layer portion will be designated by reference numeral 10. The layer portion 10S1 is located closest to the top surface 2Ma of the main part 2M among the plurality of layer portions, and therefore corresponds to the first layer portion according to the invention. The layer portion 10S4 is located closest to the bottom surface 2Mb of the main part 2M among the plurality of layer portions, and therefore corresponds to the second layer portion according to the invention.

The layer portion 10S1 and the layer portion 10S4 are arranged so that the second surfaces 30b of the respective semiconductor chips 30 included therein face each other. The layer portion 10S1 is arranged with the first surface 30a of the semiconductor chip 30 upward. The layer portion 10S4 is arranged with the first surface 30a of the semiconductor chip 30 downward. The layer portions 10S2 and 10S3 may each be situated in the same orientation as that of the layer portion 10S1 or that of the layer portion 10S4. In the example shown in FIG. 40 and FIG. 41, the layer portion 10S2 is situated in the same orientation as that of the layer portion 10S1, while the layer portion 10S3 is situated in the same orientation as that of the layer portion 10S4. The layer portions 10S1 to 10S4 are bonded with an adhesive, for example.

Now, the plurality of terminals 4, 5, 6, and 7 of the present embodiment will be described in detail. As shown in FIG. 40 and FIG. 41, each subpackage 1S is configured so that the plurality of first terminals 4 and the plurality of second terminals 5 are in the same layout when viewed in the direction perpendicular to the top surface 2Ma of the main part 2M (the Z direction), and that the plurality of third terminals 6 and the plurality of fourth terminals 7 are in the same layout when viewed in the Z direction. FIG. 42 shows the shape and arrangement of the plurality of terminals 4, 5, 6, and 7 when viewed in the direction perpendicular to the top surface 2Ma of the main part 2M (the Z direction).

As shown in FIG. 42, the plurality of first terminals 4 include terminals 4C11 to 4C14, 4R11 to 4R18, 4C21 to 4C24, and 4R21 to 4R28. Pairs of terminals that align in the X direction, namely, (4C11, 4C12), (4C13, 4C14), (4R11, 4R12), (4R13, 4R14), (4R15, 4R16), and (4R17, 4R18), each form a first terminal row. Other pairs of terminals that align in the X direction, namely, (4C21, 4C22), (4C23, 4C24), (4R21, 4R22), (4R23, 4R24), (4R25, 4R26), and (4R27, 4R28), each form a third terminal row. The third terminal rows (4C21, 4C22), (4C23, 4C24), (4R21, 4R22), (4R23, 4R24), (4R25, 4R26), and (4R27, 4R28) are adjacent to the first terminal rows (4C11, 4C12), (4C13, 4C14), (4R11, 4R12), (4R13, 4R14), (4R15, 4R16), and (4R17, 4R18), respectively, in the Y direction. The X direction corresponds to the first direction according to the invention. The Y direction corresponds to the second direction according to the invention.

A plurality of pairs of terminals are formed across a first terminal row and an adjacent third terminal row, each of the plurality of pairs of terminals being made up of two terminals electrically connected to each other. The two terminals are one of two first terminals that form a first terminal row and one of other two first terminals that form a third terminal row, the ones being non-adjacent to each other in the second direction (the Y direction). Specifically, across the first terminal row and the third terminal row, there are formed the following pairs of two electrically-connected terminals: (4C11, 4C22), (4C12, 4C21), (4C13, 4C24), (4C14, 4C23), (4R11, 4R22), (4R12, 4R21), (4R13, 4R24), (4R14, 4R23), (4R15, 4R26), (4R16, 4R25), (4R17, 4R28), and (4R18, 4R27).

The plurality of second terminals 5 include terminals 5C11 to 5C14, 5R11 to 5R18, 5C21 to 5C24, and 5R21 to 5R28. Pairs of terminals that align in the X direction, namely, (5C11, 5C12), (5013, 5C14), (5R11, 5R12), (5R13, 5R14), (5R15, 5R16), and (5R17, 5R18), each form a second terminal row. Other pairs of terminals that align in the X direction, namely, (5C21, 5C22), (5023, 5C24), (5R21, 5R22), (5R23, 5R24), (5R25, 5R26), and (5R27, 5R28), each form a third terminal row. The third terminal rows (5C21, 5C22), (5023, 5024), (5R21, 5R22), (5R23, 5R24), (5R25, 5R26), and (5R27, 5R28) are adjacent to the second terminal rows (5011, 5C12), (5C13, 5C14), (5R11, 5R12), (5R13, 5R14), (5R15, 5R16), and (5R17, 5R18), respectively, in the Y direction.

A plurality of pairs of terminals are formed across a second terminal row and an adjacent third terminal row, each of the plurality of pairs of terminals being made up of two terminals electrically connected to each other. The two terminals are one of two second terminals that form a second terminal row and one of other two second terminals that form a third terminal row, the ones being non-adjacent to each other in the second direction (the Y direction). Specifically, across the second terminal row and the third terminal row, there are formed the following pairs of two electrically-connected terminals: (5C11, 5C22), (5C12, 5C21), (5C13, 5C24), (5C14, 5C23), (5R11, 5R22), (5R12, 5R21), (5R13, 5R24), (5R14, 5R23), (5R15, 5R26), (5R16, 5R25), (5R17, 5R28), and (5R18, 5R27).

The plurality of third terminals 6 include four terminals 6A1 to 6A4. The plurality of fourth terminals 7 include four terminals 7A1 to 7A4. The shape and arrangement of the terminals 6A1 to 6A4 and 7A1 to 7A4 are the same as in the first embodiment.

In the subpackage 1S, there are a plurality of pairs of terminals in each of which the two terminals making up the pair coincide with each other in position when viewed in the direction perpendicular to the top surface 2Ma of the main part 2M (the Z direction). Such a plurality of pairs of terminals are the same as in the first embodiment.

The plurality of wires W are disposed on the side surface 2c of the main body 2 and pass through all the layer portions 10S1 to 10S4 in the main part 2M. The plurality of wires W include wires WC1 to WC4, WR1 to WR8, and WA1 to WA4 which are the same as those of the first embodiment.

The plurality of electrodes 32 will now be described. In the present embodiment, the plurality of terminals 4 and 6 are formed by using the plurality of electrodes 32 of the layer portion 10S1, and the plurality of terminals 5 and 7 are formed by using the plurality of electrodes 32 of the layer portion 10S4.

FIG. 43 and FIG. 44 illustrate the shape and arrangement of the plurality of electrodes 32 of the layer portions 10S1 and 10S2. The shape and arrangement of the plurality of electrodes 32 of the layer portions 10S3 and 10S4 when viewed from the side of the first surface 30a of each semiconductor chip 30 are a mirror image to those of the plurality of electrodes 32 shown in FIG. 43 and FIG. 44.

The plurality of electrodes 32 include electrodes 32C11 to 32C14, 32C21 to 32C24, 32R11 to 32R18, 32R21 to 32R28, 32A1 to 32A4, 32D1, and 32D2. In FIG. 44, the reference symbols of the electrodes other than the electrodes 32A1 to 32A4, 32D1, and 32D2 are omitted.

The electrodes 32C11 to 32C14, 32R11 to 32R18, 32C21 to 32C24, 32R21 to 32R28, and 32A1 to 32A4 of the layer portion 10S1 include terminal component parts that are used for forming the terminals 4C11 to 4C14, 4R11 to 4R18, 4C21 to 4C24, 4R21 to 4R28, and 6A1 to 6A4.

The electrodes 32C11 to 32C14, 32R11 to 32R18, 32C21 to 32C24, 32R21 to 32R28, and 32A1 to 32A4 of the layer portion 10S4 include terminal component parts that are used for forming the terminals 5C11 to 5C14, 5R11 to 5R18, 5C21 to 5C24, 5R21 to 5R28, and 7A1 to 7A4.

The electrodes 32C11 to 32C14, 32R11 to 32R18, and 32A1 to 32A4 have respective end faces located in the end face 31c of the insulating portion 31, and are electrically connected to the wires WC1 to WC4, WR1 to WR8, and WA1 to WA4 via those end faces. P A plurality of pairs of electrodes are formed across a group of electrodes 32C11 to 32C14 and 32R11 to 32R18 and a group of electrodes 32C21 to 32C24 and 32R21 to 32R28, each of the plurality of pairs of electrodes being made up of two electrodes that are electrically connected to each other. The two electrodes are ones that are not adjacent to each other in the second direction (the Y direction). Specifically, there are formed the following pairs of two electrically-connected electrodes: (32C11, 32C22), (32C12, 32C21), (32C13, 32C24), (32C14, 32C23), (32R11, 32R22), (32R12, 32R21), (32R13, 32R24), (32R14, 32R23), (32R15, 32R26), (32R16, 32R25), (32R17, 32R28), and (32R18, 32R27).

The electrode 32D1 has first and second branch portions. Each of the first and second branch portions has an end face located in the end face 31c of the insulating portion 31. The end face of the first branch portion is located near the end face of the electrode 32C11. The end face of the second branch portion is located near the end face of the electrode 32C13.

The electrode 32D2 has first to fourth branch portions. Each of the first to fourth branch portions has an end face located in the end face 31c of the insulating portion 31. The end face of the first branch portion is located near the end face of the electrode 32R11. The end face of the second branch portion is located near the end face of the electrode 32R13. The end face of the third branch portion is located near the end face of the electrode 32R15. The end face of the fourth branch portion is located near the end face of the electrode 32R17.

In each of the layer portions 10S1 and 10S2, the wire WC1 is broadened in part to come into contact with the end face of the first branch portion of the electrode 32D1. The electrode 32D1 of each of the layer portions 10S1 and 10S2 is thereby electrically connected to the wire WC1. In the layer portion 10S1, the wire WR1 is broadened in part to come into contact with the end face of the first branch portion of the electrode 32D2. The electrode 32D2 of the layer portion 10S1 is thereby electrically connected to the wire WR1. In the layer portion 10S2, the wire WR3 is broadened in part to come into contact with the end face of the second branch portion of the electrode 32D2. The electrode 32D2 of the layer portion 10S2 is thereby electrically connected to the wire WR3.

In each of the layer portions 10S3 and 10S4, the wire WC3 is broadened in part to come into contact with the end face of the second branch portion of the electrode 32D1. The electrode 32D1 of each of the layer portions 10S3 and 10S4 is thereby electrically connected to the wire WC3. In the layer portion 10S3, the wire WR5 is broadened in part to come into contact with the end face of the third branch portion of the electrode 32D2. The electrode 32D2 of the layer portion 10S3 is thereby electrically connected to the wire WR5. In the layer portion 10S4, the wire WR7 is broadened in part to come into contact with the end face of the fourth branch portion of the electrode 32D2. The electrode 32D2 of the layer portion 10S4 is thereby electrically connected to the wire WR7.

The electrodes 32D1 and 32D2 each correspond to the selective connection electrode according to the invention. The wires WA1 to WA4 correspond to the common wires according to the invention. The wires WC1, WC3, WR1, WR3, WR5, and WR7 are used by different ones of the plurality of layer portions. These wires therefore correspond to the layer-dependent wires according to the invention.

The wires WA1 to WA4, WC1, WC3, WR1, WR3, WR5, and WR7 are used for electrical connection to the semiconductor chip 30. These wires therefore correspond to the chip connection wires according to the invention. The wires WC2, WC4, WR2, WR4, WR6, and WR8 are electrically non-connected to the semiconductor chip 30. These wires therefore correspond to the bypass wires according to the present invention.

Now, the reference relative positional relationship and the specific relative positional relationship in the present embodiment will be described in detail. The reference relative positional relationship will be described first, with reference to FIG. 39. The reference relative positional relationship is such that, when viewed in the direction perpendicular to the top surface 2Ma of the main part 2M of the second subpackage 1U (the Z direction), the plurality of first terminals 4 of the first subpackage 1L and the plurality of first terminals 4 of the second subpackage 1U coincide with each other in position while the plurality of second terminals 5 of the first subpackage 1L and the plurality of second terminals 5 of the second subpackage 1U coincide with each other in position. When in the reference relative positional relationship, terminals 4 and 6 of the subpackage 1L and terminals 5 and 7 of the subpackage 1U that coincide with each other in position when viewed in the Z direction are in contact with each other and electrically connected to each other. In this way, there are formed a plurality of pairs of first and second terminals each of which is made up of one of the plurality of first terminals 4 of the first subpackage 1L and one of the plurality of second terminals 5 of the second subpackage 1U that are in contact with each other and electrically connected to each other.

The specific relative positional relationship shown in FIG. 38 is such that the second subpackage 1U is displaced in the direction parallel to the top surface 2Ma of the main part 2M of the second subpackage 1U with respect to the reference relative positional relationship shown in FIG. 39. In the present embodiment, the specific relative positional relationship is particularly such that the second subpackage 1U is displaced in the Y direction (the second direction) with respect to the reference relative positional relationship.

Combinations of the first terminals 4 of the first subpackage 1L and the second terminals 5 of the second subpackage 1U making up the plurality of pairs of first and second terminals in the specific relative positional relationship are different from those in the reference relative positional relationship. In the example shown in FIG. 38, the second subpackage 1U is displaced in the direction from the side surface 2c of the main body 2 toward the side surface 2d of the main body 2, with respect to the reference relative positional relationship. It should be noted that the specific relative positional relationship may be such that the second subpackage 1U is displaced in the direction from the side surface 2d toward the side surface 2c, with respect to the reference relative positional relationship.

When in the specific relative positional relationship shown in FIG. 38, the plurality of pairs of first and second terminals, each of which is made up of one of the first terminals 4 of the first subpackage 1L and one of the second terminals 5 of the second subpackage 1U that are in contact with each other and electrically connected to each other, are as follows: (4C21, 5C11), (4C22, 5C12), (4C23, 5C13), (4C24, 5C14), (4R21, 5R11), (4R22, 5R12), (4R23, 5R13), (4R24, 5R14), (4R25, 5R15), (4R26, 5R16), (4R27, 5R17), and (4R28, 5R18).

When in a not-shown specific relative positional relationship where the second subpackage 1U is displaced in the direction from the side surface 2d toward the side surface 2c with respect to the reference relative positional relationship, the terminals 5C21 to 5C24, 5R21 to 5R28, and 7A1 to 7A4 of the second subpackage 1U are in contact with and electrically connected to the terminals 4C11 to 4C14, 4R11 to 4R18, and 6A1 to 6A4 of the first subpackage 1L.

As in the first embodiment, there are formed a plurality of pairs of terminals (6A1, 7A1), (6A2, 7A2), (6A3, 7A3), and (6A4, 7A4) in each of which the two terminals are in contact with and electrically connected to each other, across the terminals 6A1 to 6A4 of the first subpackage 1L and the terminals 7A1 to 7A4 of the second subpackage 1U regardless of whether in the reference relative positional relationship or the specific relative positional relationship.

Next, the flow of a plurality of signals in the composite layered chip package 23 shown in FIG. 38 and the composite layered chip package 24 shown in FIG. 39 will be described. FIG. 45 is an explanatory diagram showing the flow of a plurality of signals in the composite layered chip package 23 shown in FIG. 38. FIG. 46 is an explanatory diagram showing the flow of a plurality of signals in the composite layered chip package 24 shown in FIG. 39.

Portions (a) and (b) of FIG. 45 show the terminals 4C11, 4C12, 4C21, 4C22, 5C11, 5C12, 5C21, and 5C22 in the subpackages 1U and 1L of the composite layered chip package 23 shown in FIG. 38 and signals to appear thereon. Portions (a) and (b) of FIG. 46 show the terminals 4C11, 4C12, 4C21, 4C22, 5C11, 5C12, 5C21, and 5C22 in the subpackages 1U and 1L of the composite layered chip package 24 shown in FIG. 39 and signals to appear thereon. Symbols S1 and S2 in FIG. 45 and FIG. 46 represent respective signals.

In each subpackage 1S, the same signal appears on a plurality of terminals that are electrically connected to each other. More specifically, the signals to appear on the terminals 4C21 and 4C22 are the same as those on the terminals 4C12 and 4C11, respectively. The signals to appear on the terminals 5C21 and 5C22 are the same as those on the terminals 5C12 and 5C11, respectively. The signals to appear on the terminals 5C11, 5012, 5C21, and 5022 are the same as those on the terminals 4C11, 4C12, 4C21, and 4C22, respectively.

FIG. 45 shows an example where the signals S2 and S1 are supplied to the terminals 5C11 and 5C12 of the subpackage 1L as shown in portion (b) of FIG. 45. In this case, in the subpackage 1L, the signals S2 and S1 appear on the terminals 4C11 and 4C12, respectively, while the signals S1 and S2 appear on the terminals 4C21 and 4C22, respectively.

When in the specific relative positional relationship shown in FIG. 38, the terminals 5011 and 5C12 of the subpackage 1U are in contact with the terminals 4C21 and 4C22 of the subpackage 1L. Consequently, in the subpackage 1U, as shown in portion (a) of FIG. 45, the signals S1 and S2 are transmitted to the terminals 5011 and 5012. As a result, the signals S1 and S2 appear on the terminals 4C11 and 4C12, respectively.

In each of the layer portions 10S1 and 10S2, the terminals 4C11 and 5C11 are electrically connected to the semiconductor chip 30 through the wire WC1 and the electrode 32D1. As described above, when in the specific relative positional relationship shown in FIG. 38, the signal to appear on the terminals 4C11 and 5011 varies between the subpackages 1S (1L and 1U). Consequently, in the composite layered chip package 23 shown in FIG. 38, the signal associated with the semiconductor chips 30 of the layer portions 1051 and 10S2 through the wire WC1 and the electrodes 32D1 can be varied between the subpackages 1S. In the example shown in FIG. 45, the signal associated with the semiconductor chips 30 of the layer portions 10S1 and 10S2 through the wire WC1 and the electrodes 32D1 in the subpackage 1U is the signal 51, whereas the signal S2 is associated in the subpackage 1L.

On the other hand, when in the reference relative positional relationship shown in FIG. 39, the signals to appear on the terminals 4C11, 4C12, 4C21, 4C22, 5C11, 5C12, 5C21, and 5C22 do not vary between the subpackages 1S as shown in FIG. 46. FIG. 46 shows an example where the signals 51 and S2 are supplied to the terminals 5C11 and 5C12 of the subpackage 1L. In the composite layered chip package 24 shown in FIG. 39, the signal associated with the semiconductor chips 30 of the layer portions 1051 and 10S2 through the wire WC1 and the electrodes 32D1 is the same between the subpackages 1U and 1L.

The mode of signal flow described with reference to FIG. 45 and FIG. 46 also applies to groups of terminals similar to the group of terminals 4C11, 4C12, 4C21, 4C22, 5C11, 5C12, 5C21, and 5C22, such as a group of terminals 4C13, 4C14, 4C23, 4C24, 5C13, 5C14, 5C23, and 5C24.

Now, a description will be made as to the flow of a plurality of signals for the case where the composite layered chip package 23 shown in FIG. 38 is used to construct the memory device shown in FIG. 10. In the subpackages 1U and 1L of the composite layered chip package 23 shown in FIG. 38, the terminals 6A1 and 7A1 are electrically connected to the wire WA1, the terminals 6A2 and 7A2 are electrically connected to the wire WA2, the terminals 6A3 and 7A3 are electrically connected to the wire WA3, and the terminals 6A4 and 7A4 are electrically connected to the wire WA4. As a result, there are formed a plurality of electrical paths that lead from the terminals 6A1-6A4 of the subpackage 1U to the terminals 7A1-7A4 of the subpackage 1L. The plurality of electrical paths constitute parts of the data bus 91 and the one or more common lines 92.

The chip enable signal CE1 is supplied to the terminal 4C11 of the subpackage 1U or the terminal 5C12 of the subpackage 1L. The chip enable signal CE3 is supplied to the terminal 4C12 of the subpackage 1U or the terminal 5C11 of the subpackage 1L. The chip enable signal CE2 is supplied to the terminal 4C13 of the subpackage 1U or the terminal 5C14 of the subpackage 1L. The chip enable signal CE4 is supplied to the terminal 4C14 of the subpackage 1U or the terminal 5C13 of the subpackage 1L.

In the composite layered chip package 23, the chip enable signal CE1 is supplied only to the semiconductor chips 30 of the layer portions 10S1 and 10S2 of the subpackage 1U, i.e., the memory chips MC1 and MC2. The chip enable signal CE2 is supplied only to the semiconductor chips 30 of the layer portions 10S3 and 10S4 of the subpackage 1U, i.e., the memory chips MC3 and MC4. The chip enable signal CE3 is supplied only to the semiconductor chips 30 of the layer portions 10S1 and 10S2 of the subpackage 1L, i.e., the memory chips MC5 and MC6. The chip enable signal CE4 is supplied only to the semiconductor chips 30 of the layer portions 10S3 and 10S4 of the subpackage 1L, i.e., the memory chips MC7 and MC8.

In the layer portion 10S1 of the subpackage 1U, the ready/busy signal R/B1 is output from the electrode 32D2. The signal R/B1 is transmitted to the wire WR1 of the subpackage 1U and is output from the terminal 4R11 of the subpackage 1U or the terminal 5R12 of the subpackage 1L. In the layer portion 10S2 of the subpackage 1U, the ready/busy signal R/B2 is output from the electrode 32D2. The signal R/B2 is transmitted to the wire WR3 of the subpackage 1U and is output from the terminal 4R13 of the subpackage 1U or the terminal 5R14 of the subpackage 1L.

In the layer portion 10S3 of the subpackage 1U, the ready/busy signal R/B3 is output from the electrode 32D2. The signal R/B3 is transmitted to the wire WR5 of the subpackage 1U and is output from the terminal 4R15 of the subpackage 1U or the terminal 5R16 of the subpackage 1L. In the layer portion 10S4 of the subpackage 1U, the ready/busy signal R/B4 is output from the electrode 32D2. The signal R/B4 is transmitted to the wire WR7 of the subpackage 1U and is output from the terminal 4R17 of the subpackage 1U or the terminal 5R18 of the subpackage 1L.

In the layer portion 10S1 of the subpackage 1L, the ready/busy signal R/B5 is output from the electrode 32D2. The signal R/B5 is transmitted to the wire WR1 of the subpackage 1L and is output from the terminal 4R12 of the subpackage 1U or the terminal 5R11 of the subpackage 1L. In the layer portion 10S2 of the subpackage 1L, the ready/busy signal R/B6 is output from the electrode 32D2. The signal R/B6 is transmitted to the wire WR3 of the subpackage 1L and is output from the terminal 4R14 of the subpackage 1U or the terminal 5R13 of the subpackage 1L.

In the layer portion 10S3 of the subpackage 1L, the ready/busy signal R/B7 is output from the electrode 32D2. The signal R/B7 is transmitted to the wire WR5 of the subpackage 1L and is output from the terminal 4R16 of the subpackage 1U or the terminal 5R15 of the subpackage 1L. In the layer portion 10S4 of the subpackage 1L, the ready/busy signal R/B8 is output from the electrode 32D2. The signal R/B8 is transmitted to the wire WR7 of the subpackage 1L and is output from the terminal 4R18 of the subpackage 1U or the terminal 5R17 of the subpackage 1L.

Next, a method for manufacturing the subpackage 1S according to the present embodiment will be described. The manufacturing method is the same as that of the first embodiment up to the step of forming the substructure 110 bonded to the jig 112 as shown in FIG. 22. The substructure 110 bonded to the jig 112 will hereinafter be referred to as a first substructure 110.

Figure 47:
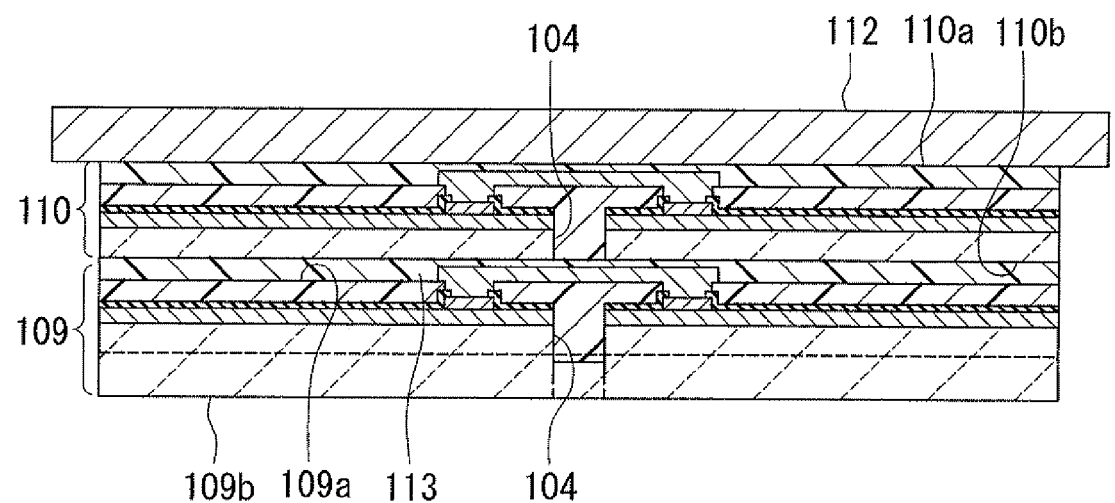
FIG. 47 is cross-sectional view showing a step of a method of manufacturing the stackable chip package according to the third embodiment of the invention.

FIG. 47 shows the next step. In this step, using an insulating adhesive, a pre-polishing substructure 109 is bonded to the first substructure 110 bonded to the jig 112. The pre-polishing substructure 109 is bonded to the first substructure 110 with the first surface 109a arranged to face the polished surface, i.e., the second surface 110b, of the first substructure 110. The pre-polishing substructure 109 bonded to the first substructure 110 will hereinafter be referred to as a second pre-polishing substructure 109. The insulating layer 113 formed of the adhesive between the first substructure 110 and the second pre-polishing substructure 109 covers the plurality of electrodes of the second pre-polishing substructure 109. The insulating layer 113 is to later become part of the insulating portion 31.

Figure 48:
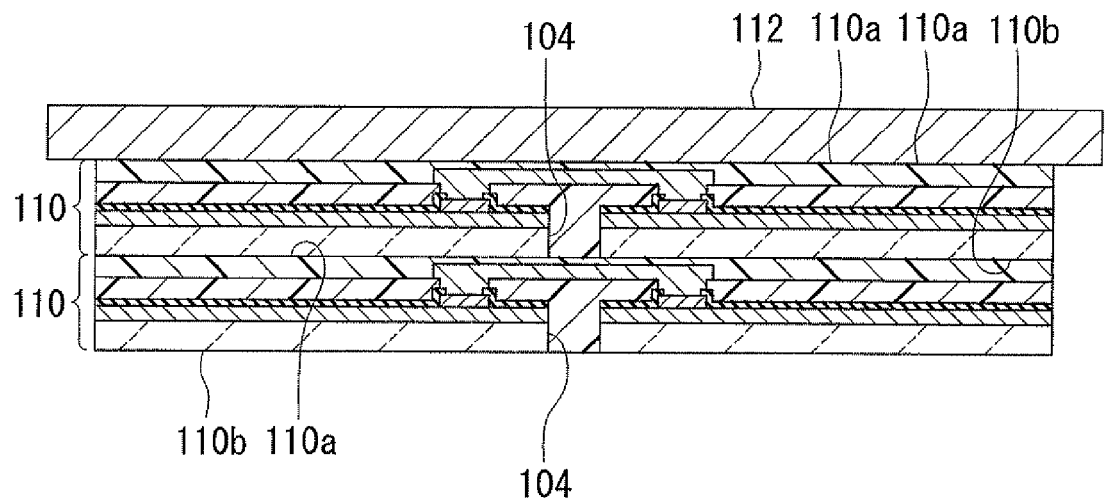
FIG. 48 is a cross-sectional view showing a step that follows the step shown in FIG. 47.

FIG. 48 shows a step that follows the step shown in FIG. 47. In this step, the second surface 109b of the second pre-polishing substructure 109 is polished. The polishing is performed until the plurality of grooves 104 are exposed. The broken line in FIG. 47 indicates the level of the second surface 109b after the polishing. By polishing the second surface 109b of the second pre-polishing substructure 109, the second pre-polishing substructure 109 is reduced in thickness, and a second substructure 110 bonded to the first substructure 110 is thereby formed.

Figure 49:
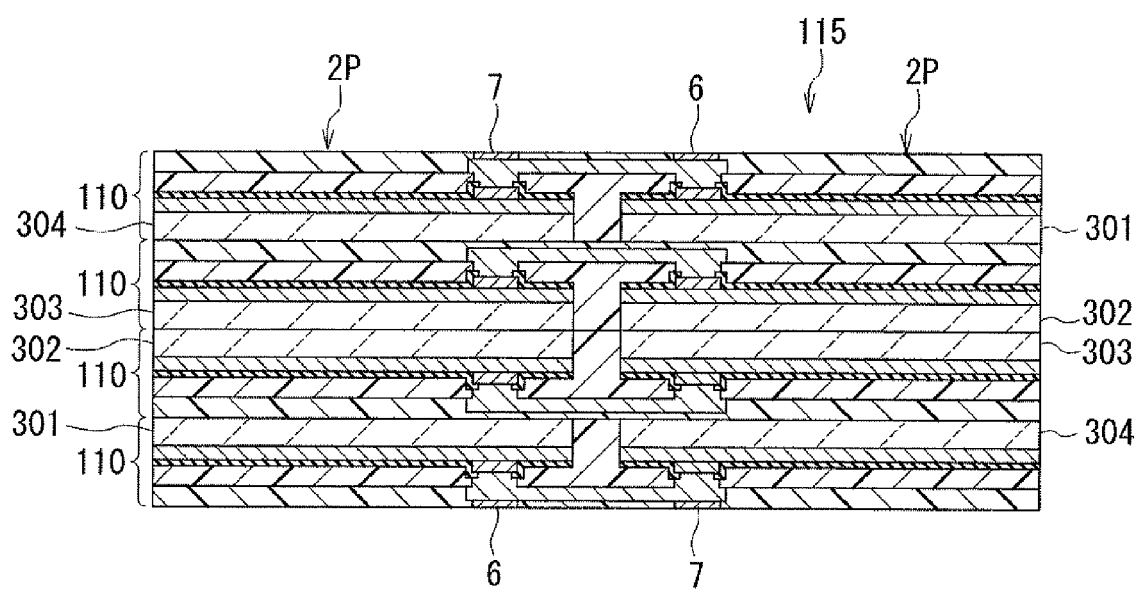
FIG. 49 is a cross-sectional view showing a step that follows the step shown in FIG. 48.

FIG. 49 shows a step that follows the step shown in FIG. 48. In this step, first, two stacks shown in FIG. 48, each including two substructures 110, are prepared. The two stacks will be referred to as first and second stacks. Next, the first and second stacks are bonded to each other with a not-shown insulating adhesive, such that the surfaces of the stacks farther from the jigs 112 (the second surfaces 110b) face each other. A third stack including four substructures 110 is thereby formed. The two jigs 112 are then released from the third stack.

Next, part of the insulating layer 113 of the uppermost substructure 110 in the third stack and part of the insulating layer 113 of the lowermost substructure 110 in the third stack are removed by, for example, etching, to expose the terminal component parts of the plurality of electrodes, and a plurality of conductor pads are then formed. Then, a plurality of conductor layers are formed on the plurality of conductor pads to thereby form the plurality of terminals 4, 5, 6, and 7. Consequently, a first layered substructure 115 including four stacked substructures 110 is formed as shown in FIG. 49. In FIG. 49, the semiconductor chips 30 of the layer portions 10S1 to 10S4 are designated by reference numerals 301, 302, 303, and 304, respectively. The subsequent steps are the same as those that follow the formation of the first layered substructure 115 of the first embodiment.

In the present embodiment, only either the plurality of first terminals 4 or the plurality of second terminals 5 may include the two or more first or second terminals that align in the first direction (the X direction) to form a third terminal row. In such a case also, it is possible to construct a composite layered chip package 23 by arranging a plurality of subpackages 1S in the specific relative positional relationship with each other.

The remainder of configuration, function and effects of the present embodiment are similar to those of the first embodiment.

Fourth Embodiment

Figure 50:
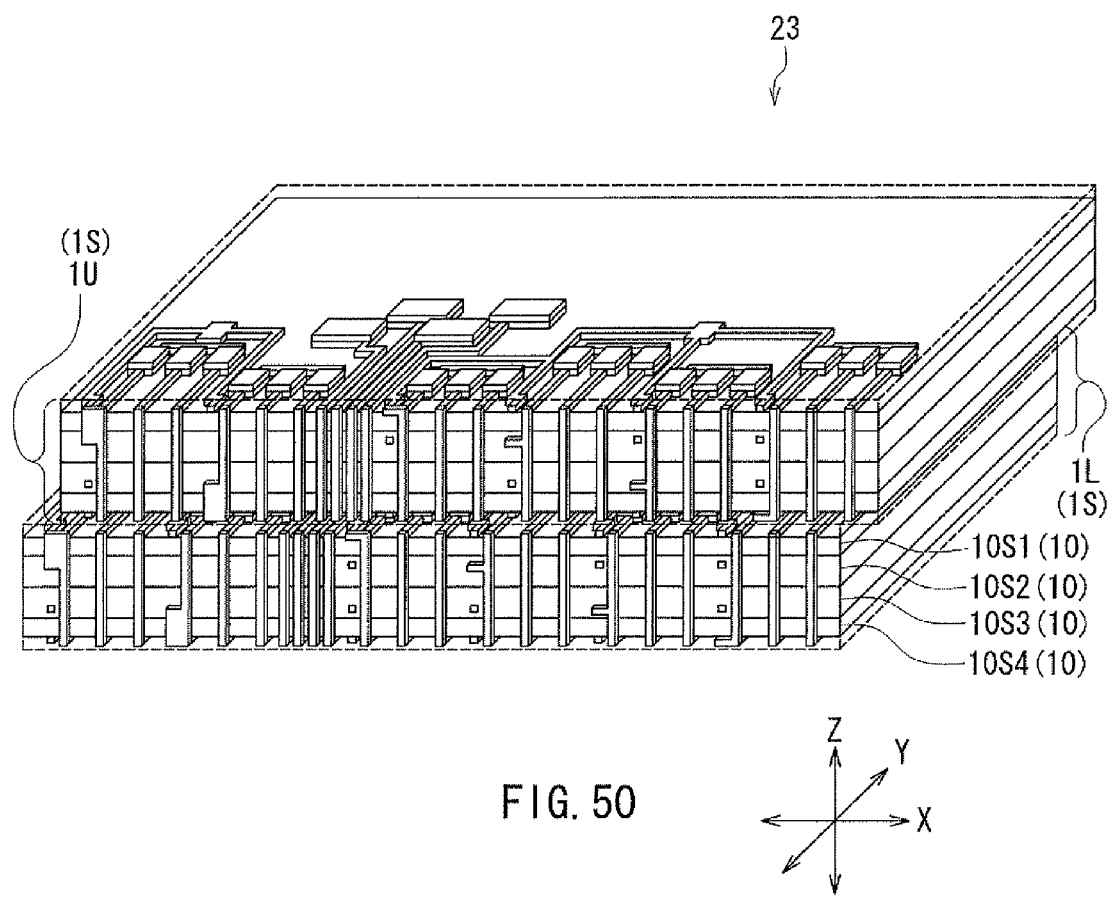
FIG. 50 is a perspective view of a composite layered chip package according to a fourth embodiment of the invention.
Figure 51:
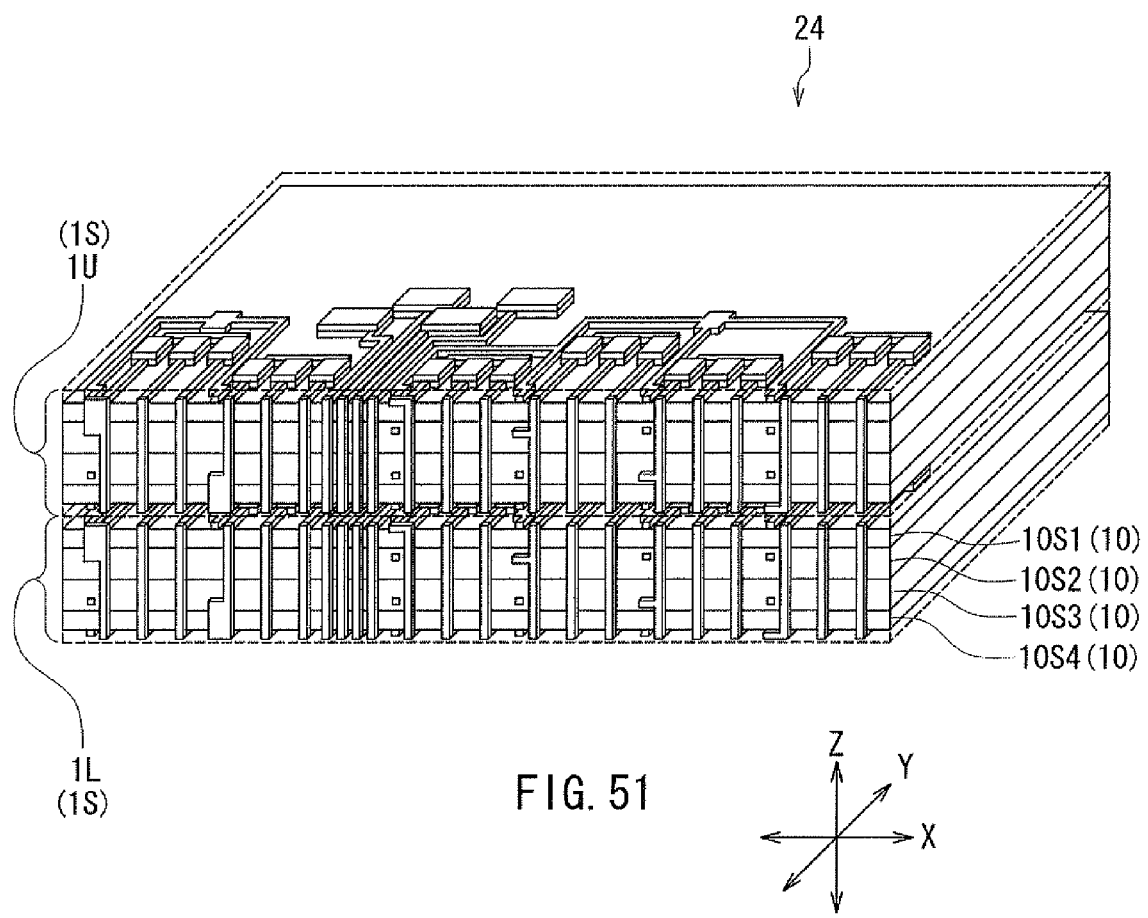
FIG. 51 is a perspective view of a composite layered chip package that is formed by arranging two subpackages of FIG. 50 in the reference relative positional relationship with each other.
Figure 52:
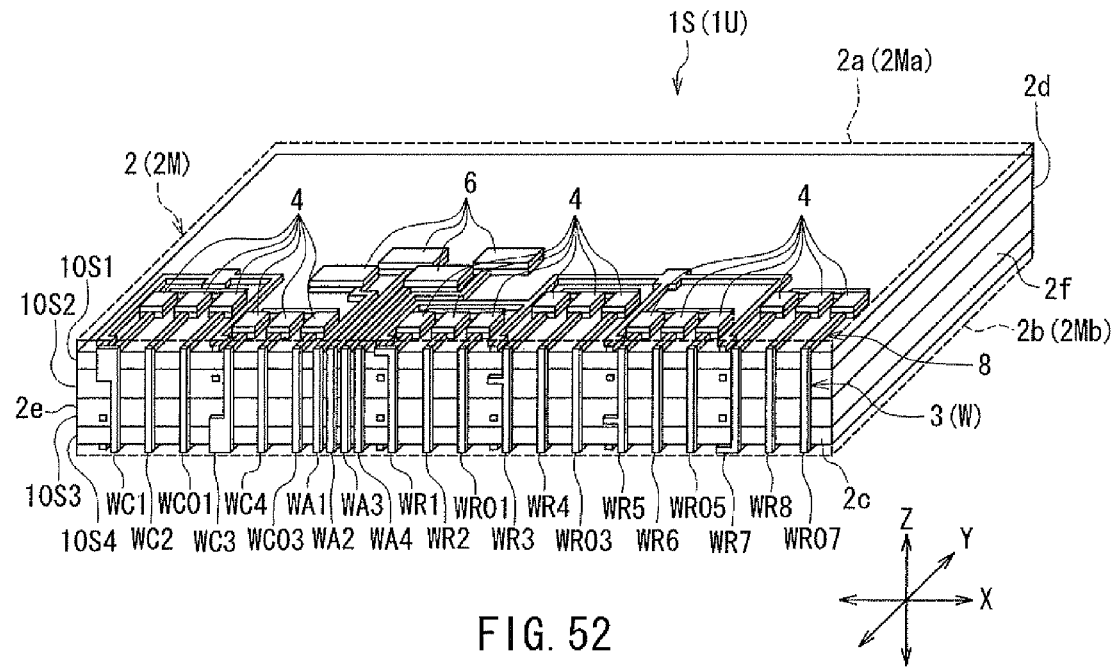
FIG. 52 is a perspective view of a stackable chip package according to the fourth embodiment of the invention.
Figure 53:
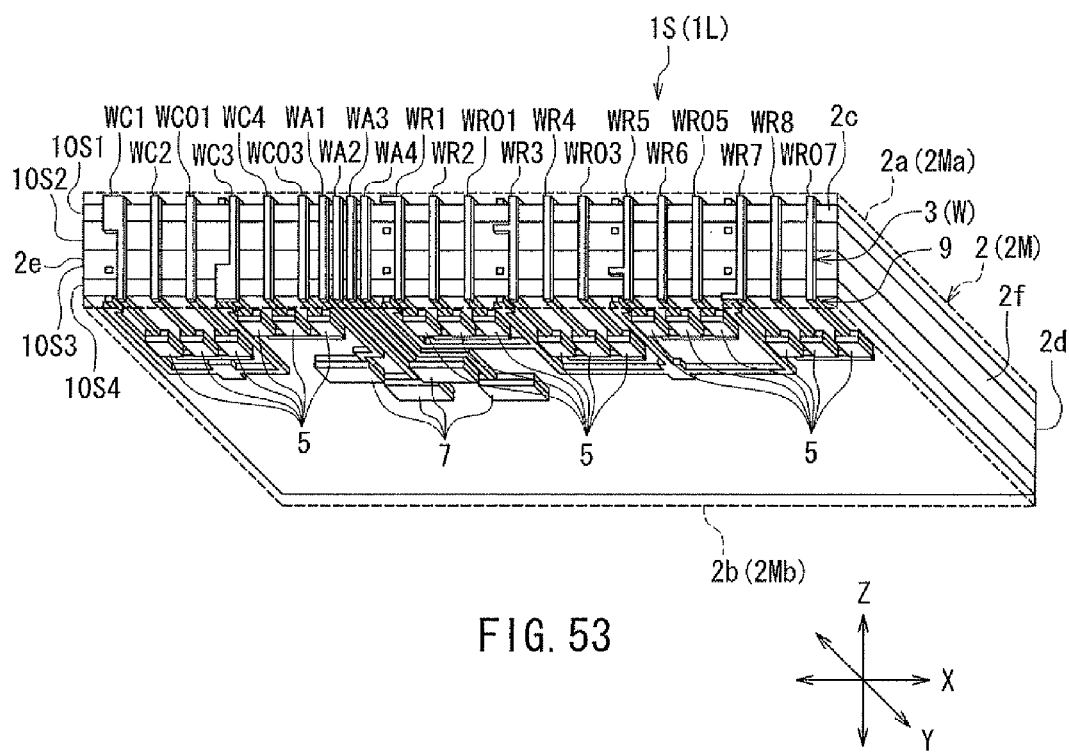
FIG. 53 a perspective view showing the stackable chip package of FIG. 52 as viewed from below.
Figure 54:
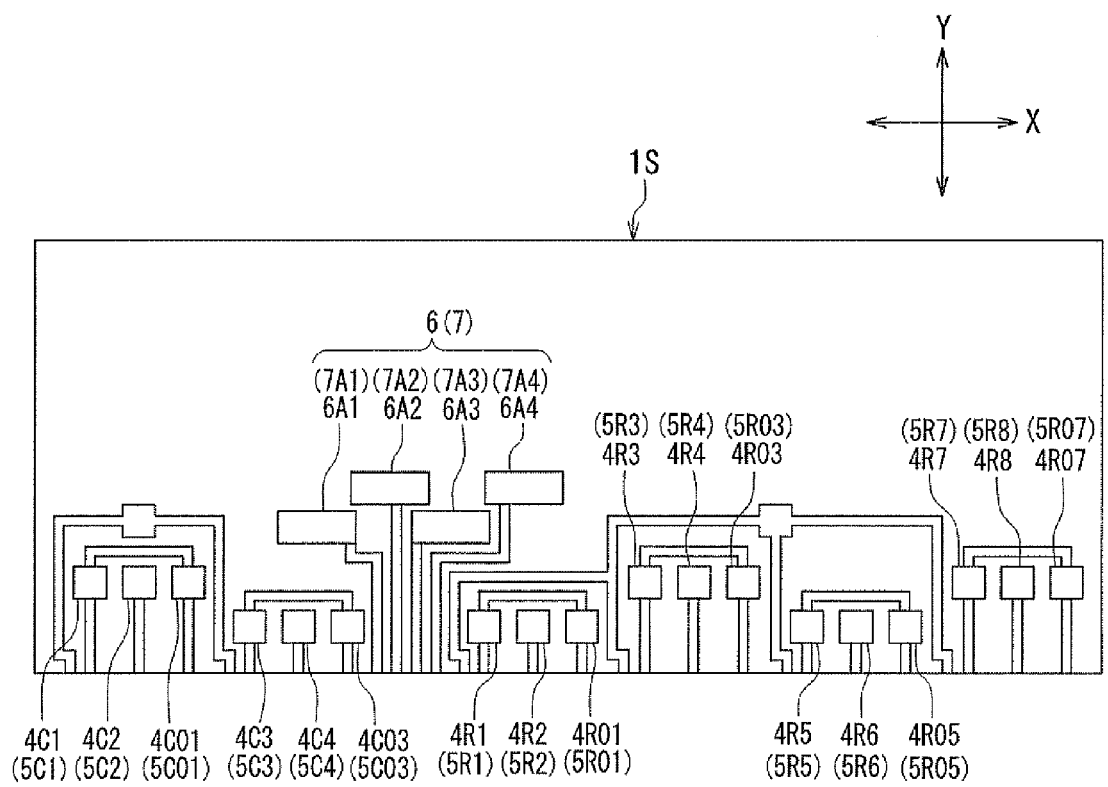
FIG. 54 is a plan view showing a plurality of terminals of the stackable chip package shown in FIG. 52.
Figure 55:
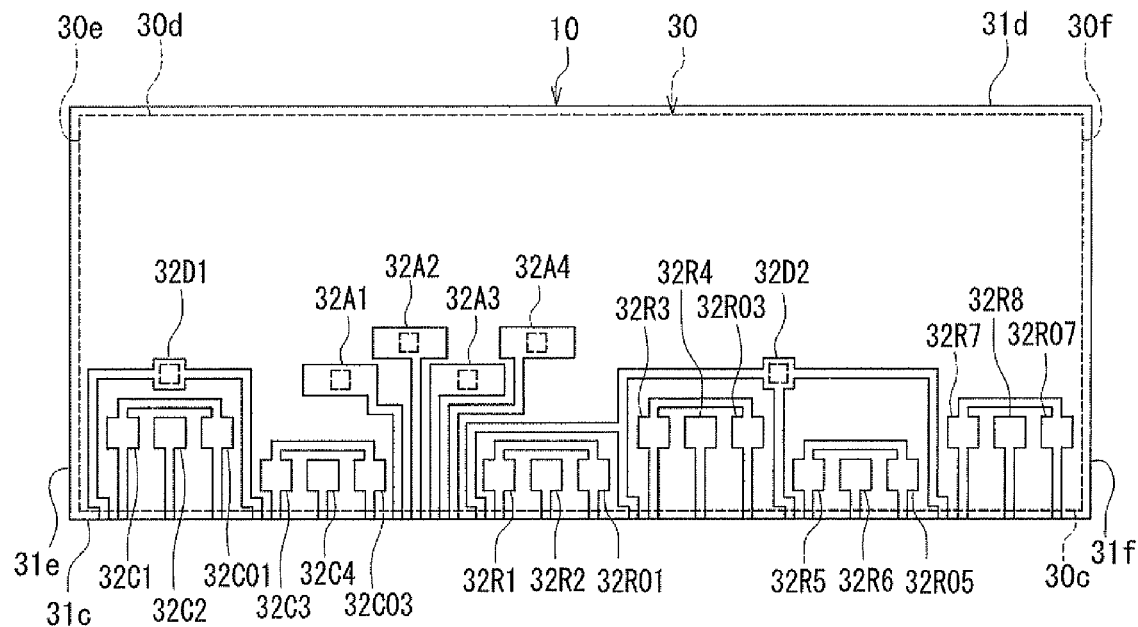
FIG. 55 is a plan view showing a layer portion included in the stackable chip package shown in FIG. 52.
Figure 56:
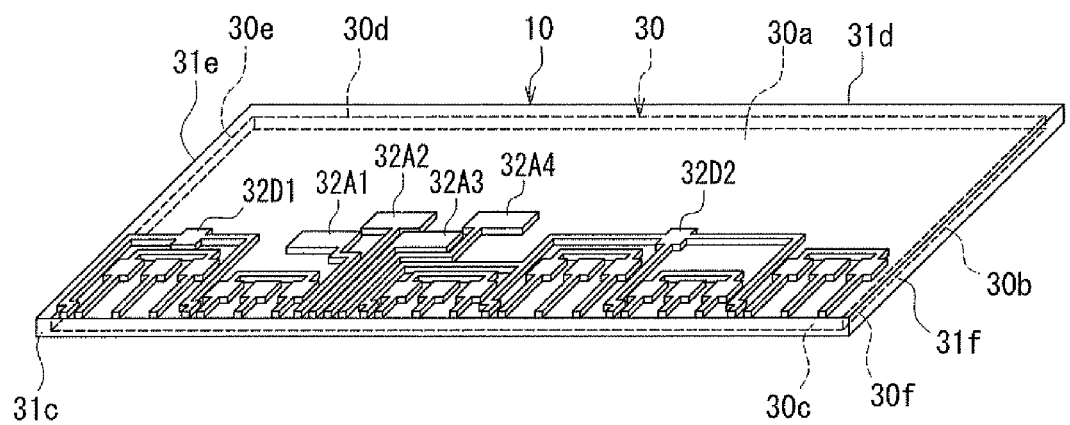
FIG. 56 is a perspective view of the layer portion shown in FIG. 55.

A fourth embodiment of the invention will now be described. First, reference is made to FIG. 50 to FIG. 56 to describe the configurations of a composite layered chip package and a stackable chip package according to the present embodiment. FIG. 50 is a perspective view of the composite layered chip package according to the present embodiment. FIG. 51 is a perspective view of a composite layered chip package that is formed by arranging two subpackages of FIG. 50 in a reference relative positional relationship with each other. FIG. 52 is a perspective view of the stackable chip package according to the present embodiment. FIG. 53 is a perspective view showing the stackable chip package of FIG. 52 as viewed from below. FIG. 54 is a plan view showing a plurality of terminals of the stackable chip package shown in FIG. 52. FIG. 55 is a plan view showing a layer portion included in the stackable chip package shown in FIG. 52. FIG. 56 is a perspective view of the layer portion shown in FIG. 55.

The composite layered chip package 24 shown in FIG. 51 is formed by arranging the two subpackages 1L and 1U in the reference relative positional relationship with each other. The composite layered chip package 23 according to the present embodiment shown in FIG. 50 is formed by arranging the two subpackages 1L and 1U in a specific relative positional relationship, different from the reference relative positional relationship, with each other.

Now, the plurality of terminals 4, 5, 6, and 7 of the present embodiment will be described in detail. As shown in FIG. 52 and FIG. 53, each subpackage 1S is configured so that the plurality of first terminals 4 and the plurality of second terminals 5 are in the same layout when viewed in the direction perpendicular to the top surface 2Ma of the main part 2M (the Z direction), and that the plurality of third terminals 6 and the plurality of fourth terminals 7 are in the same layout when viewed in the Z direction. FIG. 54 shows the shape and arrangement of the plurality of terminals 4, 5, 6, and 7 when viewed in the direction perpendicular to the top surface 2Ma of the main part 2M (the Z direction).

As shown in FIG. 54, the plurality of first terminals 4 include two or more first terminals 4 that align in a first direction (the X direction) to form a first terminal row. The plurality of second terminals 5 include two or more second terminals 5 that align in the first direction (the X direction) to form a second terminal row. At least one of the first and second terminal rows is formed by three or more first or second terminals that align in the first direction (the X direction). Of the three or more first or second terminals, two that are located at opposite ends of the first or second terminal row are electrically connected to each other. In the present embodiment, in particular, the first terminal row is formed by three or more first terminals that align in the first direction (the X direction), and the second terminal row is formed by three or more second terminals that align in the first direction (the X direction). Of the three or more first/second terminals, two that are located at opposite ends of the first/second terminal row are electrically connected to each other.

Specifically, the plurality of first terminals 4 include terminals 4C1, 4C2, 4C01, 4C3, 4C4, 4CO3, 4R1, 4R2, 4R01, 4R3, 4R4, 4R03, 4R5, 4R6, 4R05, 4R7, 4R8, and 4R07. Groups of three first terminals that align in the X direction, namely, (4C1, 4C2, 4C01), (4C3, 4C4, 4CO3), (4R1, 4R2, 4R01), (4R3, 4R4, 4R03), (4R5, 4R6, 4R05), and (4R7, 4R8, 4R07), form respective first terminal rows. In each of the terminal rows, two terminals located at opposite ends are electrically connected to each other.

The plurality of second terminals 5 include terminals 5C1, 5C2, 5C01, 5C3, 5C4, 5CO3, 5R1, 5R2, 5R01, 5R3, 5R4, 5R03, 5R5, 5R6, 5R05, 5R7, 5R8, and 5R07. Groups of three second terminals that align in the X direction, namely, (5C1, 5C2, 5C01), (5C3, 5C4, 5CO3), (5R1, 5R2, 5R01), (5R3, 5R4, 5R03), (5R5, 5R6, 5R05), and (5R7, 5R8, 5R07), form respective second terminal rows. In each of the terminal rows, two terminals located at opposite ends are electrically connected to each other.

In all the terminal rows, the three terminals making up each terminal row are at equal pitches. The amount of displacement of the second subpackage 1U in the specific relative positional relationship with respect to the reference relative positional relationship is the same as the foregoing pitch. As shown in FIG. 54, two terminal rows adjacent in the X direction are offset from each other in the Y direction.

The plurality of third terminals 6 include four terminals 6A1 to 6A4. The plurality of fourth terminals 7 include four terminals 7A1 to 7A4. The shape and arrangement of the terminals 6A1 to 6A4 and 7A1 to 7A4 are the same as in the second embodiment.

In each subpackage 1S, two terminals in each of the following pairs of terminals coincide with each other in position when viewed in the direction perpendicular to the top surface 2Ma of the main part 2M (the Z direction): (4C1, 5C1), (4C2, 5C2), (4C01, 5C01), (4C3, 5C3), (4C4, 5C4), (4CO3, 5CO3), (4R1, 5R1), (4R2, 5R2), (4R01, 5R01), (4R3, 5R3), (4R4, 5R4), (4R03, 5R03), (4R5, 5R5), (4R6, 5R6), (4R05, 5R05), (4R7, 5R7), (4R8, 5R8), (4R07, 5R07), (6A1, 7A1), (6A2, 7A2), (6A3, 7A3), and (6A4, 7A4).

Now, the plurality of wires W will be described in detail. The plurality of wires W include wires WC1 to WC4, WR1 to WR8, and WA1 to WA4 which are the same as those of the second embodiment, and further include wires WC01, WCO3, WR01, WR03, WR05, and WR07. The wires WC01, WCO3, WR01, WR03, WR05, and WRO7 electrically connect two terminals in the respective pairs of terminals (4C01, 5C01), (4CO3, 5CO3), (4R01, 5R01), (4R03, 5R03), (4R05, 5R05), and (4A07, 5R07). Note that the wires WC01, WCO3, WR01, WR03, WR05, and WRO7 may be omitted.

The plurality of electrodes 32 will now be described. In the present embodiment, the plurality of terminals 4 and 6 are formed by using the plurality of electrodes 32 of the layer portion 10S1, and the plurality of terminals 5 and 7 are formed by using the plurality of electrodes 32 of the layer portion 10S4.

FIG. 55 and FIG. 56 illustrate the shape and arrangement of the plurality of electrodes 32 of the layer portions 10S1 and 10S2. The shape and arrangement of the plurality of electrodes 32 of the layer portions 10S3 and 10S4 when viewed from the side of the first surface 30a of each semiconductor chip 30 are a mirror image to those of the plurality of electrodes 32 shown in FIG. 55 and FIG. 56.

The plurality of electrodes 32 include electrodes 32C1 to 32C4, 32C01, 32CO3, 32R1 to 32R8, 32R01, 32R03, 32R05, 32R07, 32A1 to 32A4, 32D1, and 32D2. In FIG. 56, the reference symbols of the electrodes other than the electrodes 32A1 to 32A4, 32D1, and 32D2 are omitted.

The electrodes 32C1 to 32C4, 32C01, 32CO3, 32R1 to 32R8, 32R01, 32R03, 32R05, 32R07, and 32A1 to 32A4 of the layer portion 10S1 include terminal component parts that are used for forming the terminals 4C1 to 4C4, 4C01, 4CO3, 4R1 to 4R8, 4R01, 4R03, 4R05, 4R07, and 6A1 to 6A4.

The electrodes 32C1 to 32C4, 32C01, 32CO3, 32R1 to 32R8, 32R01, 32R03, 32R05, 32R07, and 32A1 to 32A4 of the layer portion 10S4 include terminal component parts that are used for forming the terminals 5C1 to 5C4, 5C01, 5CO3, 5R1 to 5R8, 5R01, 5R03, 5R05, 5R07, and 7A1 to 7A4.

The electrodes 32C1 to 32C4, 32C01, 32CO3, 32R1 to 32R8, 32R01, 32R03, 32R05, 32R07, and 32A1 to 32A4 have respective end faces located in the end face 31c of the insulating portion 31, and are electrically connected to the wires WC1 to WC4, WC01, WCO3, WR1 to WR8, WR01, WR03, WR05, WR07, and WA1 to WA4 via those end faces.

The electrode 32D1 has first and second branch portions. Each of the first and second branch portions has an end face located in the end face 31c of the insulating portion 31. The end face of the first branch portion is located near the end face of the electrode 32C1. The end face of the second branch portion is located near the end face of the electrode 32C3.

The electrode 32D2 has first to fourth branch portions. Each of the first to fourth branch portions has an end face located in the end face 31c of the insulating portion 31. The end face of the first branch portion is located near the end face of the electrode 32R1. The end face of the second branch portion is located near the end face of the electrode 32R3. The end face of the third branch portion is located near the end face of the electrode 32R5. The end face of the fourth branch portion is located near the end face of the electrode 32R7. The electrical connection relationships of the wires WC1, WC3, WR1, WR3, WR5, and WR7 with the electrodes 32D1 and 32D2 are the same as in the third embodiment Now, the reference relative positional relationship and the specific relative positional relationship in the present embodiment will be described in detail. The reference relative positional relationship will be described first, with reference to FIG. 51. The reference relative positional relationship is such that, when viewed in the direction perpendicular to the top surface 2Ma of the main part 2M of the second subpackage 1U (the Z direction), the plurality of first terminals 4 of the first subpackage 1L and the plurality of first terminals 4 of the second subpackage 1U coincide with each other in position while the plurality of second terminals 5 of the first subpackage 1L and the plurality of second terminals 5 of the second subpackage 1U coincide with each other in position. When in the reference relative positional relationship, terminals 4 and 6 of the subpackage 1L and terminals 5 and 7 of the subpackage 1U that coincide with each other in position when viewed in the Z direction are in contact with each other and electrically connected to each other. In this way, there are formed a plurality of pairs of first and second terminals each of which is made up of one of the plurality of first terminals 4 of the first subpackage 1L and one of the plurality of second terminals 5 of the second subpackage 1U that are in contact with each other and electrically connected to each other.

The specific relative positional relationship shown in FIG. 50 is such that the second subpackage 1U is displaced in the direction parallel to the top surface 2Ma of the main part 2M of the second subpackage 1U with respect to the reference relative positional relationship shown in FIG. 51. In the present embodiment, the specific relative positional relationship is particularly such that the second subpackage 1U is displaced in the X direction (the first direction) with respect to the reference relative positional relationship.

Combinations of the first terminals 4 of the first subpackage 1L and the second terminals 5 of the second subpackage 1U making up the plurality of pairs of first and second terminals in the specific relative positional relationship are different from those in the reference relative positional relationship. In the example shown in FIG. 50, the second subpackage 1U is displaced in the direction from the side surface 2e of the main body 2 toward the side surface 2f of the main body 2, with respect to the reference relative positional relationship. It should be noted that the specific relative positional relationship may be such that the second subpackage 1U is displaced in the direction from the side surface 2f toward the side surface 2e, with respect to the reference relative positional relationship.

When in the specific relative positional relationship shown in FIG. 50, the plurality of pairs of first and second terminals, each of which is made up of one of the first terminals 4 of the first subpackage 1L and one of the second terminals 5 of the second subpackage 1U that are in contact with each other and electrically connected to each other, are as follows: (4C2, 5C1), (4C01, 5C2), (4C4, 5C3), (4CO3, 5C4), (4R2, 5R1), (4R01, 5R2), (4R4, 5R3), (4R03, 5R4), (4R6, 5R5), (4R05, 5R6), (4R8, 5R7), and (4R07, 5R8).

When in a not-shown specific relative positional relationship where the second subpackage 1U is displaced in the direction from the side surface 2f toward the side surface 2e with respect to the reference relative positional relationship, the terminals 5C2, 5C01, 5C4, 5CO3, 5R2, 5R01, 5R4, 5R03, 5R6, 5R05, 5R8, 5R07, and 7A1 to 7A4 of the second subpackage 1U are in contact with and electrically connected to the terminals 4C1 to 4C4, 4R1 to 4R8, and 6A1 to 6A4 of the first subpackage 1L.

As in the second embodiment, a plurality of pairs of terminals (6A1, 7A1), (6A2, 7A2), (6A3, 7A3), and (6A4, 7A4) in each of which the two terminals are in contact with and electrically connected to each other are formed across the terminals 6A1 to 6A4 of the first subpackage 1L and the terminals 7A1 to 7A4 of the second subpackage 1U regardless of whether in the reference relative positional relationship or the specific relative positional relationship.

Figure 57:
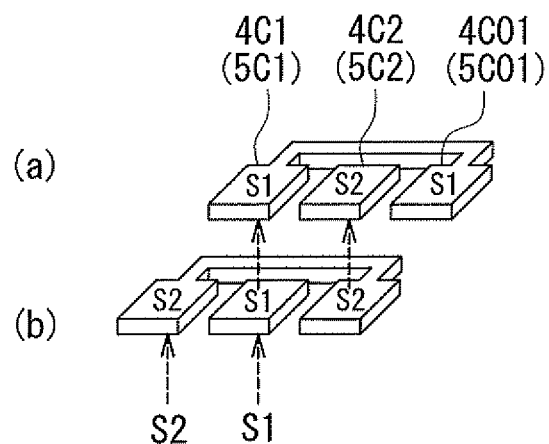
FIG. 57 is an explanatory diagram showing the flow of a plurality of signals in the composite layered chip package shown in FIG. 50.
Figure 58:
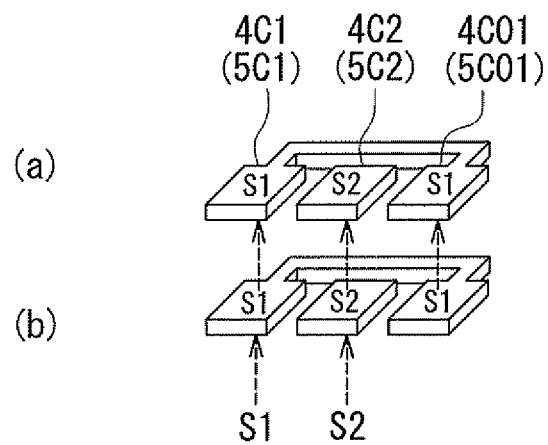
FIG. 58 is an explanatory diagram showing the flow of a plurality of signals in the composite layered chip package shown in FIG. 51.

Next, the flow of a plurality of signals in the composite layered chip package 23 shown in FIG. 50 and the composite layered chip package 24 shown in FIG. 51 will be described. FIG. 57 is an explanatory diagram showing the flow of a plurality of signals in the composite layered chip package 23 shown in FIG. 50. FIG. 58 is an explanatory diagram showing the flow of a plurality of signals in the composite layered chip package 24 shown in FIG. 51.

Portions (a) and (b) of FIG. 57 show the terminals 4C1, 4C2, 4C01, 5C1, 5C2, and 5C01 in the subpackages 1U and 1L of the composite layered chip package 23 shown in FIG. 50 and signals to appear thereon. Portions (a) and (b) of FIG. 58 show the terminals 4C1, 4C2, 4C01, 5C1, 5C2, and 5C01 in the subpackages 1U and 1L of the composite layered chip package 24 shown in FIG. 51 and signals to appear thereon. Symbols S1 and S2 in FIG. 57 and FIG. 58 represent respective signals.

In each subpackage 1S, the same signal appears on a plurality of terminals that are electrically connected to each other. More specifically, the signal to appear on the terminal 4C01 is the same as that on the terminal 4C1. The signal to appear on the terminal 5C01 is the same as that on the terminal 5C1. The signals to appear on the terminals 5C1, 5C2, and 5C01 are the same as those on the terminals 4C1, 4C2, and 4C01, respectively.

FIG. 57 shows an example where the signals S2 and S1 are supplied to the terminals 5C1 and 5C2 of the subpackage 1L as shown in portion (b) of FIG. 57. In this case, in the subpackage 1L, the signals S2, S1, and S2 appear on the terminals 4C1, 4C2, and 4C01, respectively.

When in the specific relative positional relationship shown in FIG. 50, the terminals 5C1 and 5C2 of the subpackage 1U are in contact with the terminals 4C2 and 4C01 of the subpackage 1L. Consequently, in the subpackage 1U, as shown in portion (a) of FIG. 57, the signals S1 and S2 are transmitted to the terminals 5C1 and 5C2. As a result, the signals S1, S2, and S1 appear on the terminals 4C1, 4C2, and 4C01, respectively.

In each of the layer portions 10S1 and 10S2, the terminals 4C1 and 5C1 are electrically connected to the semiconductor chip 30 through the wire WC1 and the electrode 32D1. As described above, when in the specific relative positional relationship shown in FIG. 50, the signal to appear on the terminals 4C1 and 5C1 varies between the subpackages 1S (1L and 1U). Consequently, in the composite layered chip package 23 shown in FIG. 50, the signals associated with the semiconductor chips 30 of the respective corresponding layers of different subpackages 1S through the wire WC1 and the electrodes 32D1 can be varied between the subpackages 1S. In the example shown in FIG. 57, the signal associated with the semiconductor chips 30 of the layer portions 10S1 and 10S2 through the wire WC1 and the electrodes 32D1 in the subpackage 1U is the signal S1, whereas the signal S2 is associated in the subpackage 1L.

On the other hand, when in the reference relative positional relationship shown in FIG. 51, the signals to appear on the terminals 4C1, 4C2, 4C01, 5C1, 5C2, and 5C01 do not vary between the subpackages 1S as shown in FIG. 58. FIG. 58 shows an example where the signals S1 and S2 are supplied to the terminals 5C1 and 5C2 of the subpackage 1L. In the composite layered chip package 24 shown in FIG. 51, the signal associated with the semiconductor chips 30 of the layer portions 10S1 and 10S2 through the wire WC1 and the electrodes 32D1 is the same between the subpackages 1U and 1L.

The mode of signal flow described with reference to FIG. 57 and FIG. 58 also applies to groups of terminals similar to the group of terminals 4C1, 4C2, 4C01, 5C1, 5C2, and 5C01, such as a group of terminals 4C3, 4C4, 4CO3, 5C3, 5C4, and 5CO3.

The present embodiment may be configured so that only one of the first and second terminal rows is formed by three or more first or second terminals that align in the first direction (the X direction) and, of the three or more first or second terminals, two that are located at opposite ends of the first or second terminal row are electrically connected to each other. In such a case also, it is possible to construct a composite layered chip package 23 by arranging a plurality of subpackages 1S in the specific relative positional relationship with each other.

The remainder of configuration, function and effects of the present embodiment are similar to those of the third embodiment.

Fifth Embodiment

Figure 59:
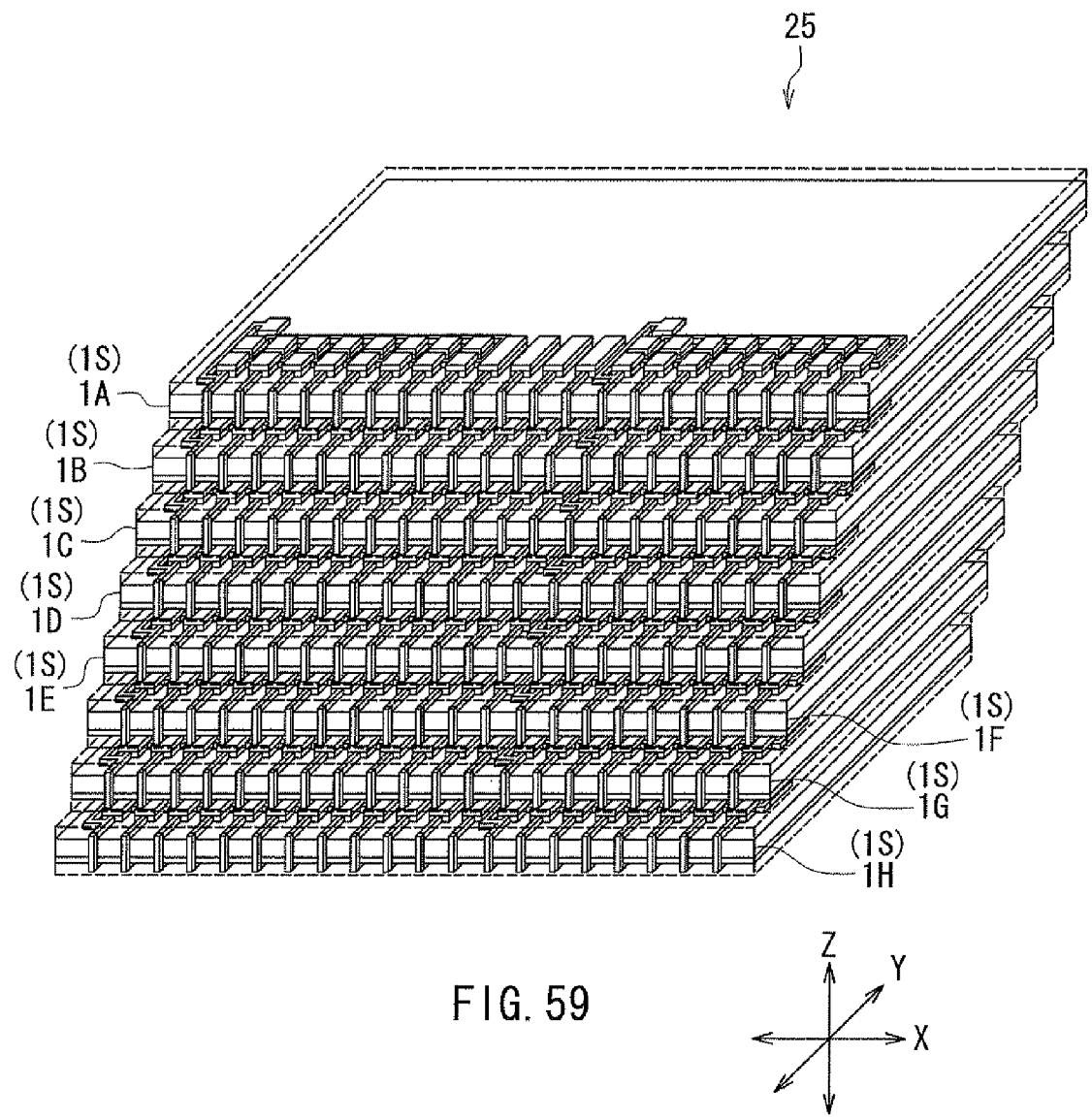
FIG. 59 is a perspective view of a composite layered chip package according to a fifth embodiment of the invention.
Figure 61:
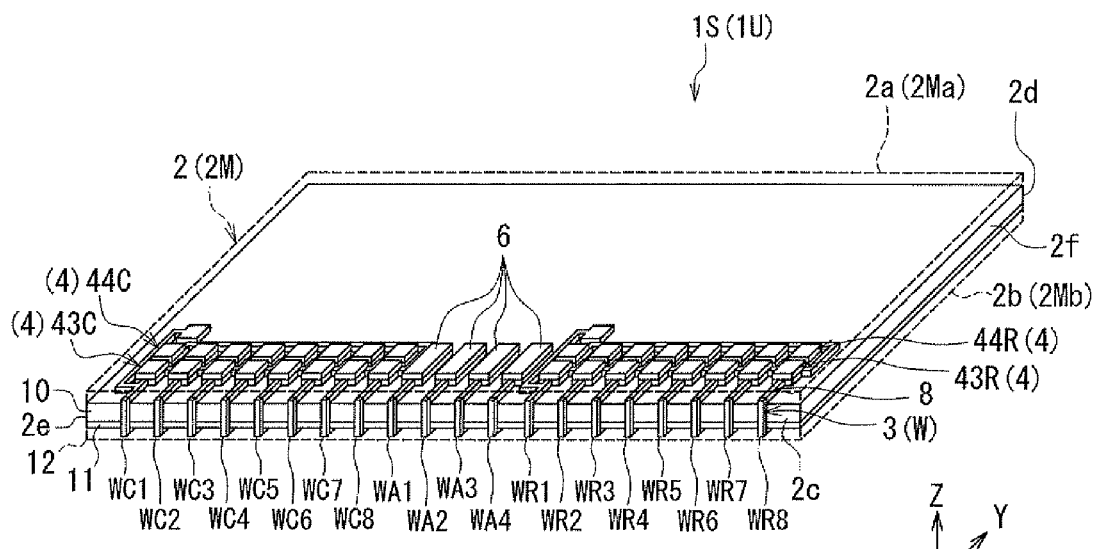
FIG. 61 is a perspective view of a stackable chip package according to the fifth embodiment of the invention.
Figure 62:
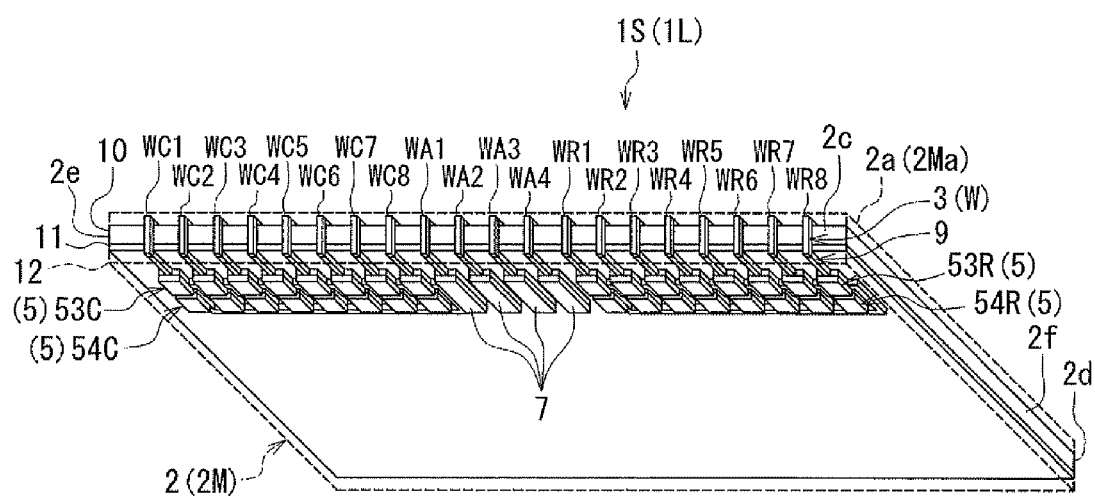
FIG. 62 a perspective view showing the stackable chip package of FIG. 61 as viewed from below.
Figure 63:
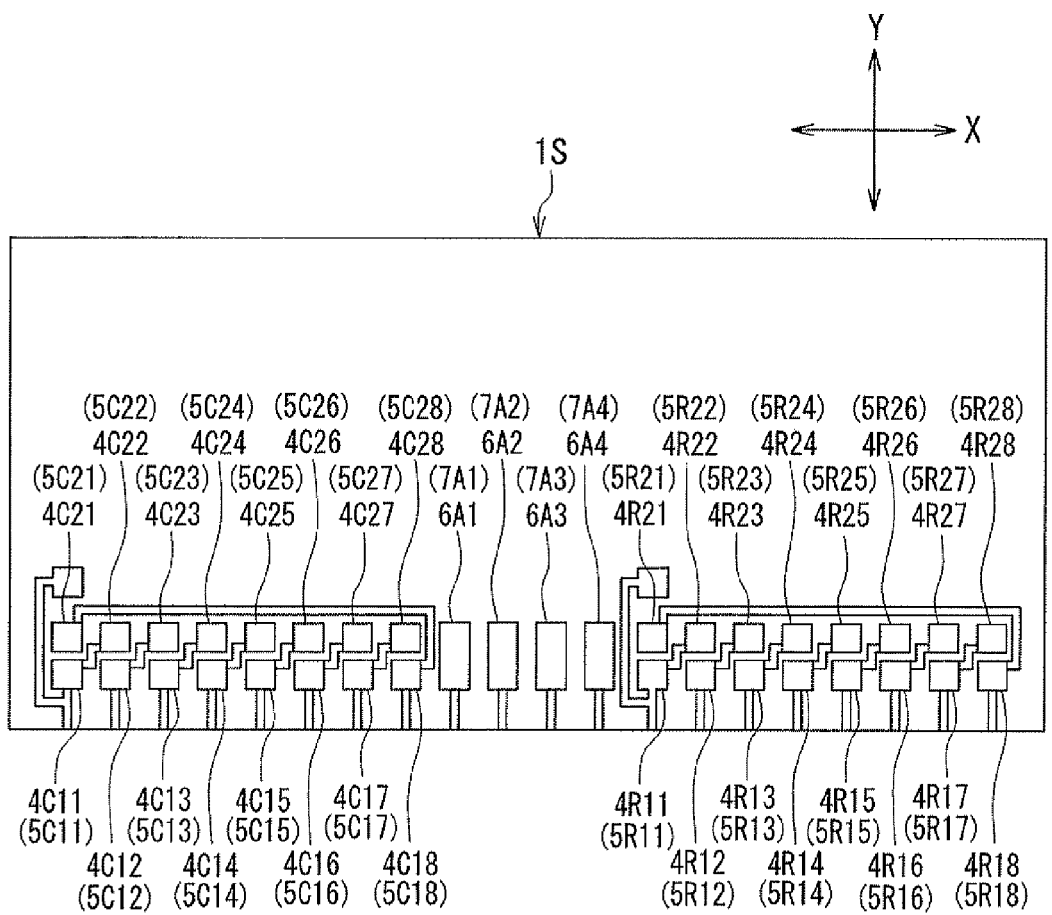
FIG. 63 is a plan view showing a plurality of terminals of the stackable chip package shown in FIG. 61.
Figure 64:
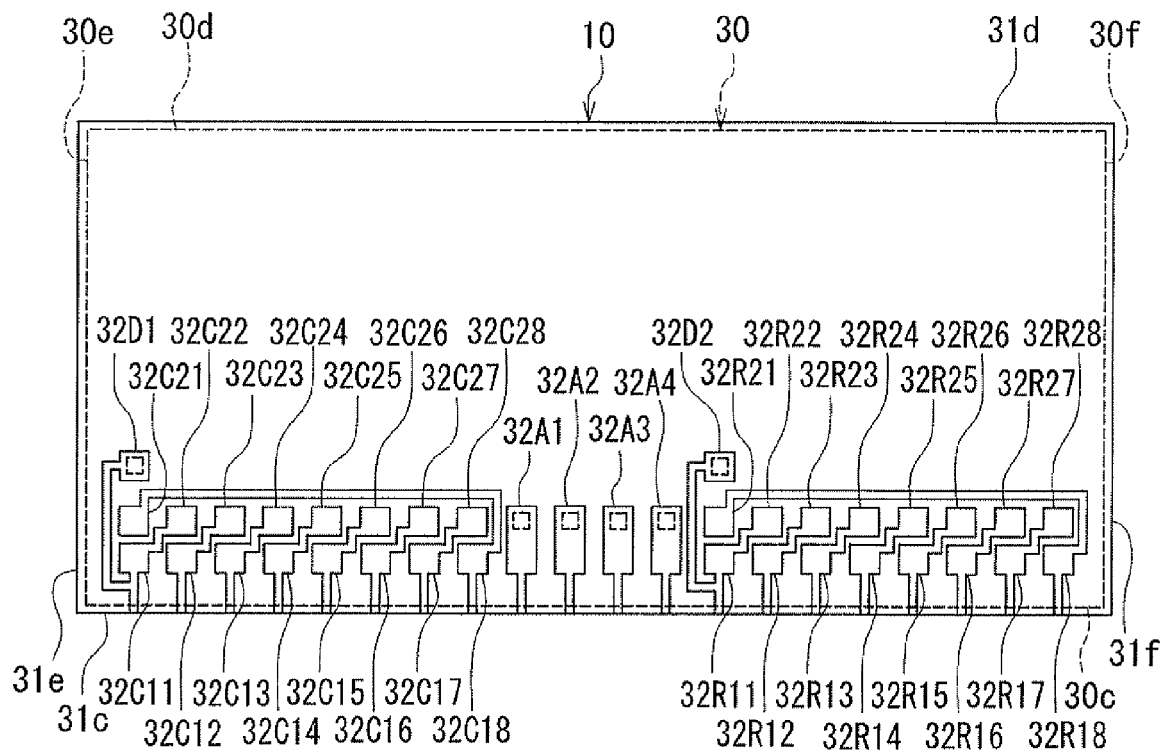
FIG. 64 is a plan view showing a layer portion included in the stackable chip package shown in FIG. 61.
Figure 65:
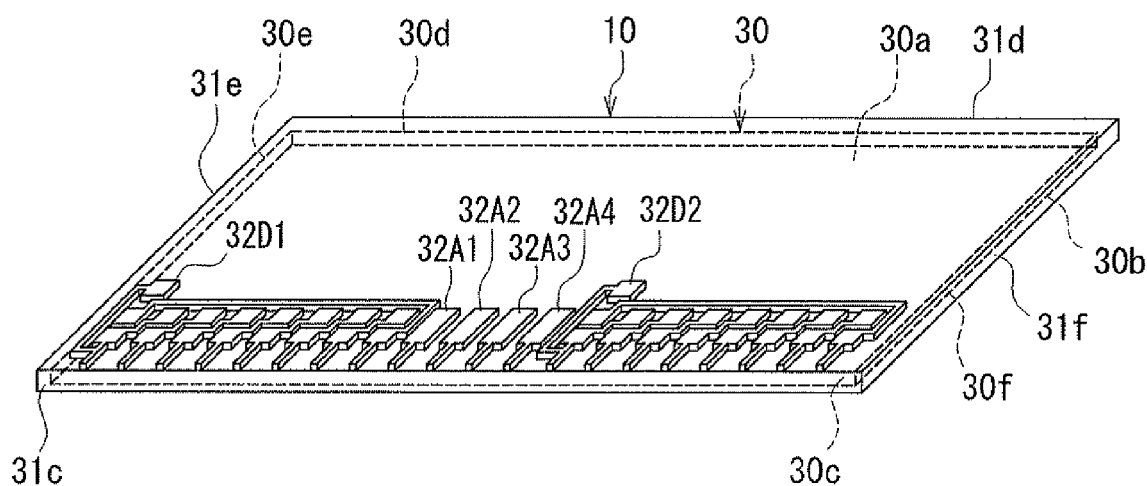
FIG. 65 is a perspective view of the layer portion shown in FIG. 64.

A fifth embodiment of the invention will now be described. First, reference is made to FIG. 59 to FIG. 65 to describe the configurations of a composite layered chip package and a stackable chip package according to the present embodiment. FIG. 59 is a perspective view of the composite layered chip package according to the present embodiment. FIG. 60 is a perspective view of a composite layered chip package that is formed by arranging eight subpackages of FIG. 59 in a reference relative positional relationship with each other. FIG. 61 is a perspective view of the stackable chip package according to the present embodiment. FIG. 62 is a perspective view showing the stackable chip package of FIG. 61 as viewed from below. FIG. 63 is a plan view showing a plurality of terminals of the stackable chip package shown in FIG. 61. FIG. 64 is a plan view showing a layer portion included in the stackable chip package shown in FIG. 61. FIG. 65 is a perspective view of the layer portion shown in FIG. 64.

The composite layered chip package 25 according to the present embodiment shown in FIG. 59 includes eight subpackages stacked on each other. Hereinafter, the eight subpackages will be designated by reference symbols 1A to 1H in order from the top as shown in FIG. 59. In the composite layered chip package 25, any two vertically adjacent subpackages are electrically connected to each other. Of any two vertically adjacent subpackages, the lower subpackage is a first subpackage 1L and the upper subpackage is a second subpackage 1U. Any subpackage will be designated by reference symbol 1S. Each subpackage 1S is the stackable chip package according to the present embodiment.

The composite layered chip package 26 shown in FIG. 60 is formed by arranging the eight subpackages 1A to 1H in the reference relative positional relationship with each other. The composite layered chip package 25 according to the present embodiment shown in FIG. 59 is formed by arranging the eight subpackages 1A to 1H in a specific relative positional relationship, different from the reference relative positional relationship, with each other.

As shown in FIG. 61 and FIG. 62, the subpackage 1S or the stackable chip package according to the present embodiment includes a main body 2 and wiring 3. The main body 2 has a main part 2M. The wiring 3 includes a plurality of wires W. The main part 2M of the present embodiment includes only a single layer portion 10. The layer portion 10 is arranged with the first surface 30a of the semiconductor chip 30 upward.

The main part 2M further includes an insulating layer 11. The insulating layer 11 has a top surface bonded to the second surface 30b of the semiconductor chip 30, and a bottom surface opposite to the top surface. In the present embodiment, the plurality of terminals 5 and 7 and the bottom wiring 9 are formed on the bottom surface of the insulating layer 11. The bottom wiring 9 is covered with an insulating portion 12. In FIG. 61 and FIG. 62, the insulating portion 12 is shown by broken lines.

Now, the plurality of terminals 4, 5, 6, and 7 of the present embodiment will be described in detail. As shown in FIG. 61 and FIG. 62, each subpackage 1S is configured so that the plurality of first terminals 4 and the plurality of second terminals 5 are in the same layout when viewed in the direction perpendicular to the top surface 2Ma of the main part 2M (the Z direction), and that the plurality of third terminals 6 and the plurality of fourth terminals 7 are in the same layout when viewed in the Z direction. FIG. 63 shows the shape and arrangement of the plurality of terminals 4, 5, 6, and 7 when viewed in the direction perpendicular to the top surface 2Ma of the main part 2M (the Z direction).

As shown in FIG. 63, the plurality of first terminals 4 include two or more first terminals 4 that align in a first direction (the X direction) to form a first terminal row. Specifically, the plurality of first terminals 4 include eight first terminals 4C11 to 4C18 that align in the X direction to form a terminal row 43C (see FIG. 61), and eight first terminals 4R11 to 4R18 that align in the X direction to form a terminal row 43R (see FIG. 61). Each of the terminal rows 43C and 43R corresponds to the first terminal row.

The plurality of second terminals 5 include two or more second terminals 5 that align in the first direction to form a second terminal row. Specifically, the plurality of second terminals 5 include eight second terminals 5C11 to 5C18 that align in the X direction to form a terminal row 53C (see FIG. 62), and eight second terminals 5R11 to 5R18 that align in the X direction to form a terminal row 53R (see FIG. 62). Each of the terminal rows 53C and 53R corresponds to the second terminal row.

At least either the plurality of first terminals 4 or the plurality of second terminals 5 further include other two or more first or second terminals that align in the first direction (the X direction) to form a third terminal row. The third terminal row is adjacent to the first or second terminal row in a second direction (the Y direction) orthogonal to the first direction (the X direction). In the present embodiment, in particular, the plurality of first terminals 4 include other two or more first terminals that align in the first direction (the X direction) to form a third terminal row, and the plurality of second terminals 5 include other two or more second terminals that align in the first direction (the X direction) to form a third terminal row.

Specifically, the plurality of first terminals 4 include eight first terminals 4C21 to 4C28 that align in the X direction to form a terminal row 44C (see FIG. 61), and eight first terminals 4R21 to 42R28 that align in the X direction to form a terminal row 44R (see FIG. 61). The terminal row 44C is adjacent to the terminal row 43C in the Y direction. The terminal row 44R is adjacent to the terminal row 43R in the Y direction. Each of the terminal rows 44C and 44R corresponds to the third terminal row.

A plurality of pairs of terminals are formed across a first terminal row and an adjacent third terminal row, each of the plurality of pairs of terminals being made up of two terminals that are electrically connected to each other. The two terminals are one of the two or more first terminals that form the first terminal row and one of the other two or more first terminals that form the third terminal row, the ones being non-adjacent to each other in the second direction (the Y direction). Specifically, across the first terminal row and the third terminal row, there are formed the following pairs of two electrically-connected terminals: (4C11, 4C22), (4C12, 4C23), (4C13, 4C24), (4C14, 4C25), (4C15, 4C26), (4C16, 4C27), (4C17, 4C28), (4C18, 4C21), (4R11, 4R22), (4R12, 4R23), (4R13, 4R24), (4R14, 4R25), (4R15, 4R26), (4R16, 4R27), (4R17, 4R28), and (4R18, 4R21).

The plurality of second terminals 5 include eight second terminals 5C21 to 5C28 that align in the X direction to form a terminal row 54C (see FIG. 62), and eight second terminals 5R21 to 5R28 that align in the X direction to form a terminal row 54R (see FIG. 62). The terminal row 54C is adjacent to the terminal row 53C in the Y direction. The terminal row 54R is adjacent to the terminal row 53R in the Y direction. Each of the terminal rows 54C and 54R corresponds to the third terminal row.

A plurality of pairs of terminals are formed across a second terminal row and an adjacent third terminal row, each of the plurality of pairs of terminals being made up of two terminals that are electrically connected to each other. The two terminals are one of the two or more second terminals that form the second terminal row and one of the other two or more second terminals that form the third terminal row, the ones being non-adjacent to each other in the second direction (the Y direction). Specifically, across the second terminal row and the third terminal row, there are formed the following pairs of two electrically-connected terminals: (sell, 5C22), (5C12, 5C23), (5C13, 5C24), (5C14, 5C25), (5C15, 5C26), (5C16, 5C27), (5C17, 5C28), (5C18, 5C21), (5R11, 5R22), (5R12, 5R23), (5R13, 5R24), (5R14, 5R25), (5R15, 5R26), (5R16, 5R27), (5R17, 5R28), and (5R18, 5R21).

The plurality of third terminals 6 include four terminals 6A1 to 6A4. The plurality of fourth terminals 7 include four terminals 7A1 to 7A4. The shape and arrangement of the terminals 6A1 to 6A4 and 7A1 to 7A4 are the same as in the first embodiment.

In each subpackage 1S, two terminals in each of the following pairs of terminals coincide with each other in position when viewed in the direction perpendicular to the top surface 2Ma of the main part 2M (the Z direction): (4C11, 5C11), (4C12, 5C12), (4C13, 5C13), (4C14, 5C14), (4C15, 5C15), (4C16, 5C16), (4C17, 5C17), (4C18, 5C18), (4R11, 5R11), (4R12, 5R12), (4R13, 5R13), (4R14, 5R14), (4R15, 5R15), (4R16, 5R16), (4R17, 5R17), (4R18, 5R18), (4C21, 5C21), (4C22, 5C22), (4C23, 5023), (4C24, 5C24), (4C25, 5C25), (4C26, 5C26), (4C27, 5C27), (4C28, 5C28), (4R21, 5R21), (4R22, 5R22), (4R23, 5R23), (4R24, 5R24), (4R25, 5R25), (4R26, 5R26), (4R27, 5R27), (4R28, 5R28), (6A1, 7A1), (6A2, 7A2), (6A3, 7A3), and (6A4, 7A4).

The plurality of wires W are disposed on the side surface 2c of the main body 2. The plurality of wires W include wires WC1, WC2, WC3, WC4, WC5, WC6, WC7, WC8, WR1, WR2, WR3, WR4, WR5, WR6, WR7, WR8, WA1, WA2, WA3, and WA4 that electrically connect two terminals in the respective pairs of terminals (4C11, 5C11), (4C12, 5012), (4C13, 5C13), (4C14, 5C14), (4C15, 5C15), (4C16, 5C16), (4C17, 5C17), (4C18, 5C18), (4R11, 5R11), (4R12, 5R12), (4R13, 5R13), (4R14, 5R14), (4R15, 5R15), (4R16, 5R16), (4R17, 5R17), (4R18, 5R18), (6A1, 7A1), (6A2, 7A2), (6A3, 7A3), and (6A4, 7A4).

The plurality of electrodes 32 will now be described. In the present embodiment, the plurality of terminals 4 and 6 are formed by using the plurality of electrodes 32 of the layer portion 10. FIG. 64 and FIG. 65 show the shape and arrangement of the plurality of electrodes 32. The plurality of electrodes 32 include electrodes 32C11 to 32C18, 32C21 to 32028, 32R11 to 32R18, 32R21 to 32R28, 32A1 to 32A4, 32D1, and 32D2. In FIG. 65, the reference symbols of the electrodes other than the electrodes 32A1 to 32A4, 32D1, and 32D2 are omitted. The electrodes 32C11 to 32C18, 32R11 to 32R18, 32C21 to 32C28, 32R21 to 32R28, and 32A1 to 32A4 include terminal component parts that are used for forming the terminals 4C11 to 4C18, 4R11 to 4R18, 4C21 to 4C28, 4R21 to 4R28, and 6A1 to 6A4.

The electrodes 32C11 to 32C18, 32R11 to 32R18, and 32A1 to 32A4 have respective end faces located in the end face 31c of the insulating portion 31, and are electrically connected to the wires WC1 to WC8, WR1 to WR8, and WA1 to WA4 via those end faces. In the present embodiment, the electrode 32D1 is electrically connected to the electrode 32C11, while the electrode 32D2 is electrically connected to the electrode 32R11.

Now, the reference relative positional relationship and the specific relative positional relationship in the present embodiment will be described in detail. The reference relative positional relationship will be described first, with reference to FIG. 60. The reference relative positional relationship is such that, when viewed in the direction perpendicular to the top surface 2Ma of the main part 2M of the second subpackage 1U (the Z direction), the plurality of first terminals 4 of the first subpackage 1L and the plurality of first terminals 4 of the second subpackage 1U coincide with each other in position while the plurality of second terminals 5 of the first subpackage 1L and the plurality of second terminals 5 of the second subpackage 1U coincide with each other in position. When in the reference relative positional relationship, terminals 4 and 6 of the subpackage 1L and terminals 5 and 7 of the subpackage 1U that coincide with each other in position when viewed in the Z direction are in contact with each other and electrically connected to each other. In this way, there are formed a plurality of pairs of first and second terminals each of which is made up of one of the plurality of first terminals 4 of the first subpackage 1L and one of the plurality of second terminals 5 of the second subpackage 1U that are in contact with each other and electrically connected to each other.

The specific relative positional relationship shown in FIG. 59 is such that the second subpackage 1U is displaced in the direction parallel to the top surface 2Ma of the main part 2M of the second subpackage 1U with respect to the reference relative positional relationship shown in FIG. 60. In the present embodiment, the specific relative positional relationship is particularly such that the second subpackage 1U is displaced in the Y direction (the second direction) with respect to the reference relative positional relationship.

Combinations of the first terminals 4 of the first subpackage 1L and the second terminals 5 of the second subpackage 1U making up the plurality of pairs of first and second terminals in the specific relative positional relationship are different from those in the reference relative positional relationship. In the example shown in FIG. 59, the second subpackage 1U is displaced in the direction from the side surface 2c of the main body 2 toward the side surface 2d of the main body 2, with respect to the reference relative positional relationship. It should be noted that the specific relative positional relationship may be such that the second subpackage 1U is displaced in the direction from the side surface 2d toward the side surface 2c, with respect to the reference relative positional relationship.

When in the specific relative positional relationship shown in FIG. 59, the plurality of pairs of first and second terminals, each of which is made up of one of the first terminals 4 of the first subpackage 1L and one of the second terminals 5 of the second subpackage 1U that are in contact with each other and electrically connected to each other, are as follows: (4C21, 5C11), (4C22, 5C12), (4C23, 5C13), (4C24, 5C14), (4C25, 5C15), (4C26, 5C16), (4C27, 5C17), (4C28, 5C18), (4R21, 5R11), (4R22, 5R12), (4R23, 5R13), (4R24, 5R14), (4R25, 5R15), (4R26, 5R16), (4R27, 5R17), and (4R28, 5R18).

When in a not-shown specific relative positional relationship where the second subpackage 1U is displaced in the direction from the side surface 2d toward the side surface 2c with respect to the reference relative positional relationship, the terminals 5C21 to 5C28, 5R21 to 5R28, and 7A1 to 7A4 of the second subpackage 1U are in contact with and electrically connected to the terminals 4C11 to 4C18, 4R11 to 4R18, and 6A1 to 6A4 of the first subpackage 1L.

As in the first embodiment, there are formed a plurality of pairs of terminals (6A1, 7A1), (6A2, 7A2), (6A3, 7A3), and (6A4, 7A4) in each of which the two terminals are in contact with and electrically connected to each other, across the terminals 6A1 to 6A4 of the first subpackage 1L and the terminals 7A1 to 7A4 of the second subpackage 1U regardless of whether in the reference relative positional relationship or the specific relative positional relationship.

Figure 66:
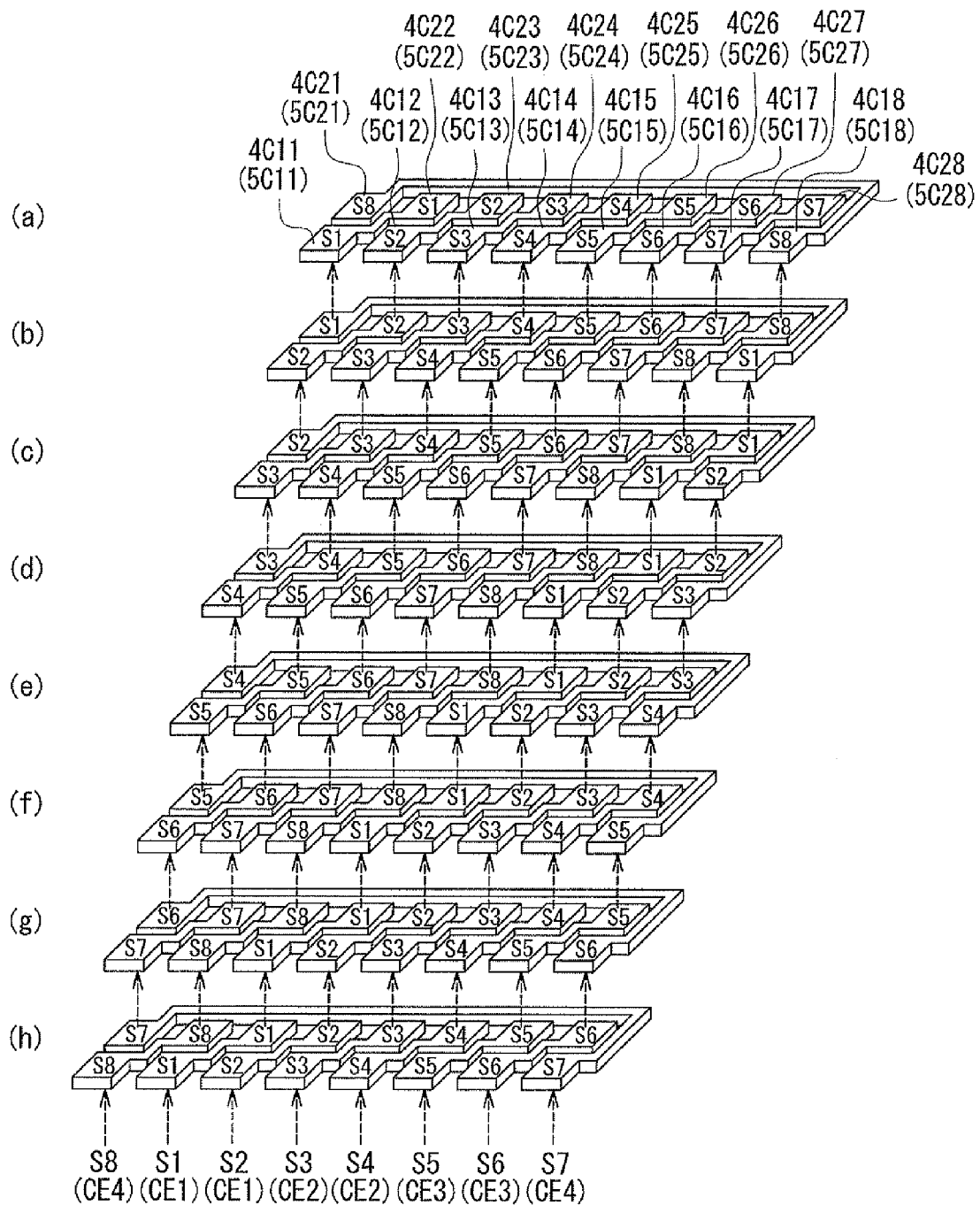
FIG. 66 is an explanatory diagram showing the flow of a plurality of signals in the composite layered chip package shown in FIG. 59.
Figure 67:
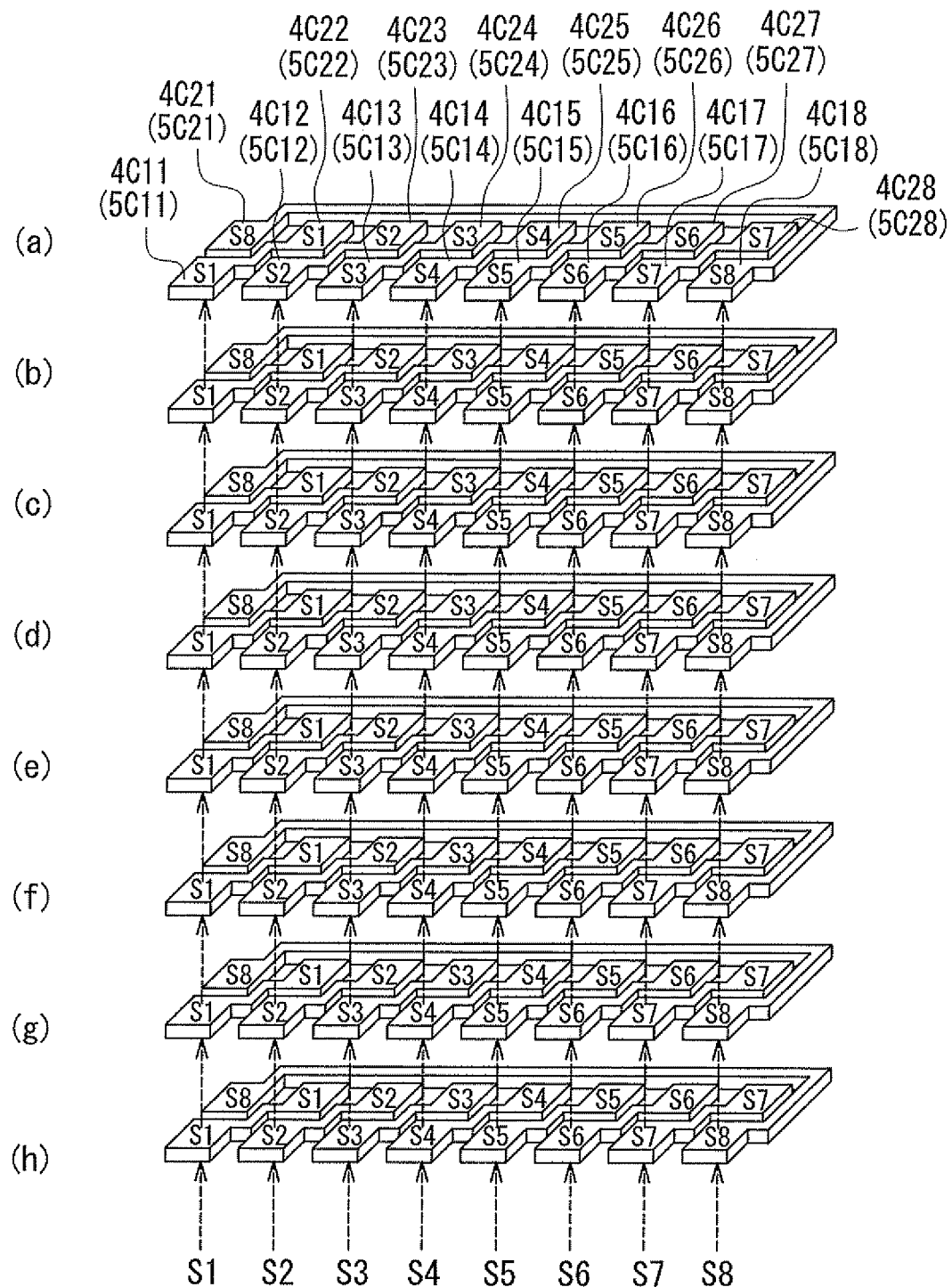
FIG. 67 is an explanatory diagram showing the flow of a plurality of signals in the composite layered chip package shown in FIG. 60.

Next, the flow of a plurality of signals in the composite layered chip package 25 shown in FIG. 59 and the composite layered chip package 26 shown in FIG. 60 will be described. FIG. 66 is an explanatory diagram showing the flow of a plurality of signals in the composite layered chip package 25 shown in FIG. 59. FIG. 67 is an explanatory diagram showing the flow of a plurality of signals in the composite layered chip package 26 shown in FIG. 60.

Portions (a) to (h) of FIG. 66 show the terminals 4C11 to 4C18, 4C21 to 4C28, 5C11 to 5C18, and 5C21 to 5C28 in the subpackages 1A to 1H of the composite layered chip package 25 shown in FIG. 59 and signals to appear thereon. Portions (a) to (h) of FIG. 67 show the terminals 4C11 to 4C18, 4C21 to 4C28, 5C11 to 5C18, and 5C21 to 5C28 in the subpackages 1A to 1H of the composite layered chip package 26 shown in FIG. 60 and signals to appear thereon. Symbols S1 to S8 in FIG. 66 and FIG. 67 represent respective signals. In each subpackage 1S, the same signal appears on a plurality of terminals that are electrically connected to each other.

FIG. 66 shows an example where the signals S8, S1, S2, S3, S4, S5, S6, and S7 are supplied to the terminals 5C11, 5C12, 5C13, 5C14, 5C15, 5C16, 5C17, and 5C18 of the subpackage 1H as shown in portion (h) of FIG. 66. In this case, the signals S1, S2, S3, S4, S5, S6, S7, and S8 appear on the terminals 4C11 of the subpackages 1A to 1H. The electrodes 32D1 are electrically connected to the terminals 4C11. Consequently, in the composite layered chip package 25 shown in FIG. 59, the signals associated with the semiconductor chips 30 in the subpackages 1A to 1H through the electrodes 32D1 are the signals S1, S2, S3, S4, S5, S6, S7, and S8, respectively.

On the other hand, when in the reference relative positional relationship shown in FIG. 60, the signals to appear on the terminals 4C11 to 4C18, 4C21 to 4C28, 5C11 to 5C18, and 5C21 to 5C28 do not vary from one subpackage 1S to another as shown in FIG. 67. FIG. 67 shows an example where the signals S1 to S8 are supplied to the terminals 5C11 to 5C18 of the subpackage 1H. In the composite layered chip package 26 shown in FIG. 60, the same signals are associated with the semiconductor chips 30 of all the subpackages 1A to 1H through the electrodes 32D1.

The mode of signal flow described with reference to FIG. 66 and FIG. 67 also applies to the group of terminals 4R11 to 4R18, 4R21 to 4R28, 5R11 to 5R18, and 5R21 to 5R28.

Now, a description will be made as to the flow of a plurality of signals for the case where the composite layered chip package 25 shown in FIG. 59 is used to construct the memory device shown in FIG. 10. In the subpackages 1A to 1H of the composite layered chip package 25 shown in FIG. 59, the terminals 6A1 and 7A1 are electrically connected to the wire WA1, the terminals 6A2 and 7A2 are electrically connected to the wire WA2, the terminals 6A3 and 7A3 are electrically connected to the wire WA3, and the terminals 6A4 and 7A4 are electrically connected to the wire WA4. As a result, there are formed a plurality of electrical paths that lead from the terminals 6A1-6A4 of the subpackage 1A to the terminals 7A1-7A4 of the subpackage 1H. The plurality of electrical paths constitute parts of the data bus 91 and the one or more common lines 92.

As shown in FIG. 66, assume that each of the signals S1 and S2 is the chip enable signal CE1, each of the signals S3 and S4 is the chip enable signal CE2, each of the signals S5 and S6 is the chip enable signal CE3, and each of the signals S7 and S8 is the chip enable signal CE4. In this case, in the composite layered chip package 25, the chip enable signal CE1 is supplied only to the semiconductor chips 30 of the subpackages 1A and 1B, i.e., the memory chips MC1 and MC2. Likewise, the chip enable signal CE2 is supplied only to the semiconductor chips 30 of the subpackages 1C and 1D, i.e., the memory chips MC3 and MC4. The chip enable signal CE3 is supplied only to the semiconductor chips 30 of the subpackages 1E and 1F, i.e., the memory chips MC5 and MC6. The chip enable signal CE4 is supplied only to the semiconductor chips 30 of the subpackages 1G and 1H, i.e., the memory chips MC7 and MC8.

The semiconductor chips 30 of the subpackages 1A to 1H output the ready/busy signals R/B1 to R/B8, respectively, from the electrodes 32D2. The signals R/B1 to R/B8 correspond to the signals S1 to S8 in FIG. 66, respectively. As can be seen from FIG. 66, the signal R/B1 is output from the terminal 4R11 of the subpackage 1A or the terminal 5R12 of the subpackage 1H. The signal R/B2 is output from the terminal 4R12 of the subpackage 1A or the terminal 5R13 of the subpackage 1H. The signal R/B3 is output from the terminal 4R13 of the subpackage 1A or the terminal 5R14 of the subpackage 1H. The signal R/B4 is output from the terminal 4R14 of the subpackage 1A or the terminal 5R15 of the subpackage 1H. The signal R/B5 is output from the terminal 4R15 of the subpackage 1A or the terminal 5R16 of the subpackage 1H. The signal R/B6 is output from the terminal 4R16 of the subpackage 1A or the terminal 5R17 of the subpackage 1H. The signal R/B7 is output from the terminal 4R17 of the subpackage 1A or the terminal 5R18 of the subpackage 1H. The signal R/B8 is output from the terminal 4R18 of the subpackage 1A or the terminal 5R11 of the subpackage 1H.

In the present embodiment, only either the plurality of first terminals 4 or the plurality of second terminals 5 may include the two or more first or second terminals that align in the first direction (the X direction) to form a third terminal row. In such a case also, it is possible to construct a composite layered chip package 25 by arranging a plurality of subpackages 1S in the specific relative positional relationship with each other.

The remainder of configuration, function and effects of the present embodiment are similar to those of the first embodiment.

Sixth Embodiment

Figure 68:
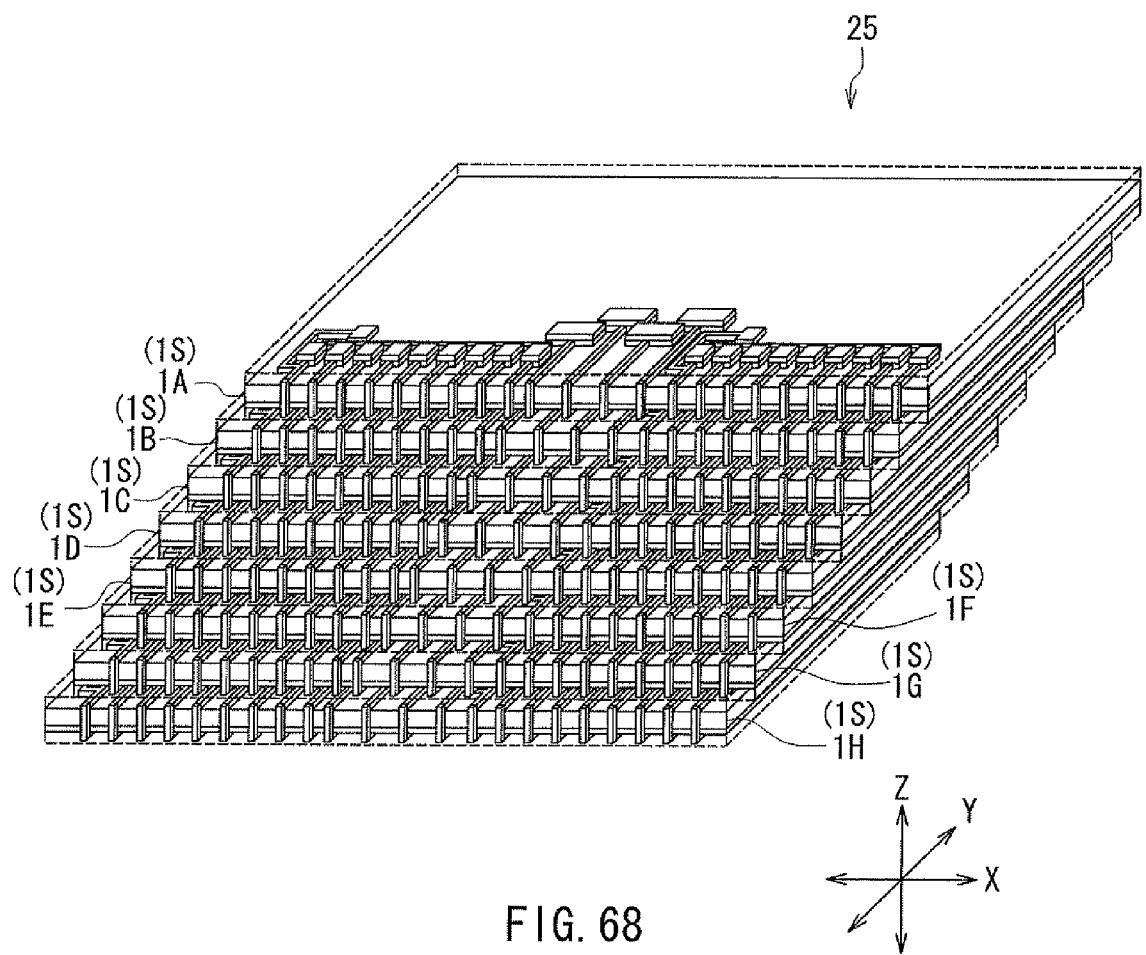
FIG. 68 is a perspective view of a composite layered chip package according to a sixth embodiment of the invention.
Figure 69:
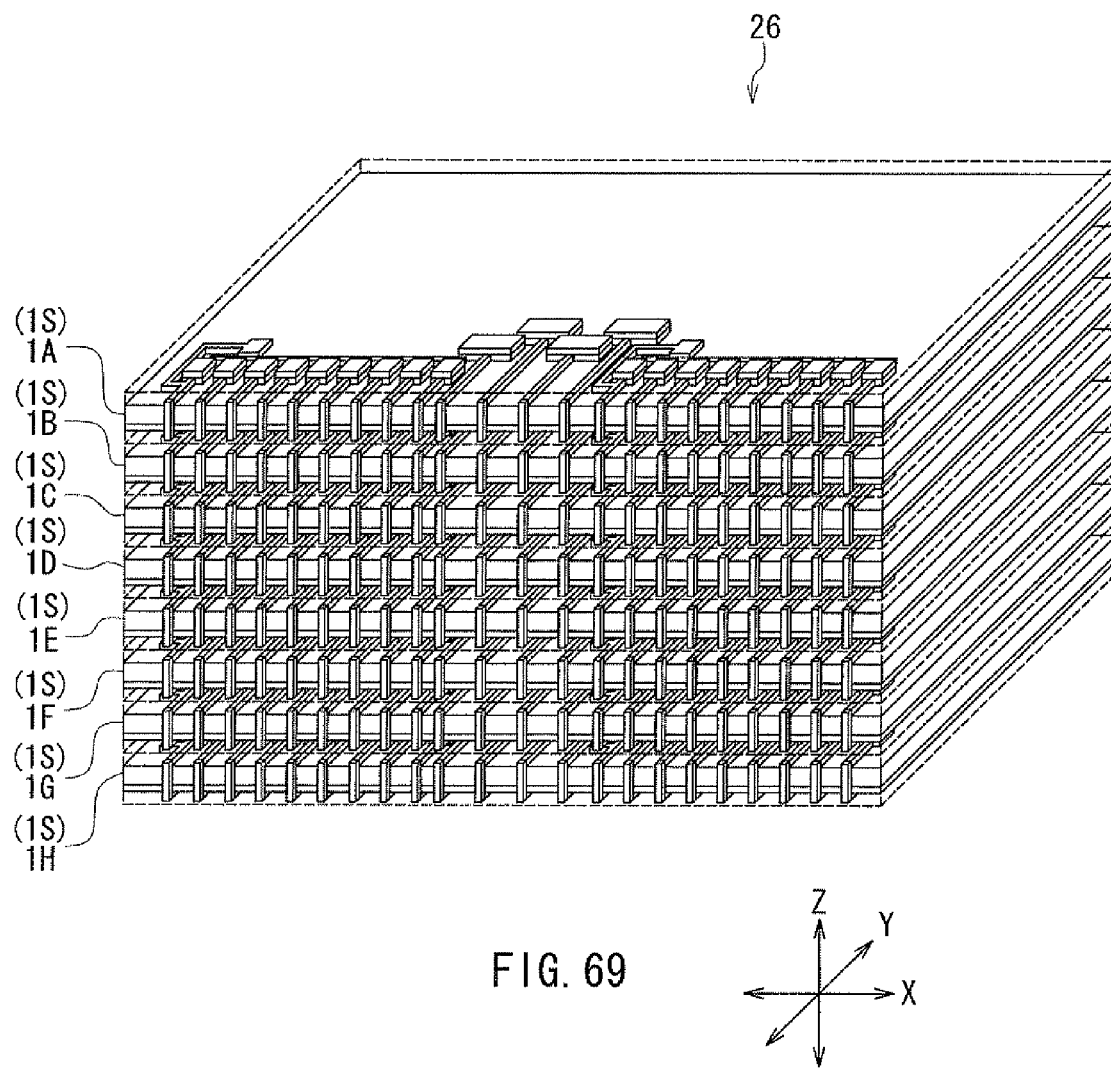
FIG. 69 is a perspective view of a composite layered chip package that is formed by arranging eight subpackages of FIG. 68 in the reference relative positional relationship with each other.
Figure 70:
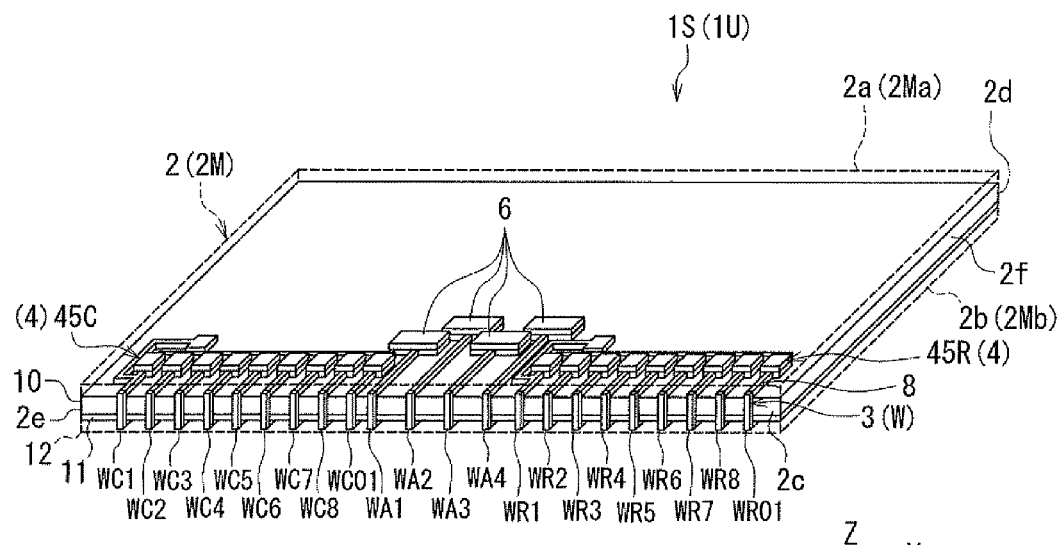
FIG. 70 is a perspective view of a stackable chip package according to the sixth embodiment of the invention.
Figure 71:
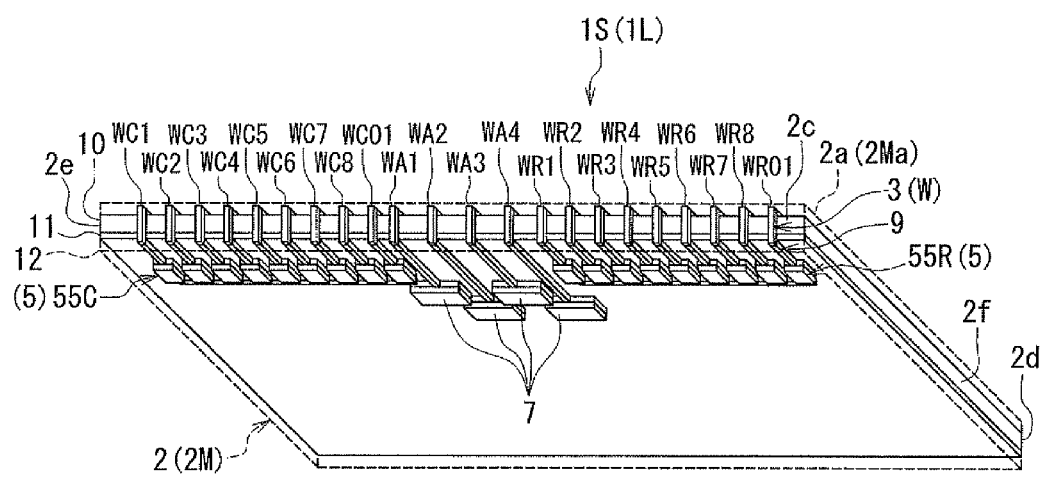
FIG. 71 a perspective view showing the stackable chip package of FIG. 70 as viewed from below.
Figure 72:
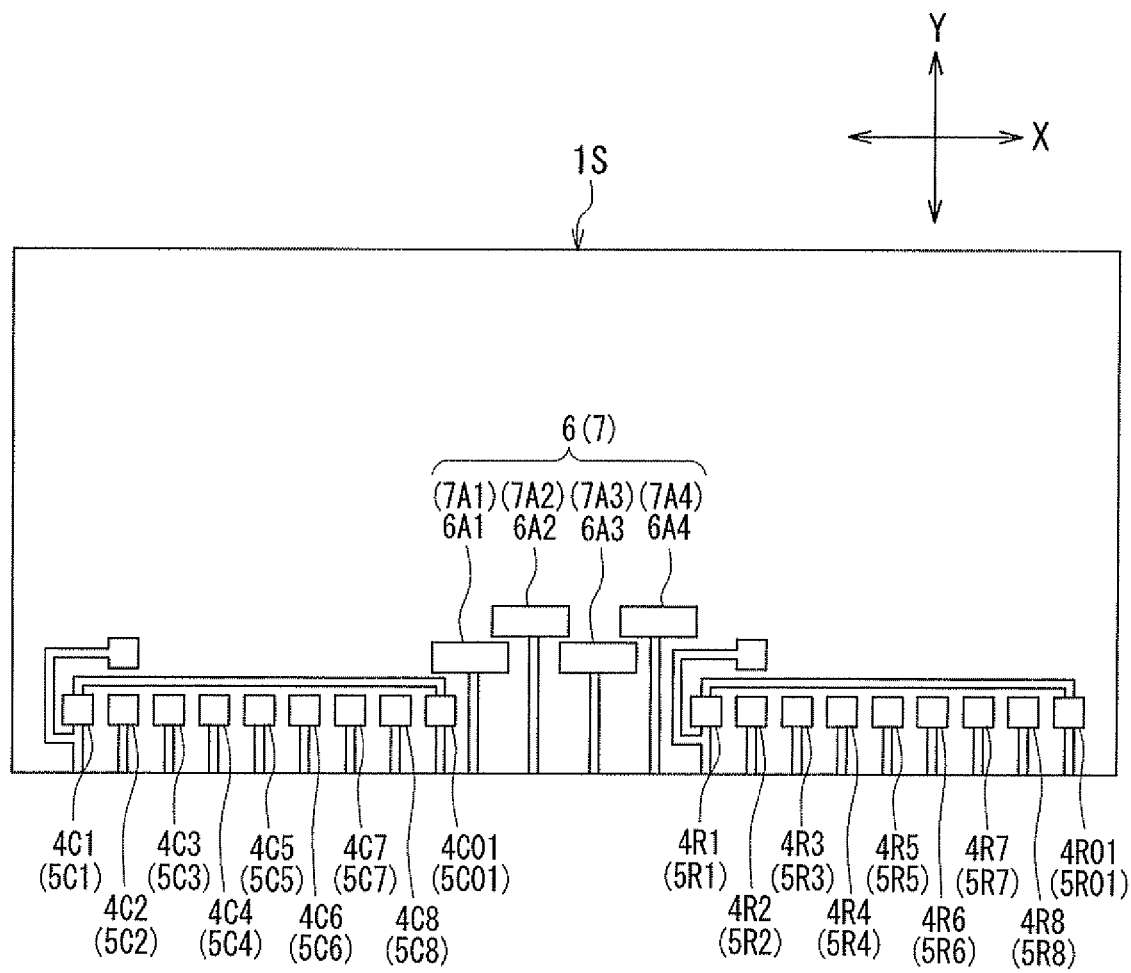
FIG. 72 is a plan view showing a plurality of terminals of the stackable chip package shown in FIG. 70.
Figure 73:
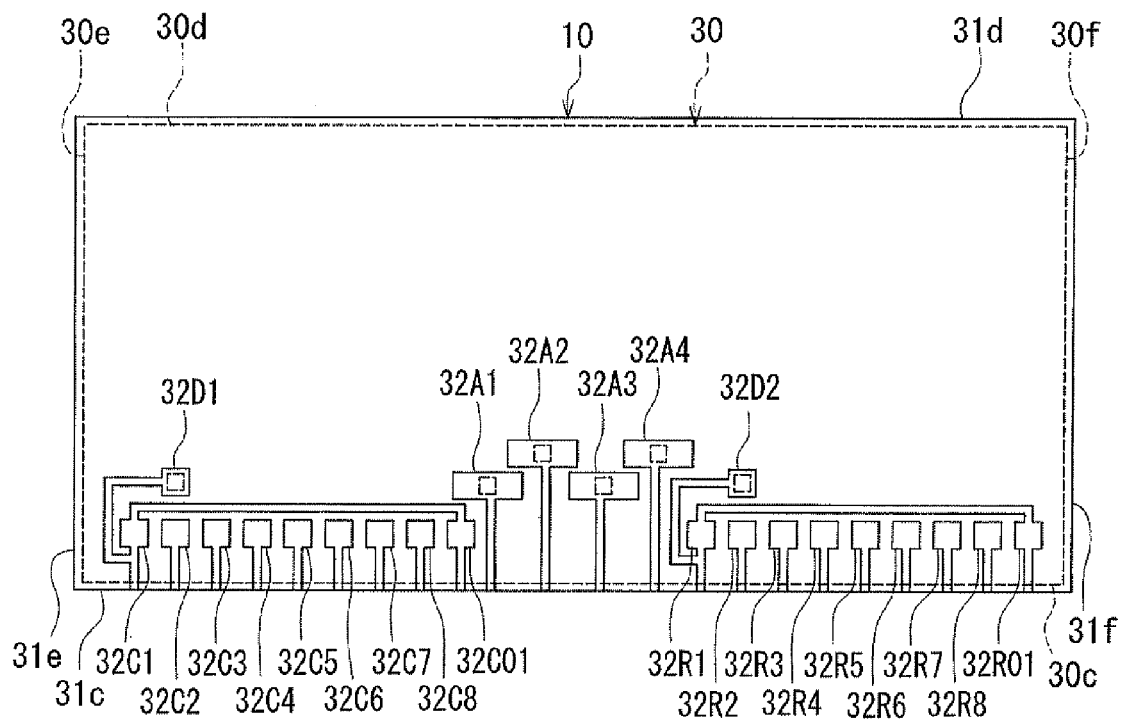
FIG. 73 is a plan view showing a layer portion included in the stackable chip package shown in FIG. 70.
Figure 74:
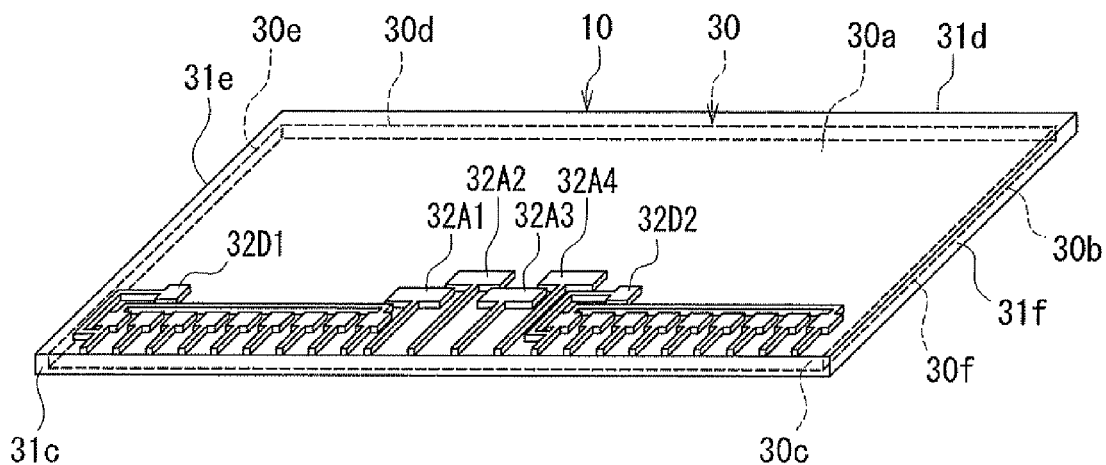
FIG. 74 is a perspective view of the layer portion shown in FIG. 73.

A sixth embodiment of the invention will now be described. First, reference is made to FIG. 68 to FIG. 74 to describe the configurations of a composite layered chip package and a stackable chip package according to the present embodiment. FIG. 68 is a perspective view of the composite layered chip package according to the present embodiment. FIG. 69 is a perspective view of a composite layered chip package that is formed by arranging eight subpackages of FIG. 68 in a reference relative positional relationship with each other. FIG. 70 is a perspective view of the stackable chip package according to the present embodiment. FIG. 71 is a perspective view showing the stackable chip package of FIG. 70 as viewed from below. FIG. 72 is a plan view showing a plurality of terminals of the stackable chip package shown in FIG. 70. FIG. 73 is a plan view showing a layer portion included in the stackable chip package shown in FIG. 70. FIG. 74 is a perspective view of the layer portion shown in FIG. 73.

The composite layered chip package 26 shown in FIG. 69 is formed by arranging the eight subpackages 1A to 1H in the reference relative positional relationship with each other. The composite layered chip package 25 according to the present embodiment shown in FIG. 68 is formed by arranging the eight subpackages 1A to 1H in a specific relative positional relationship, different from the reference relative positional relationship, with each other.

Now, the plurality of terminals 4, 5, 6, and 7 of the present embodiment will be described in detail. As shown in FIG. 70 and FIG. 71, each subpackage 1S is configured so that the plurality of first terminals 4 and the plurality of second terminals 5 are in the same layout when viewed in the direction perpendicular to the top surface 2Ma of the main part 2M (the Z direction), and that the plurality of third terminals 6 and the plurality of fourth terminals 7 are in the same layout when viewed in the Z direction. FIG. 72 shows the shape and arrangement of the plurality of terminals 4, 5, 6, and 7 when viewed in the direction perpendicular to the top surface 2Ma of the main part 2M (the Z direction).

As shown in FIG. 72, the plurality of first terminals 4 include two or more first terminals 4 that align in a first direction (the X direction) to form a first terminal row. The plurality of second terminals 5 include two or more second terminals 5 that align in the first direction (the X direction) to form a second terminal row. At least one of the first and second terminal rows is formed by three or more first or second terminals that align in the first direction (the X direction). Of the three or more first or second terminals, two that are located at opposite ends of the first or second terminal row are electrically connected to each other. In the present embodiment, in particular, the first terminal row is formed by three or more first terminals that align in the first direction (the X direction), and the second terminal row is formed by three or more second terminals that align in the first direction (the X direction). Of the three or more first/second terminals, two that are located at opposite ends of the first/second terminal row are electrically connected to each other.

Specifically, the plurality of first terminals 4 include nine first terminals 4C1, 4C2, 4C3, 4C4, 4C5, 4C6, 4C7, 4C8, and 4C01 that align in the X direction to form a terminal row 45C (see FIG. 70), and nine first terminals 4R1, 4R2, 4R3, 4R4, 4R5, 4R6, 4R7, 4R8, and 4R01 that align in the X direction to form a terminal row 45R (see FIG. 70). In each of the terminal rows, two terminals located at opposite ends are electrically connected to each other. The X direction corresponds to the first direction. Each of the terminal rows 45C and 45R corresponds to the first terminal row.

The plurality of second terminals 5 include nine second terminals 5C1, 5C2, 5C3, 5C4, 5C5, 5C6, 5C7, 5C8, and 5C01 that align in the X direction to form a terminal row 55C (see FIG. 71), and nine second terminals 5R1, 5R2, 5R3, 5R4, 5R5, 5R6, 5R7, 5R8, and 5R01 that align in the X direction to form a terminal row 55R (see FIG. 71). In each of the terminal rows, two terminals located at opposite ends are electrically connected to each other. Each of the terminal rows 55C and 55R corresponds to the second terminal row.

In all the terminal rows, the nine terminals making up each terminal row are at equal pitches. The amount of displacement of the second subpackage 1U in the specific relative positional relationship with respect to the reference relative positional relationship is the same as the foregoing pitch.

The plurality of third terminals 6 include four terminals 6A1 to 6A4. The plurality of fourth terminals 7 include four terminals 7A1 to 7A4. The shape and arrangement of the terminals 6A1 to 6A4 and 7A1 to 7A4 are the same as in the second embodiment.

In each subpackage is, two terminals in each of the following pairs of terminals coincide with each other in position when viewed in the direction perpendicular to the top surface 2Ma of the main part 2M (the Z direction): (4C1, 5C1), (4C2, 5C2), (4C3, 5C3), (4C4, 5C4), (4C5, 5C5), (4C6, 5C6), (4C7, 5C7), (4C8, 5C8), (4C01, 5C01), (4R1, 5R1), (4R2, 5R2), (4R3, 5R3), (4R4, 5R4), (4R5, 5R5), (4R6, 5R6), (4R7, 5R7), (4R8, 5R8), (4R01, 5R01), (6A1, 7A1), (6A2, 7A2), (6A3, 7A3), and (6A4, 7A4).

The plurality of wires W are disposed on the side surface 2c of the main body 2. The plurality of wires W include wires WC1, WC2, WC3, WC4, WC5, WC6, WC7, WC8, WC01, WR1, WR2, WR3, WR4, WR5, WR6, WR7, WR8, WR01, WA1, WA2, WA3, and WA4 that electrically connect two terminals in the respective pairs of terminals (4C1, 5C1), (4C2, 5C2), (4C3, 5C3), (4C4, 5C4), (4C5, 5C5), (4C6, 5C6), (4C7, 5C7), (4C8, 5C8), (4C01, 5C01), (4R1, 5R1), (4R2, 5R2), (4R3, 5R3), (4R4, 5R4), (4R5, 5R5), (4R6, 5R6), (4R7, 5R7), (4R8, 5R8), (4R01, 5R01), (6A1, 7A1), (6A2, 7A2), (6A3, 7A3), and (6A4, 7A4). Note that the wires WC01 and WRO1 may be omitted.

The plurality of electrodes 32 will now be described. In the present embodiment, the plurality of terminals 4 and 6 are formed by using the plurality of electrodes 32 of the layer portion 10. FIG. 73 and FIG. 74 show the shape and arrangement of the plurality of electrodes 32. The plurality of electrodes 32 include electrodes 32C1 to 32C8, 32C01, 32R1 to 32R8, 32R01, 32A1 to 32A4, 32D1, and 32D2. In FIG. 74, the reference symbols of the electrodes other than the electrodes 32A1 to 32A4, 32D1, and 32D2 are omitted. The electrodes 32C1 to 32C8, 32C01, 32R1 to 32R8, 32R01, and 32A1 to 32A4 include terminal component parts that are used for forming the terminals 4C1 to 4C8, 4C01, 4R1 to 4R8, 4R01, and 6A1 to 6A4.

The electrodes 32C1 to 32C8, 32C01, 32R1 to 32R8, 32R01, and 32A1 to 32A4 have respective end faces located in the end face 31c of the insulating portion 31, and are electrically connected to the wires WC1 to WC8, WC01, WR1 to WR8, WR01, and WA1 to WA4 via those end faces. In the present embodiment, the electrode 32D1 is electrically connected to the electrode 32C1, while the electrode 32D2 is electrically connected to the electrode 32R1.

Now, the reference relative positional relationship and the specific relative positional relationship in the present embodiment will be described in detail. The reference relative positional relationship will be described first, with reference to FIG. 69. The reference relative positional relationship is such that, when viewed in the direction perpendicular to the top surface 2Ma of the main part 2M of the second subpackage 1U (the Z direction), the plurality of first terminals 4 of the first subpackage 1L and the plurality of first terminals 4 of the second subpackage 1U coincide with each other in position while the plurality of second terminals 5 of the first subpackage 1L and the plurality of second terminals 5 of the second subpackage 1U coincide with each other in position. When in the reference relative positional relationship, terminals 4 and 6 of the subpackage 1L and terminals 5 and 7 of the subpackage 1U that coincide with each other in position when viewed in the Z direction are in contact with each other and electrically connected to each other. In this way, there are formed a plurality of pairs of first and second terminals each of which is made up of one of the plurality of first terminals 4 of the first subpackage 1L and one of the plurality of second terminals 5 of the second subpackage 1U that are in contact with each other and electrically connected to each other.

The specific relative positional relationship shown in FIG. 68 is such that the second subpackage 1U is displaced in the direction parallel to the top surface 2Ma of the main part 2M of the second subpackage 1U with respect to the reference relative positional relationship shown in FIG. 69. In the present embodiment, the specific relative positional relationship is particularly such that the second subpackage 1U is displaced in the X direction (the first direction) with respect to the reference relative positional relationship.

Combinations of the first terminals 4 of the first subpackage 1L and the second terminals 5 of the second subpackage 1U making up the plurality of pairs of first and second terminals in the specific relative positional relationship are different from those in the reference relative positional relationship. In the example shown in FIG. 68, the second subpackage 1U is displaced in the direction from the side surface 2e of the main body 2 toward the side surface 2f of the main body 2, with respect to the reference relative positional relationship. It should be noted that the specific relative positional relationship may be such that the second subpackage 1U is displaced in the direction from the side surface 2f toward the side surface 2e, with respect to the reference relative positional relationship.

When in the specific relative positional relationship shown in FIG. 68, the plurality of pairs of first and second terminals, each of which is made up of one of the first terminals 4 of the first subpackage 1L and one of the second terminals 5 of the second subpackage 1U that are in contact with each other and electrically connected to each other, are as follows: (4C2, 5C1), (4C3, 5C2), (4C4, 5C3), (4C5, 5C4), (4C6, 5C5), (4C7, 5C6), (4C8, 5C7), (4C01, 5C8), (4R2, 5R1), (4R3, 5R2), (4R4, 5R3), (4R5, 5R4), (4R6, 5R5), (4R7, 5R6), (4R8, 5R7), and (4R01, 5R8).

When in a not-shown specific relative positional relationship where the second subpackage 1U is displaced in the direction from the side surface 2f toward the side surface 2e with respect to the reference relative positional relationship, the terminals 5C2, 5C3, 5C4, 5C5, 5C6, 5C7, 5C8, 5C01, 5R2, 5R3, 5R4, 5R5, 5R6, 5R7, 5R8, 5R01 and 7A1 to 7A4 of the second subpackage 1U are in contact with and electrically connected to the terminals 4C1 to 4C8, 4R1 to 4R8, and 6A1 to 6A4 of the first subpackage 1L.

As in the second embodiment, a plurality of pairs of terminals (6A1, 7A1), (6A2, 7A2), (6A3, 7A3), and (6A4, 7A4) in each of which the two terminals are in contact with and electrically connected to each other are formed across the terminals 6A1 to 6A4 of the first subpackage 1L and the terminals 7A1 to 7A4 of the second subpackage 1U regardless of whether in the reference relative positional relationship or the specific relative positional relationship.

Figure 75:
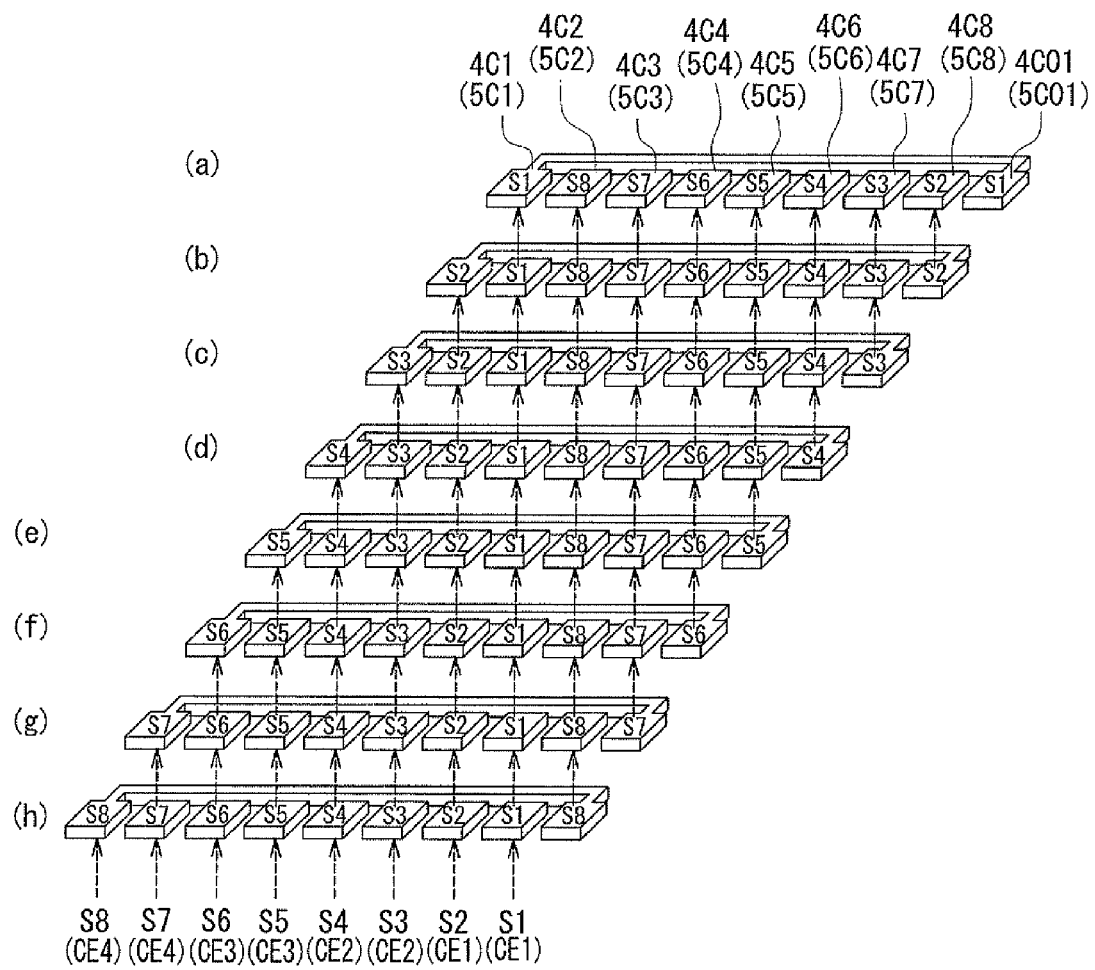
FIG. 75 is an explanatory diagram showing the flow of a plurality of signals in the composite layered chip package shown in FIG. 68.
Figure 76:
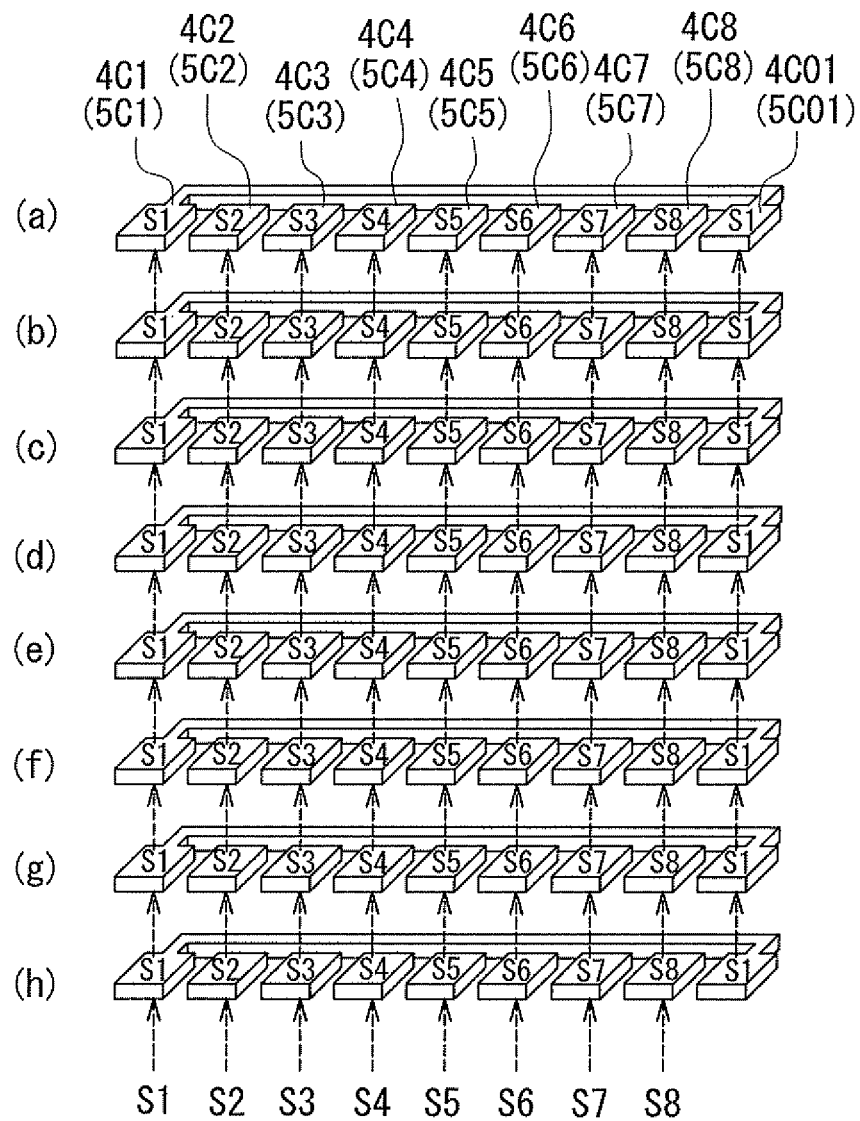
FIG. 76 is an explanatory diagram showing the flow of a plurality of signals in the composite layered chip package shown in FIG. 69.

Next, the flow of a plurality of signals in the composite layered chip package 25 shown in FIG. 68 and the composite layered chip package 26 shown in FIG. 69 will be described. FIG. 75 is an explanatory diagram showing the flow of a plurality of signals in the composite layered chip package 25 shown in FIG. 68. FIG. 76 is an explanatory diagram showing the flow of a plurality of signals in the composite layered chip package 26 shown in FIG. 69.

Portions (a) to (h) of FIG. 75 show the terminals 4C1 to 4C8, 4C01, 5C1 to 5C8, and 5C01 in the subpackages 1A to 1H of the composite layered chip package 25 shown in FIG. 68 and signals to appear thereon. Portions (a) to (h) of FIG. 76 show the terminals 4C1 to 4C8, 4C01, 5C1 to 5C8, and 5C01 in the subpackages 1A to 1H of the composite layered chip package 26 shown in FIG. 69 and signals to appear thereon. Symbols S1 to S8 in FIG. 75 and FIG. 76 represent respective signals.

In each subpackage 1S, the signal to appear on the terminal 4C01 is the same as that on the terminal 4C1, and the signal to appear on the terminal 5C01 is the same as that on the terminal 5C1. The signals to appear on the terminals 5C1 to 5C8, and 5C01 are the same as those on the terminals 4C1 to 4C8, and 4C01, respectively.

FIG. 75 shows an example where the signals S8, S7, S6, S5, S4, S3, S2, and S1 are supplied to the terminals 5C1, 5C2, 5C3, 5C4, 5C5, 5C6, 5C7, and 5C8 of the subpackage 1H as shown in portion (h) of FIG. 75. In this case, the signals S1, S2, S3, S4, S5, S6, S7, and S8 appear on the terminals 4C1 of the subpackages 1A to 1H. The electrodes 32D1 are electrically connected to the terminals 4C1. Consequently, in the composite layered chip package 25 shown in FIG. 68, the signals associated with the semiconductor chips 30 in the subpackages 1A to 1H through the electrodes 32D1 are the signals S1, S2, S3, S4, S5, S6, S7, and S8, respectively.

On the other hand, when in the reference relative positional relationship shown in FIG. 69, the signals to appear on the terminals 4C1 to 4C8, and 4C01 do not vary from one subpackage 1S to another as shown in FIG. 76. FIG. 76 shows an example where the signals S1 to S8 are supplied to the terminals 5C1 to 5C8 of the subpackage 1H. In the composite layered chip package 26 shown in FIG. 69, the same signals are associated with the semiconductor chips 30 of all the subpackages 1A to 1H through the electrodes 32D1.

The mode of signal flow described with reference to FIG. 75 and FIG. 76 also applies to the group of terminals 4R1 to 4R8, and 4R01.

The present embodiment may be configured so that only one of the first and second terminal rows is formed by three or more first or second terminals that align in the first direction (the X direction) and, of the three or more first or second terminals, two that are located at opposite ends of the first or second terminal row are electrically connected to each other. In such a case also, it is possible to construct a composite layered chip package 25 by arranging a plurality of subpackages 1S in the specific relative positional relationship with each other.

The remainder of configuration, function and effects of the present embodiment are similar to those of the fifth embodiment.

The present invention is not limited to the foregoing embodiments, and various modifications may be made thereto. For example, the number of the layer portion(s) 10 to be included in the main part 2M may be other than the numbers shown in the foregoing embodiments.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A composite layered chip package comprising a first subpackage and a second subpackage, the second subpackage being stacked on and electrically connected to the first subpackage, wherein:
   each of the first and second subpackages includes a main body and wiring;
   the main body includes: a main part including at least one layer portion and having a top surface and a bottom surface; a plurality of first terminals disposed on the top surface of the main part; and a plurality of second terminals disposed on the bottom surface of the main part;
   the plurality of first terminals and the plurality of second terminals are electrically connected to the wiring;
   the at least one layer portion includes a semiconductor chip;
   the plurality of first terminals of the first subpackage and those of the second subpackage are in the same layout;
   the plurality of second terminals of the first subpackage and those of the second subpackage are in the same layout;
   the first subpackage and the second subpackage are arranged in a specific relative positional relationship with each other, the specific relative positional relationship being different from a reference relative positional relationship, the reference relative positional relationship being such that, when viewed in a direction perpendicular to the top surface of the main part of the second subpackage, the plurality of first terminals of the first subpackage and the plurality of first terminals of the second subpackage coincide with each other in position while the plurality of second terminals of the first subpackage and the plurality of second terminals of the second subpackage coincide with each other in position, the specific relative positional relationship being such that, with respect to the reference relative positional relationship, the second subpackage is displaced in a direction parallel to the top surface of the main part of the second subpackage;
   the plurality of first terminals and the plurality of second terminals are shaped and arranged so that a plurality of pairs of first and second terminals are formed regardless of whether in the reference relative positional relationship or the specific relative positional relationship, each of the plurality of pairs of first and second terminals being made up of one of the plurality of first terminals of the first subpackage and one of the plurality of second terminals of the second subpackage that are in contact with each other; and
   combinations of the first and second terminals making up the plurality of pairs of first and second terminals in the specific relative positional relationship are different from those in the reference relative positional relationship.

2. The composite layered chip package according to claim 1, wherein the main body has a top surface, a bottom surface, and four side surfaces, and the wiring includes a plurality of wires disposed on at least one of the side surfaces of the main body.

3. The composite layered chip package according to claim 2, wherein the plurality of wires include a chip connection wire that is used for electrical connection to the semiconductor chip, and a bypass wire that is not electrically connected to the semiconductor chip.

4. The composite layered chip package according to claim 1, wherein:
   the main body further includes a third terminal disposed on the top surface of the main part, and a fourth terminal disposed on the bottom surface of the main part;
   the third terminal and the fourth terminal are electrically connected to the wiring; and
   the third terminal and the fourth terminal are shaped and arranged so that the third terminal of the first subpackage and the fourth terminal of the second subpackage are in contact with each other regardless of whether in the reference relative positional relationship or the specific relative positional relationship.

5. The composite layered chip package according to claim 1, wherein, in each of the first and second subpackages, the plurality of first terminals and the plurality of second terminals are in the same layout when viewed in the direction perpendicular to the top surface of the main part.

6. The composite layered chip package according to claim 1, wherein:
   the plurality of first terminals include two or more first terminals that align in a first direction to form a first terminal row;
   the plurality of second terminals include two or more second terminals that align in the first direction to form a second terminal row;
   at least either the plurality of first terminals or the plurality of second terminals further include other two or more first or second terminals that align in the first direction to form a third terminal row, the third terminal row being adjacent to the first or second terminal row in a second direction orthogonal to the first direction;
   a plurality of pairs of terminals are formed across the first or second terminal row and the third terminal row, each of the plurality of pairs of terminals being made up of two terminals that are electrically connected to each other, the two terminals being one of the two or more first or second terminals that form the first or second terminal row and one of the other two or more first or second terminals that form the third terminal row, the ones being non-adjacent to each other in the second direction; and
   the specific relative positional relationship is such that the second subpackage is displaced in the second direction with respect to the reference relative positional relationship.

7. The composite layered chip package according to claim 1, wherein:
   the plurality of first terminals include two or more first terminals that align in a first direction to form a first terminal row;
   the plurality of second terminals include two or more second terminals that align in the first direction to form a second terminal row;
   at least one of the first and second terminal rows is formed by three or more first or second terminals that align in the first direction;
   of the three or more first or second terminals, two that are located at opposite ends of the first or second terminal row are electrically connected to each other; and
   the specific relative positional relationship is such that the second subpackage is displaced in the first direction with respect to the reference relative positional relationship.

8. The composite layered chip package according to claim 1, wherein:
   the main part includes a plurality of layer portions;
   each of the plurality of layer portions further includes a plurality of electrodes that are electrically connected to the wiring;

the plurality of electrodes include a plurality of chip connection electrodes for electrical connection to the semiconductor chip; and in at least one of the plurality of layer portions, the plurality of chip connection electrodes are in contact with and electrically connected to the semiconductor chip.

9. The composite layered chip package according to claim 8, wherein:

the semiconductor chip has a first surface and a second surface opposite to each other;

the plurality of electrodes are located on a side of the first surface of the semiconductor chip;

the plurality of layer portions include a first layer portion located closest to the top surface of the main part, and a second layer portion located closest to the bottom surface of the main part;

the first layer portion and the second layer portion are arranged such that the second surfaces of the respective semiconductor chips included therein face each other;

the plurality of first terminals are formed by using the plurality of electrodes of the first layer portion; and the plurality of second terminals are formed by using the plurality of electrodes of the second layer portion.

10. The composite layered chip package according to claim 8, wherein:

the main body has a top surface, a bottom surface, and four side surfaces, and the wiring includes a plurality of wires that are disposed on at least one of the side surfaces of the main body and pass through all the layer portions in the main part;

the plurality of wires include a common wire that is used for a purpose common to all the layer portions in the main part, and a plurality of layer-dependent wires that are used by different ones of the plurality of layer portions;

the plurality of electrodes include a common electrode that is electrically connected to the common wire, and a selective connection electrode that is selectively electrically connected to only one of the plurality of layer-dependent wires that is used by the layer portion to which the selective connection electrode belongs; and in at least one of the plurality of layer portions, the common electrode and the selective connection electrode are electrically connected to the semiconductor chip.

11. A stackable chip package usable as each of the first and second subpackages to constitute the composite layered chip package of claim 1, comprising a main body and wiring, wherein:

the main body includes: a main part including at least one layer portion and having a top surface and a bottom surface; a plurality of first terminals disposed on the top surface of the main part; and a plurality of second terminals disposed on the bottom surface of the main part;

the plurality of first terminals and the plurality of second terminals are electrically connected to the wiring;

the at least one layer portion includes a semiconductor chip;

the plurality of first terminals include two or more first terminals that align in a first direction to form a first terminal row;

the plurality of second terminals include two or more second terminals that align in the first direction to form a second terminal row;

at least either the plurality of first terminals or the plurality of second terminals further include other two or more first or second terminals that align in the first direction to form a third terminal row, the third terminal row being adjacent to the first or second terminal row in a second direction orthogonal to the first direction; and a plurality of pairs of terminals are formed across the first or second terminal row and the third terminal row, each of the plurality of pairs of terminals being made up of two terminals that are electrically connected to each other, the two terminals being one of the two or more first or second terminals that form the first or second terminal row and one of the other two or more first or second terminals that form the third terminal row, the ones being non-adjacent to each other in the second direction.

12. The stackable chip package according to claim 11, wherein the main body has a top surface, a bottom surface, and four side surfaces, and the wiring includes a plurality of wires disposed on at least one of the side surfaces of the main body.

13. The stackable chip package according to claim 12, wherein the plurality of wires include a chip connection wire that is used for electrical connection to the semiconductor chip, and a bypass wire that is not electrically connected to the semiconductor chip.

14. The stackable chip package according to claim 11, wherein:

the main body further includes a third terminal disposed on the top surface of the main part, and a fourth terminal disposed on the bottom surface of the main part;

the third terminal and the fourth terminal are electrically connected to the wiring; and the third terminal and the fourth terminal are shaped and arranged so that, when two stackable chip packages are used as the first and second subpackages, the third terminal of the first subpackage and the fourth terminal of the second subpackage are in contact with each other regardless of whether in the reference relative positional relationship or the specific relative positional relationship.

15. The stackable chip package according to claim 11, wherein the plurality of first terminals and the plurality of second terminals are in the same layout when viewed in the direction perpendicular to the top surface of the main part.

16. The stackable chip package according to claim 11, wherein:

the main part includes a plurality of layer portions;

each of the plurality of layer portions further includes a plurality of electrodes that are electrically connected to the wiring;

the plurality of electrodes include a plurality of chip connection electrodes for electrical connection to the semiconductor chip; and in at least one of the plurality of layer portions, the plurality of chip connection electrodes are in contact with and electrically connected to the semiconductor chip.

17. The stackable chip package according to claim 16, wherein:

the semiconductor chip has a first surface and a second surface opposite to each other;

the plurality of electrodes are located on a side of the first surface of the semiconductor chip;

the plurality of layer portions include a first layer portion located closest to the top surface of the main part, and a second layer portion located closest to the bottom surface of the main part;

the first layer portion and the second layer portion are arranged such that the second surfaces of the respective semiconductor chips included therein face each other;

the plurality of first terminals are formed by using the plurality of electrodes of the first layer portion; and the plurality of second terminals are formed by using the plurality of electrodes of the second layer portion.

18. The stackable chip package according to claim 16, wherein:
the main body has a top surface, a bottom surface, and four side surfaces, and the wiring includes a plurality of wires that are disposed on at least one of the side surfaces of the main body and pass through all the layer portions in the main part;
the plurality of wires include a common wire that is used for a purpose common to all the layer portions in the main part, and a plurality of layer-dependent wires that are used by different ones of the plurality of layer portions;
the plurality of electrodes include a common electrode that is electrically connected to the common wire, and a selective connection electrode that is selectively electrically connected to only one of the plurality of layer-dependent wires that is used by the layer portion to which the selective connection electrode belongs; and
in at least one of the plurality of layer portions, the common electrode and the selective connection electrode are electrically connected to the semiconductor chip.

19. A stackable chip package usable as each of the first and second subpackages to constitute the composite layered chip package of claim 1, comprising a main body and wiring, wherein:
the main body includes: a main part including at least one layer portion and having a top surface and a bottom surface; a plurality of first terminals disposed on the top surface of the main part; and a plurality of second terminals disposed on the bottom surface of the main part;
the plurality of first terminals and the plurality of second terminals are electrically connected to the wiring;
the at least one layer portion includes a semiconductor chip;
the plurality of first terminals include two or more first terminals that align in a first direction to form a first terminal row;
the plurality of second terminals include two or more second terminals that align in the first direction to form a second terminal row;
at least one of the first and second terminal rows is formed by three or more first or second terminals that align in the first direction; and
of the three or more first or second terminals, two that are located at opposite ends of the first or second terminal row are electrically connected to each other.

20. The stackable chip package according to claim 19, wherein the main body has a top surface, a bottom surface, and four side surfaces, and the wiring includes a plurality of wires disposed on at least one of the side surfaces of the main body.

21. The stackable chip package according to claim 20, wherein the plurality of wires include a chip connection wire that is used for electrical connection to the semiconductor chip, and a bypass wire that is not electrically connected to the semiconductor chip.

22. The stackable chip package according to claim 19, wherein:
the main body further includes a third terminal disposed on the top surface of the main part, and a fourth terminal disposed on the bottom surface of the main part;
the third terminal and the fourth terminal are electrically connected to the wiring; and
the third terminal and the fourth terminal are shaped and arranged so that, when two stackable chip packages are used as the first and second subpackages, the third terminal of the first subpackage and the fourth terminal of the second subpackage are in contact with each other regardless of whether in the reference relative positional relationship or the specific relative positional relationship.

23. The stackable chip package according to claim 19, wherein the plurality of first terminals and the plurality of second terminals are in the same layout when viewed in the direction perpendicular to the top surface of the main part.

24. The stackable chip package according to claim 19, wherein:
the main part includes a plurality of layer portions;
each of the plurality of layer portions further includes a plurality of electrodes that are electrically connected to the wiring;
the plurality of electrodes include a plurality of chip connection electrodes for electrical connection to the semiconductor chip; and
in at least one of the plurality of layer portions, the plurality of chip connection electrodes are in contact with and electrically connected to the semiconductor chip.

25. The stackable chip package according to claim 24, wherein:
the semiconductor chip has a first surface and a second surface opposite to each other;
the plurality of electrodes are located on a side of the first surface of the semiconductor chip;
the plurality of layer portions include a first layer portion located closest to the top surface of the main part, and a second layer portion located closest to the bottom surface of the main part;
the first layer portion and the second layer portion are arranged such that the second surfaces of the respective semiconductor chips included therein face each other;
the plurality of first terminals are formed by using the plurality of electrodes of the first layer portion; and
the plurality of second terminals are formed by using the plurality of electrodes of the second layer portion.

26. The stackable chip package according to claim 24, wherein:
the main body has a top surface, a bottom surface, and four side surfaces, and the wiring includes a plurality of wires that are disposed on at least one of the side surfaces of the main body and pass through all the layer portions in the main part;
the plurality of wires include a common wire that is used for a purpose common to all the layer portions in the main part, and a plurality of layer-dependent wires that are used by different ones of the plurality of layer portions;
the plurality of electrodes include a common electrode that is electrically connected to the common wire, and a selective connection electrode that is selectively electrically connected to only one of the plurality of layer-dependent wires that is used by the layer portion to which the selective connection electrode belongs; and
in at least one of the plurality of layer portions, the common electrode and the selective connection electrode are electrically connected to the semiconductor chip.

* * * * *